US011699486B2

(12) United States Patent
Takahashi et al.

(10) Patent No.: US 11,699,486 B2
(45) Date of Patent: Jul. 11, 2023

(54) SEMICONDUCTOR MEMORY DEVICE TO HOLD 5-BITS OF DATA PER MEMORY CELL

(71) Applicant: KIOXIA CORPORATION, Tokyo (JP)

(72) Inventors: Tomonori Takahashi, Yokohama (JP); Masanobu Shirakawa, Chigasaki (JP); Osamu Torii, Tokyo (JP); Marie Takada, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/738,069

(22) Filed: May 6, 2022

(65) Prior Publication Data

US 2022/0270678 A1  Aug. 25, 2022

Related U.S. Application Data

(63) Continuation of application No. 17/143,530, filed on Jan. 7, 2021, now Pat. No. 11,361,820, which is a continuation of application No. 16/564,279, filed on Sep. 9, 2019, now Pat. No. 10,923,186.

(30) Foreign Application Priority Data

Mar. 22, 2019 (JP) ................................. 2019-054177

(51) Int. Cl.
*G11C 11/56* (2006.01)
*G11C 16/26* (2006.01)
*G11C 16/08* (2006.01)
*G11C 16/04* (2006.01)

(52) U.S. Cl.
CPC ...... *G11C 11/5671* (2013.01); *G11C 16/0483* (2013.01); *G11C 16/08* (2013.01); *G11C 16/26* (2013.01)

(58) Field of Classification Search
CPC . G11C 11/5671; G11C 16/0483; G11C 16/26; G11C 16/08
See application file for complete search history.

(56) References Cited

U.S. PATENT DOCUMENTS

| | | |
|---|---|---|
| 8,250,437 B2 | 8/2012 | Sakurada et al. |
| 2005/0201401 A1 | 9/2005 | Lasser |
| 2008/0089123 A1 | 4/2008 | Chae |
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2017/0011795 A1 | 1/2017 | Kifune et al. |

*Primary Examiner* — Ajay Ojha
(74) *Attorney, Agent, or Firm* — Oblon, McClelland, Maier & Neustadt, L.L.P.

(57) ABSTRACT

According to one embodiment, a semiconductor memory device includes: a memory cell configured to hold 5-bit data; a word line coupled to the memory cell; and a row decoder configured to apply first to 31st voltages to the word line. A first bit of the 5-bit data is established by reading operations using first to sixth voltages. A second bit of the 5-bit data is established by reading operations using seventh to twelfth voltages. A third bit of the 5-bit data is established by reading operations using thirteenth to eighteenth voltages. A fourth bit of the 5-bit data is established by reading operations using nineteenth to 25th voltages. A fifth bit of the 5-bit data is established by reading operations using 26th to 31st voltages.

18 Claims, 66 Drawing Sheets

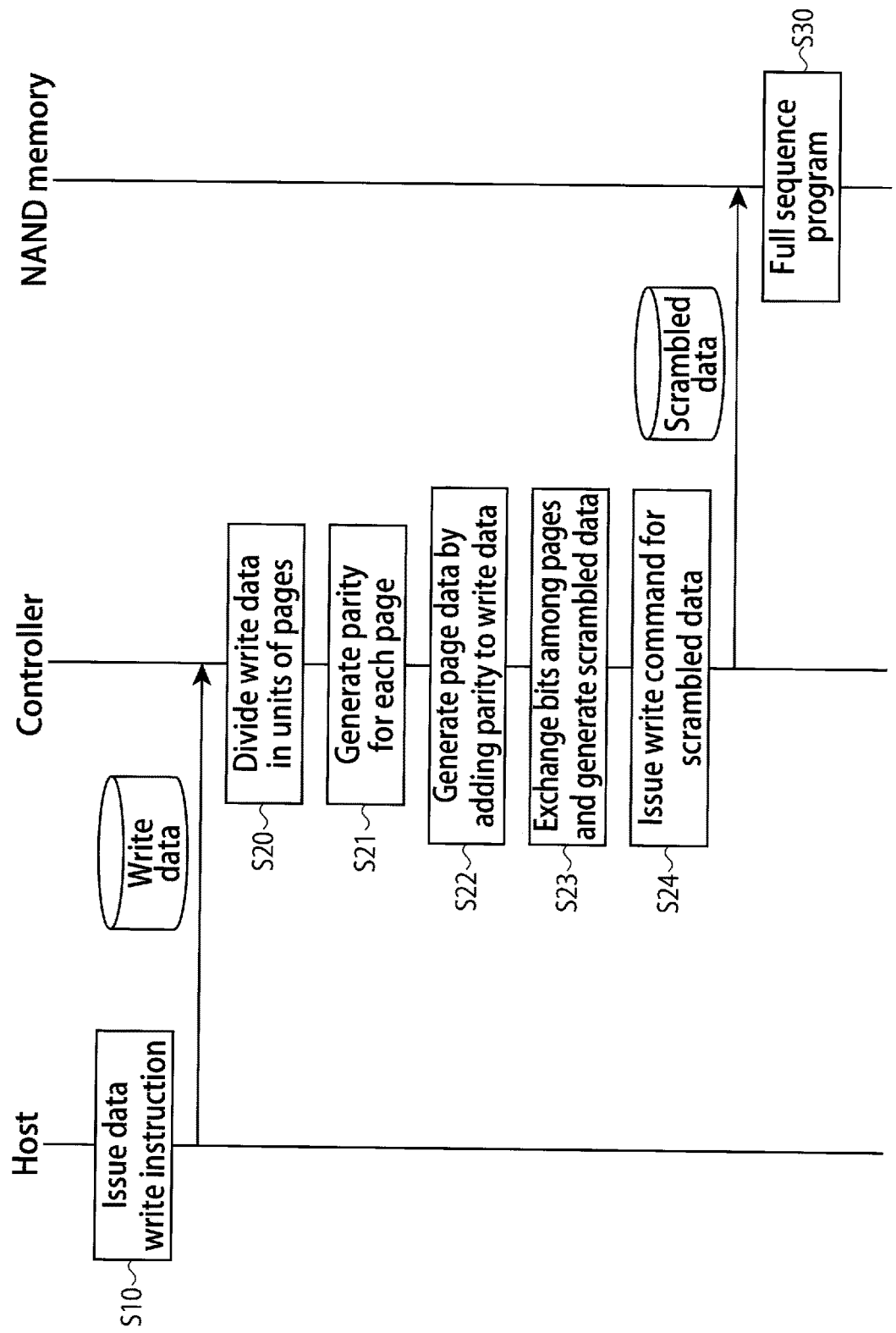
F I G. 15

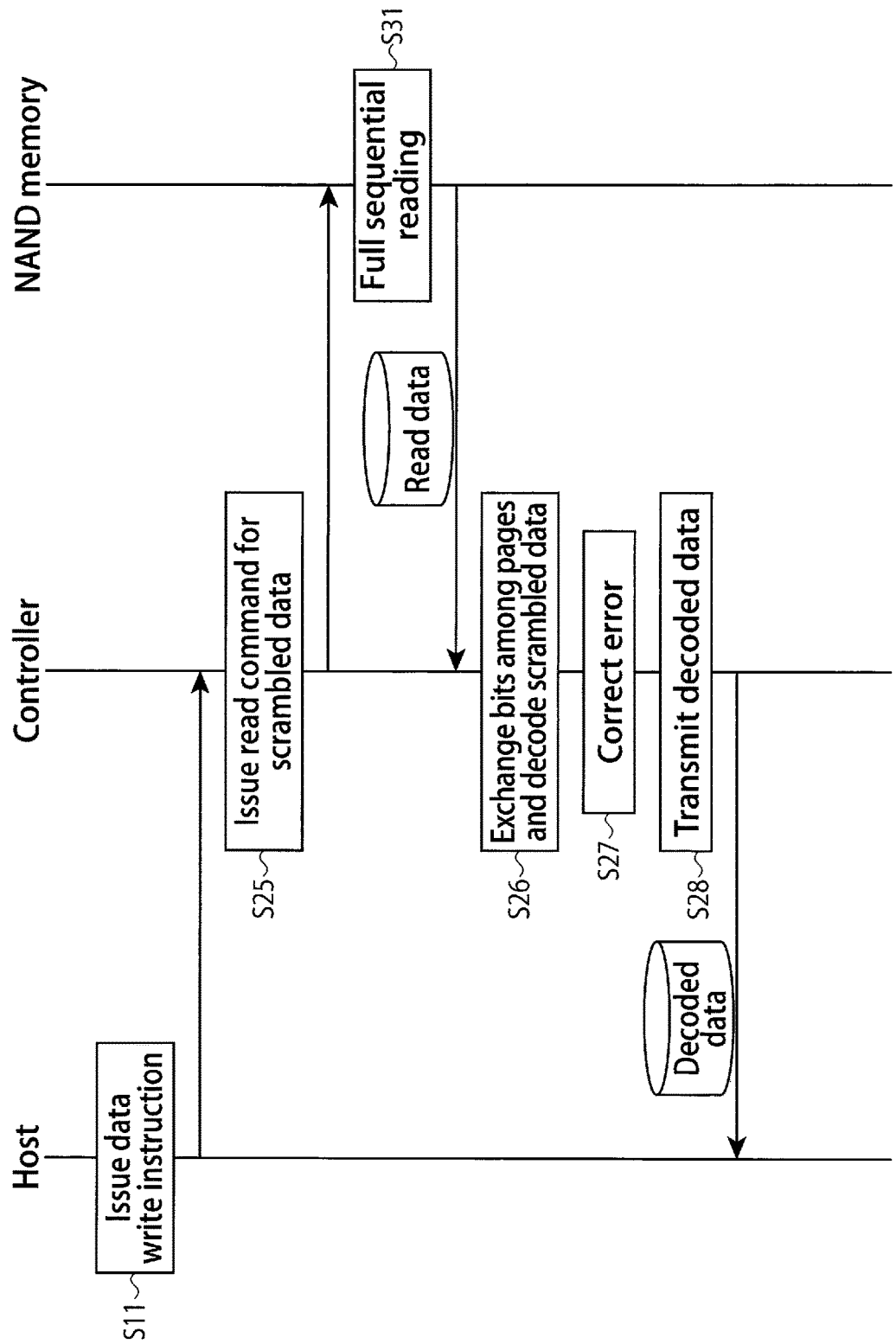
F I G. 20A

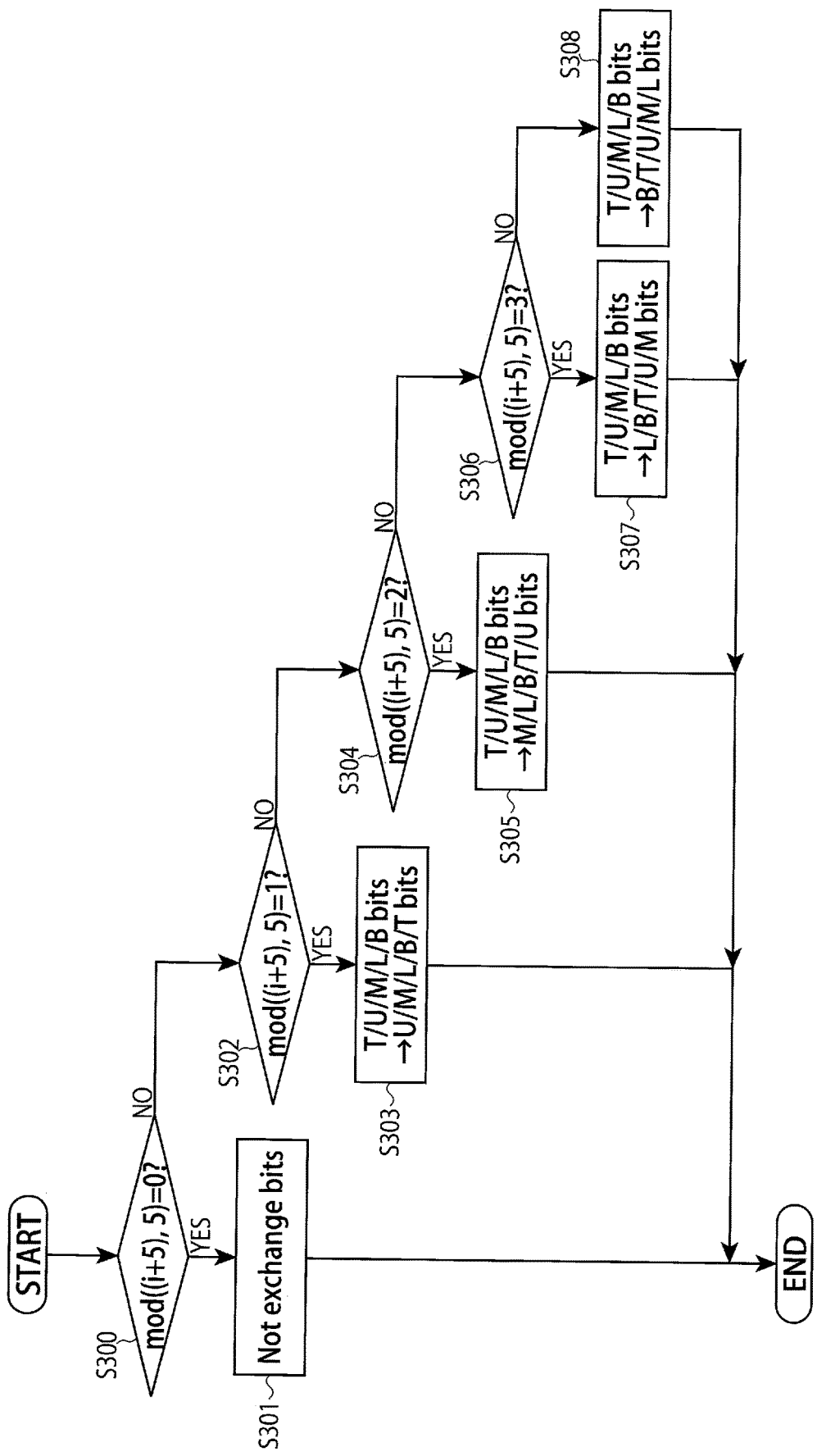
F I G. 22B

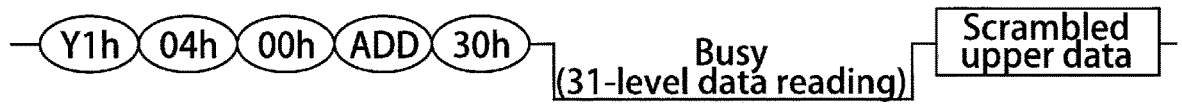
F I G. 23A
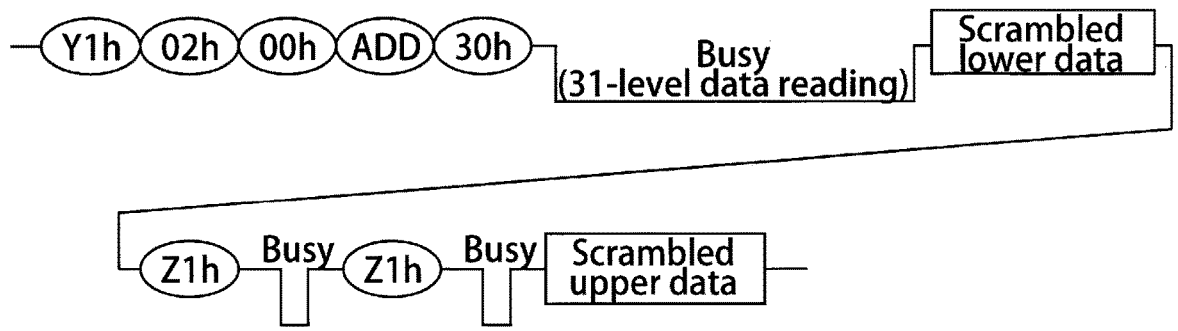
F I G. 23B
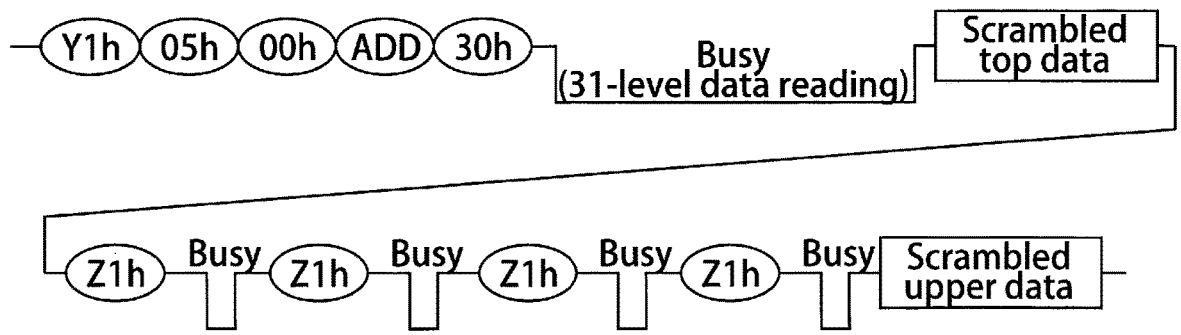
F I G. 23C

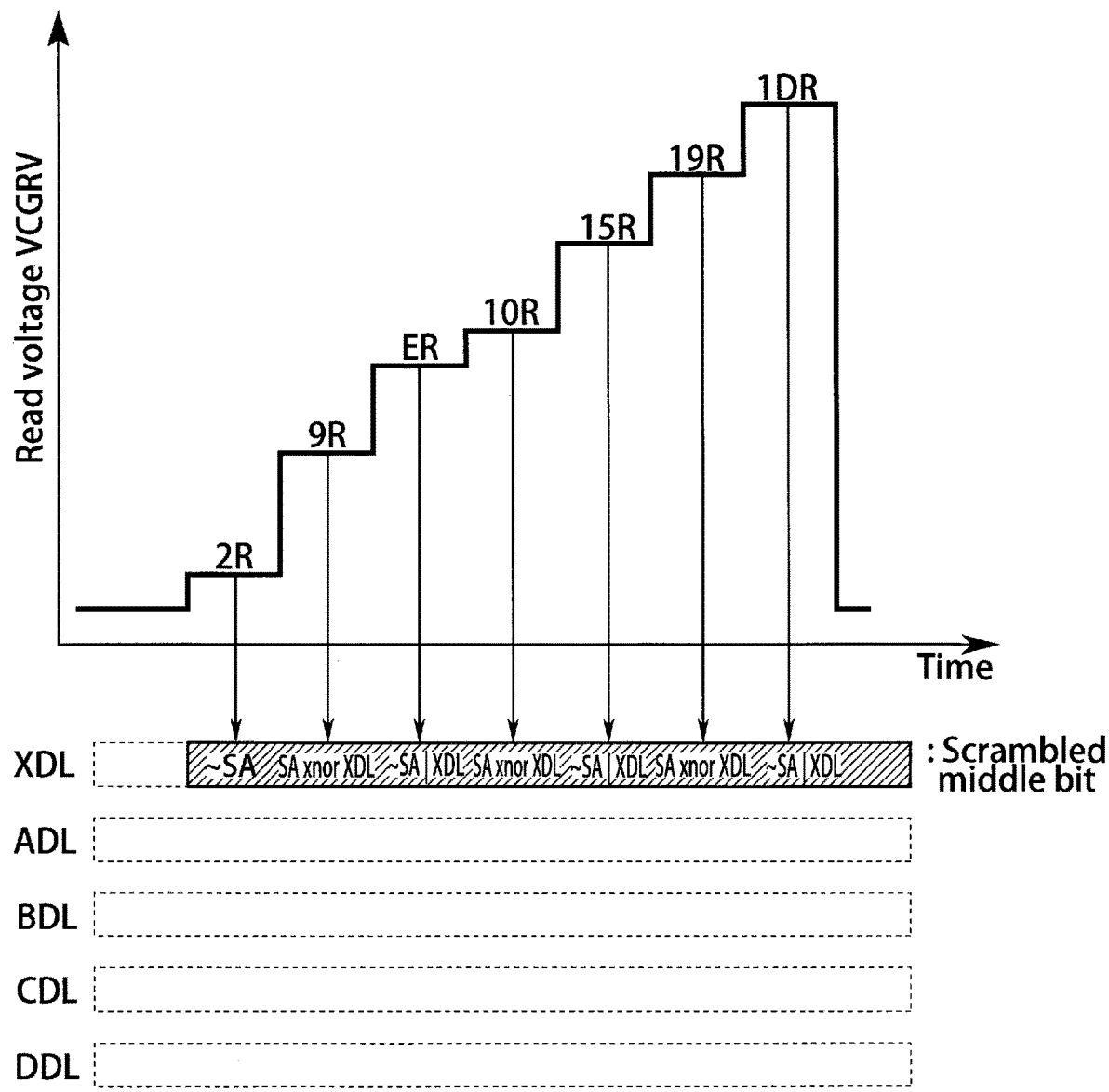
F I G. 29B

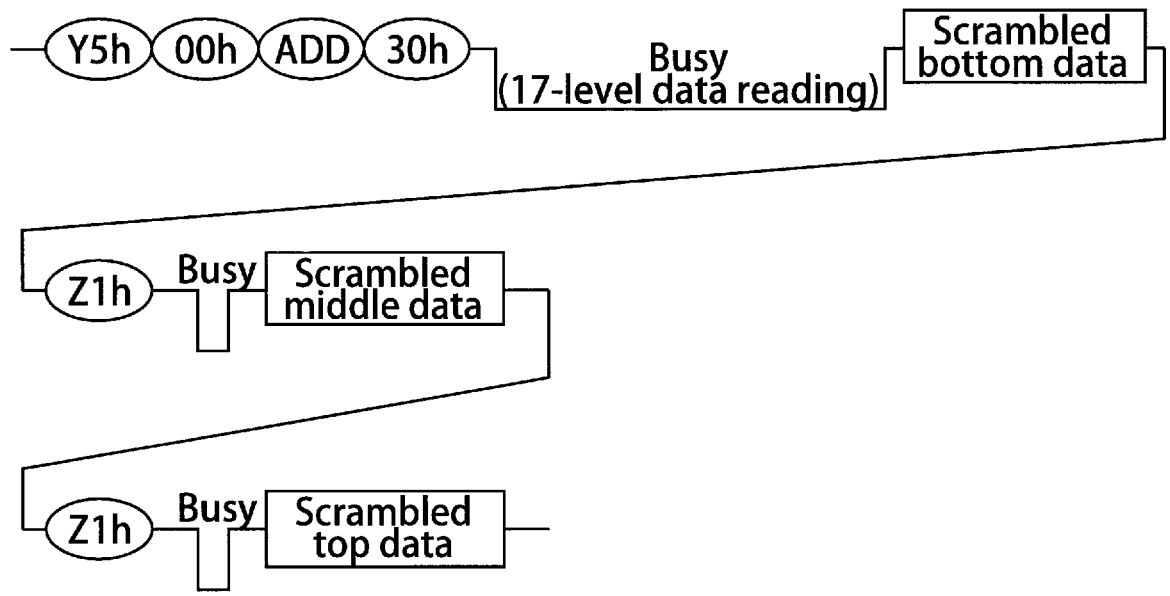
F I G. 32A
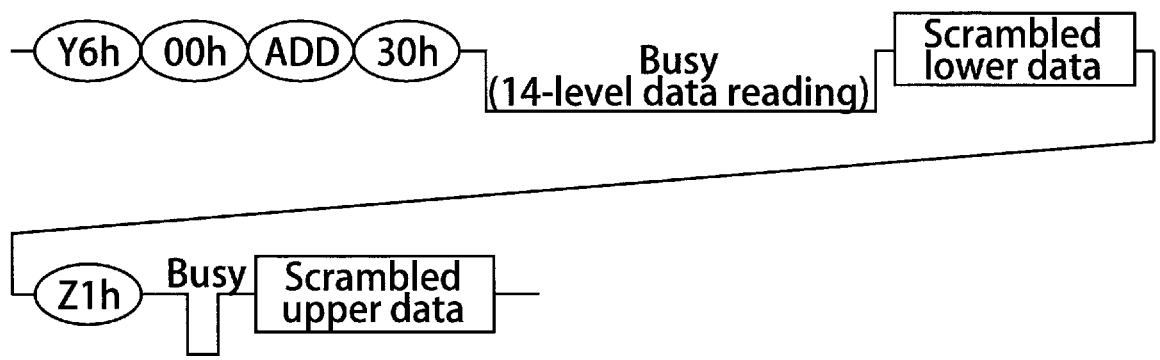
F I G. 32B

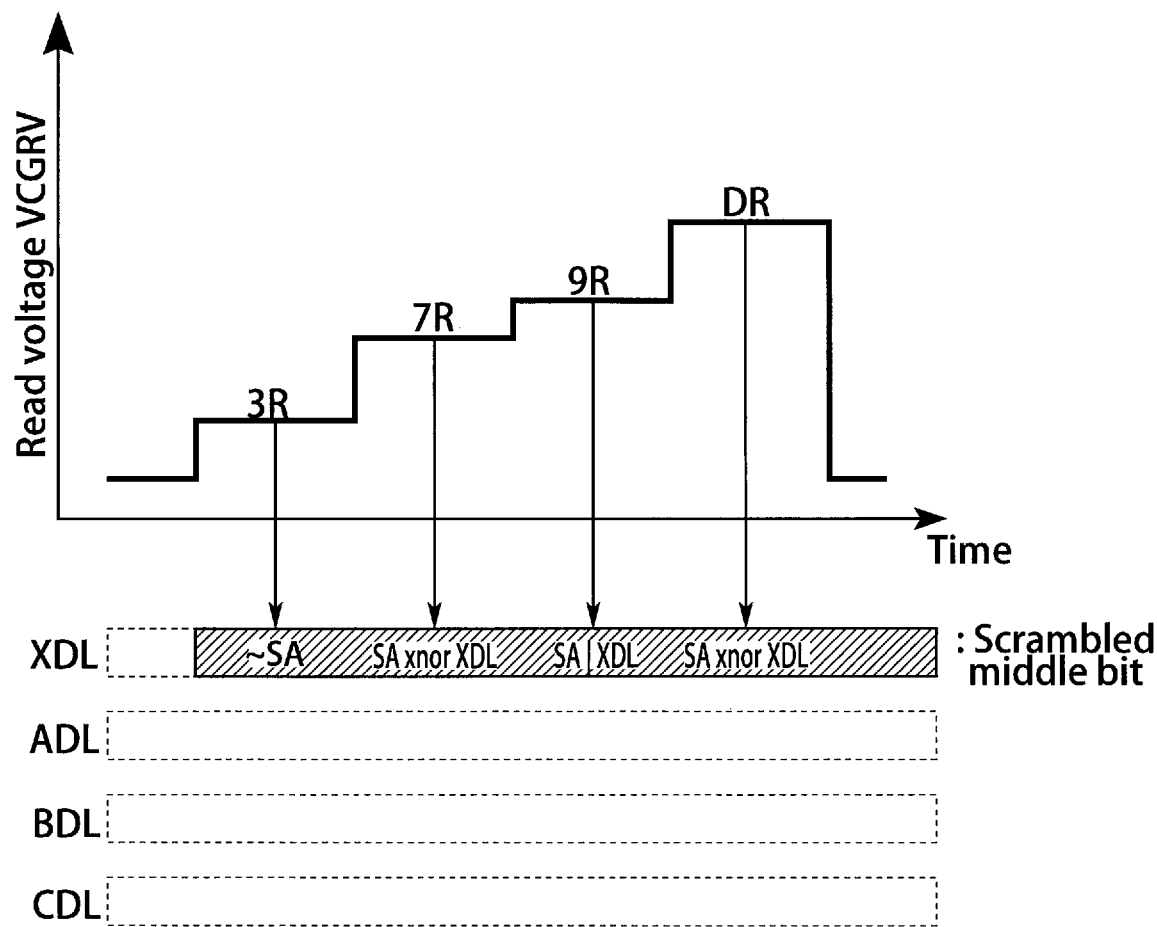
F I G. 41A

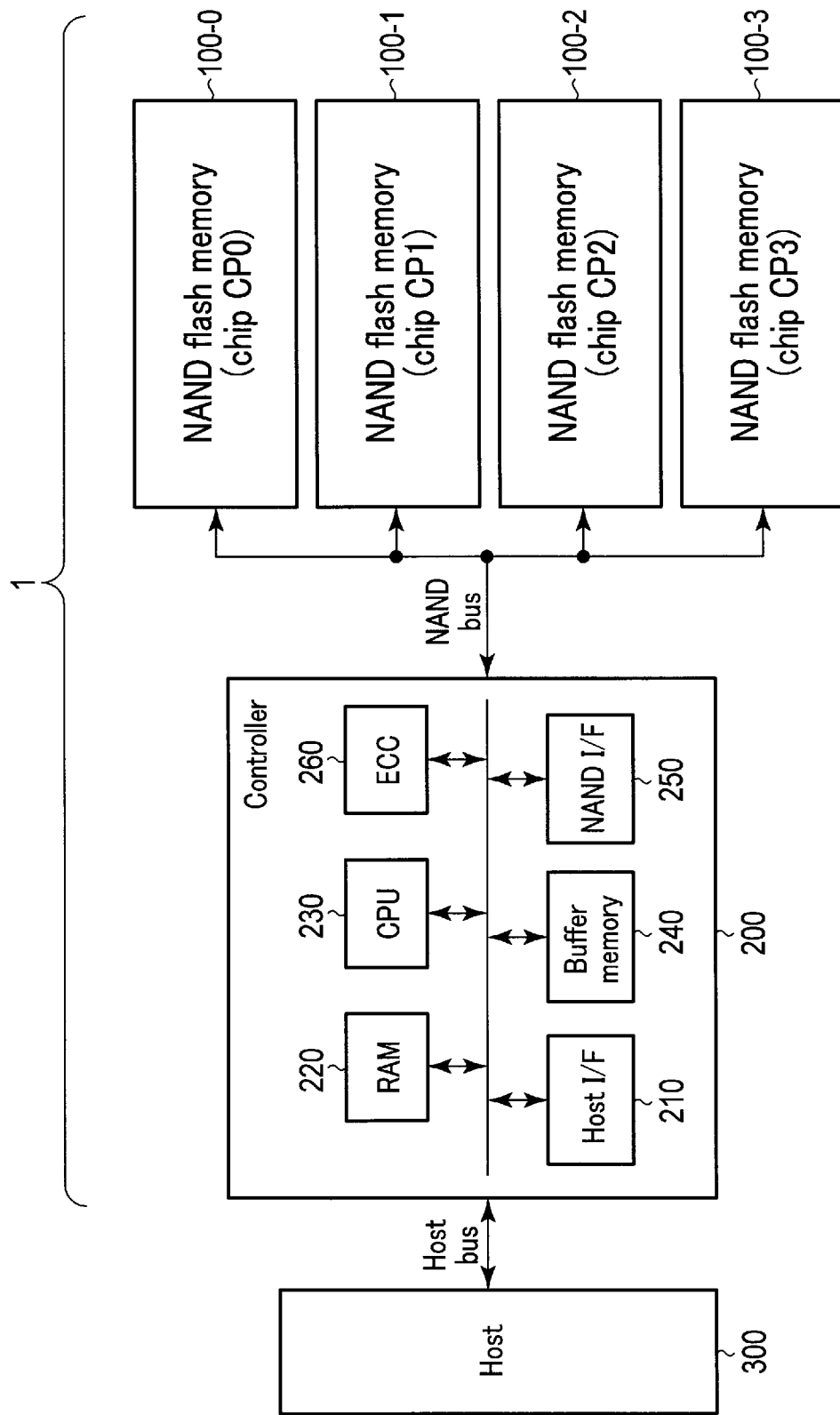
F I G. 42

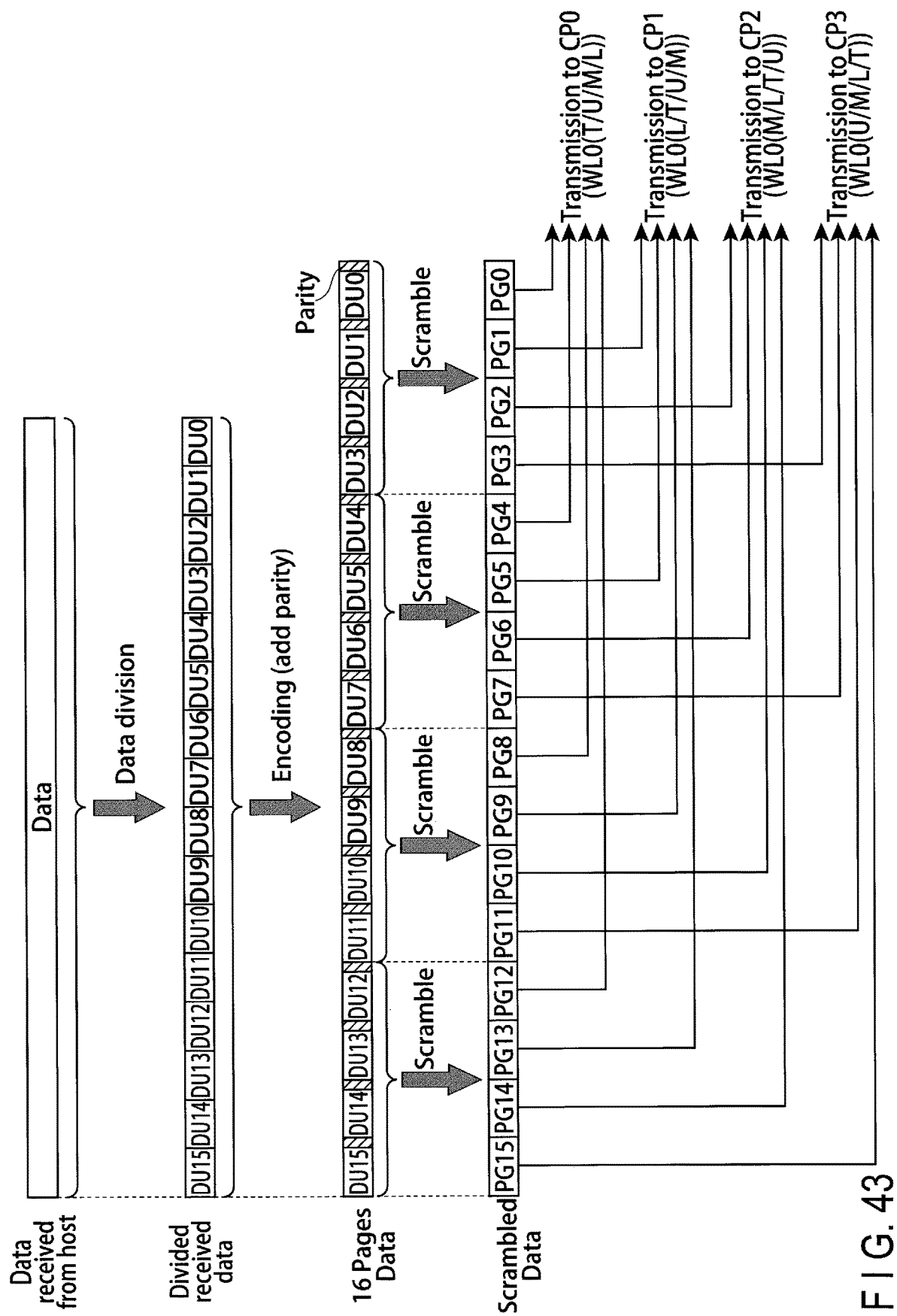
F I G. 43

| WL/bit | | Chip CP0 | Chip CP1 | Chip CP2 | Chip CP3 |
|---|---|---|---|---|---|
| ⋮ | ⋮ | ⋮ | ⋮ | ⋮ | ⋮ |
| WL(i+1) | Top | PG28 | PG25 | PG22 | PG19 |
| | Upper | PG24 | PG21 | PG18 | PG31 |
| | Middle | PG20 | PG17 | PG30 | PG27 |
| | Lower | PG16 | PG29 | PG26 | PG23 |
| WLi | Top | PG12 | PG9 | PG6 | PG3 |
| | Upper | PG8 | PG5 | PG2 | PG15 |
| | Middle | PG4 | PG1 | PG14 | PG11 |
| | Lower | PG0 | PG13 | PG10 | PG7 |
| ⋮ | ⋮ | ⋮ | ⋮ | ⋮ | ⋮ |

F I G. 44

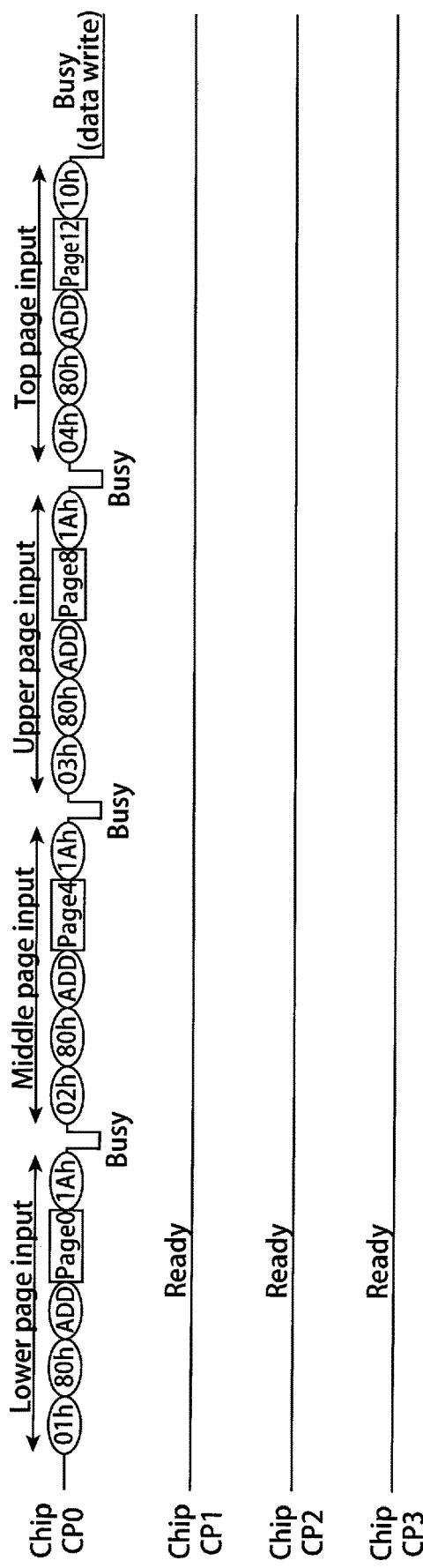
F I G. 45A

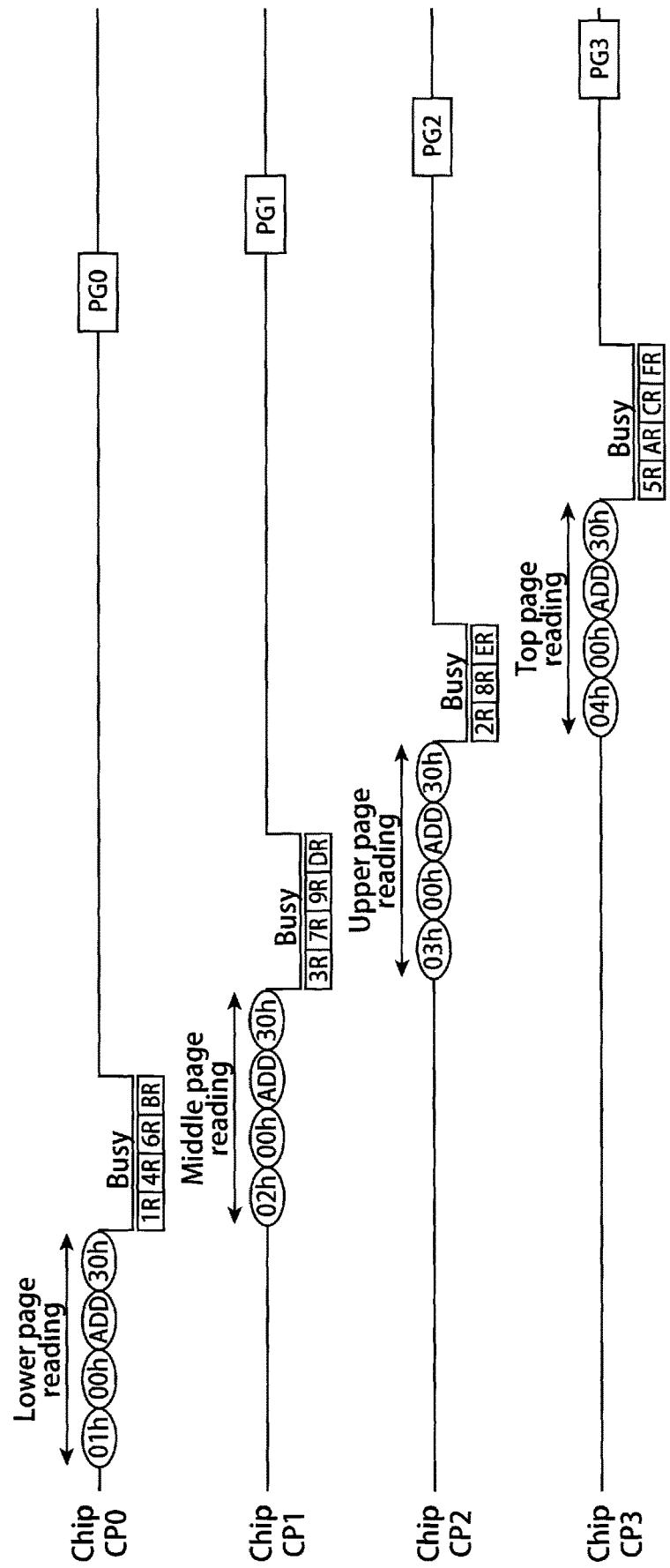
F I G. 46A

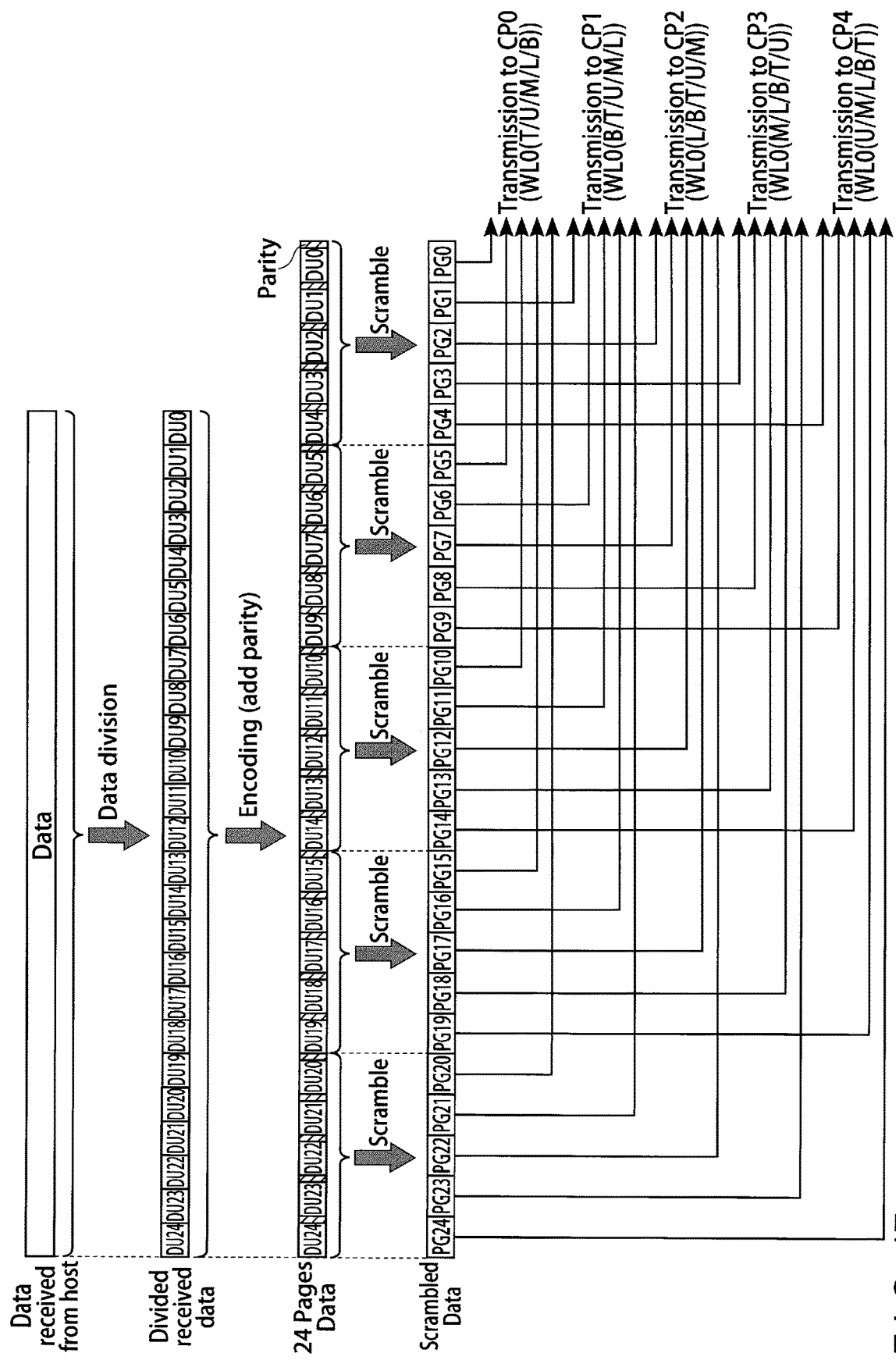
F I G. 47

| WL/bit | | Chip CP0 | Chip CP1 | Chip CP2 | Chip CP3 | Chip CP4 |
|---|---|---|---|---|---|---|
| | ⋮ | ⋮ | ⋮ | ⋮ | ⋮ | ⋮ |
| WL(i+1) | Top | PG45 | PG41 | PG37 | PG33 | PG29 |
| | Upper | PG40 | PG36 | PG32 | PG28 | PG49 |
| | Middle | PG35 | PG31 | PG27 | PG48 | PG44 |
| | Lower | PG30 | PG26 | PG47 | PG43 | PG39 |
| | Bottom | PG25 | PG46 | PG42 | PG38 | PG34 |
| WLi | Top | PG20 | PG16 | PG12 | PG8 | PG4 |
| | Upper | PG15 | PG11 | PG7 | PG3 | PG24 |
| | Middle | PG10 | PG6 | PG2 | PG23 | PG19 |
| | Lower | PG5 | PG1 | PG22 | PG18 | PG14 |
| | Bottom | PG0 | PG21 | PG17 | PG13 | PG9 |
| | ⋮ | ⋮ | ⋮ | ⋮ | ⋮ | ⋮ |

F I G. 48

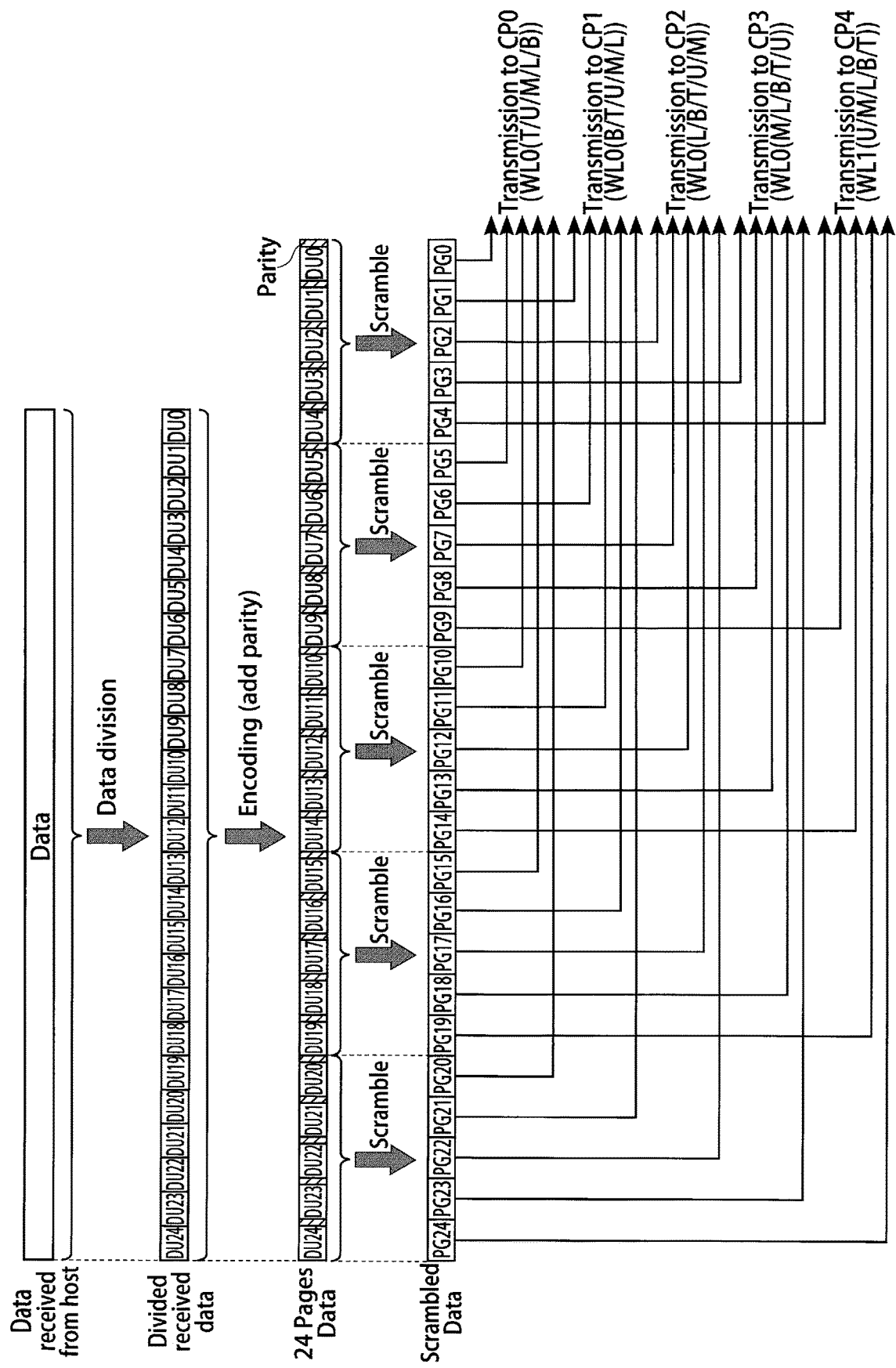
F I G. 49

| WL/bit | | Chip CP0 | Chip CP1 | Chip CP2 | Chip CP3 |
|---|---|---|---|---|---|
| ⋮ | ⋮ | ⋮ | ⋮ | ⋮ | ⋮ |
| WL(i+1) | Top | PG24 | PG45 | PG41 | PG37 |
| | Upper | PG19 | PG40 | PG36 | PG32 |
| | Middle | PG14 | PG35 | PG31 | PG27 |
| | Lower | PG9 | PG30 | PG26 | PG47 |
| | Bottom | PG4 | PG25 | PG46 | PG42 |
| WLi | Top | PG20 | PG16 | PG12 | PG8 |
| | Upper | PG15 | PG11 | PG7 | PG3 |
| | Middle | PG10 | PG6 | PG2 | PG23 |
| | Lower | PG5 | PG1 | PG22 | PG18 |
| | Bottom | PG0 | PG21 | PG17 | PG13 |
| ⋮ | ⋮ | ⋮ | ⋮ | ⋮ | ⋮ |

F I G. 50

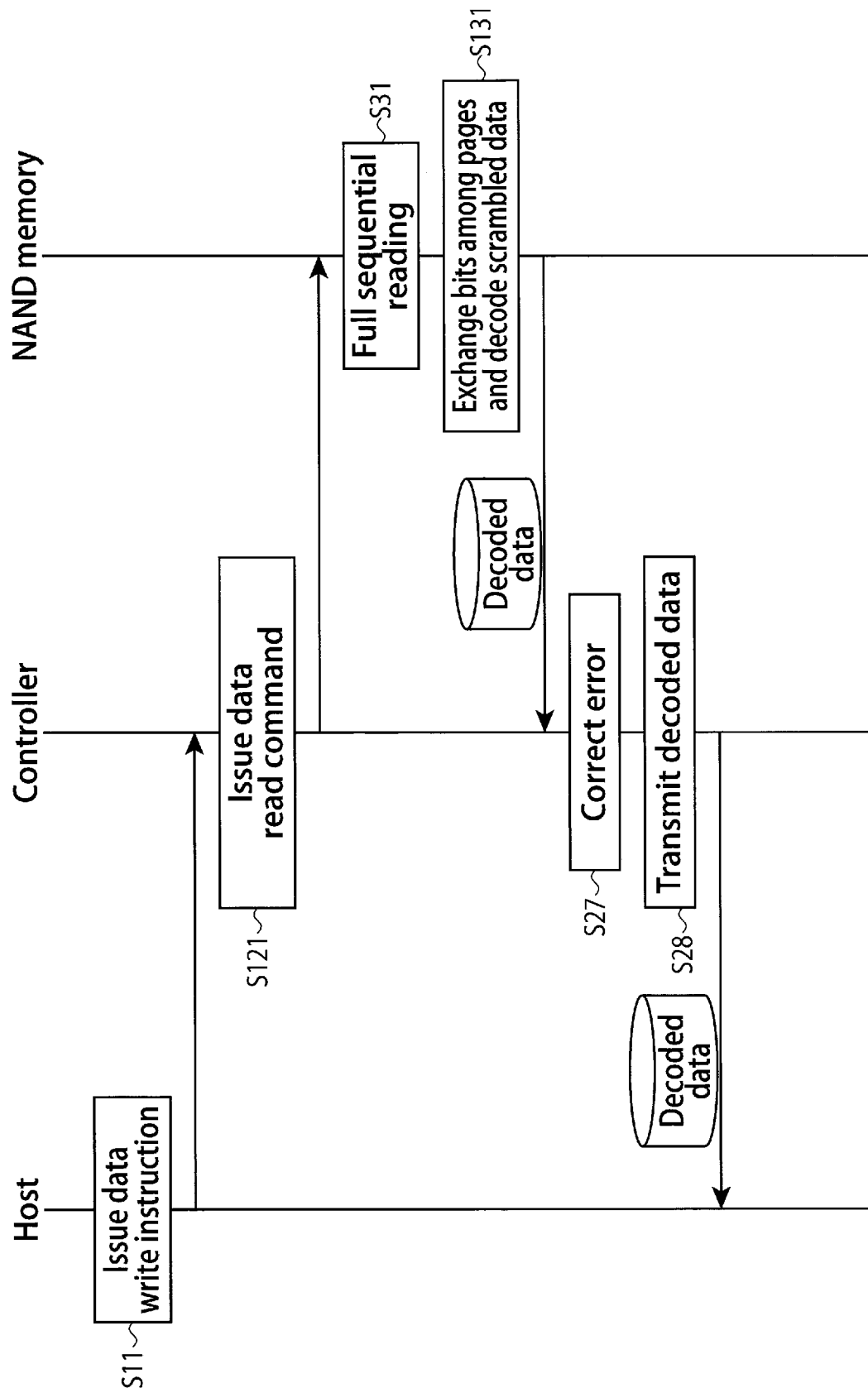
F I G. 54

SEMICONDUCTOR MEMORY DEVICE TO HOLD 5-BITS OF DATA PER MEMORY CELL

CROSS-REFERENCE TO RELATED APPLICATIONS

This application is a continuation of U.S. application Ser. No. 17/143,530 filed Jan. 7, 2021, which is a continuation of U.S. application Ser. No. 16/564,279 filed Sep. 9, 2019, which is based upon and claims the benefit of priority from Japanese Patent Application No. 2019-054177, filed Mar. 22, 2019, the entire contents of each of which are incorporated herein by reference.

FIELD

Embodiments described herein relate generally to a semiconductor memory device.

BACKGROUND

A semiconductor memory including memory cells arranged three-dimensionally is known.

BRIEF DESCRIPTION OF THE DRAWINGS

FIG. 15 is a flowchart illustrating a writing operation according to a fifth embodiment;

FIG. 20A and FIG. 20B are flowcharts illustrating a reading operation according to the fifth embodiment;

FIG. 22B is a flowchart illustrating a scrambled data decoding method according to the fifth embodiment;

FIG. 23A, FIG. 23B, and FIG. 23C are schematic diagrams illustrating read command sequences according to a first modification of the fifth embodiment;

FIG. 29A, FIG. 29B, and FIG. 29C are timing charts of various signals during a reading operation according to the sixth embodiment;

FIG. 32A and FIG. 32B are schematic diagrams illustrating read command sequences according to the seventh embodiment;

FIG. 41A and FIG. 41B are timing charts of various signals during a reading operation according to the tenth embodiment;

FIG. 42 is a block diagram of a memory system according to an eleventh embodiment;

FIG. 43 is a conceptual diagram illustrating processes of a controller in a writing operation according to the eleventh embodiment;

FIG. 44 is a diagram illustrating the relationship between writing data and each of a word line, a chip line, and write data in the writing operation according to the eleventh embodiment;

FIG. 45A, FIG. 45B, FIG. 45C and FIG. 45D are schematic diagrams illustrating write command sequences according to the eleventh embodiment;

FIG. 46A is a schematic diagram illustrating a read command sequence according to the eleventh embodiment;

FIG. 47 is a conceptual diagram illustrating processes of a controller in a writing operation according to a twelfth embodiment;

FIG. 48 is a diagram illustrating the relationship between writing data and each of a word line, a chip line, and write data in the writing operation according to the twelfth embodiment;

FIG. 49 is a conceptual diagram illustrating processes of a controller in the writing operation according to a modification of the twelfth embodiment;

FIG. 50 is a diagram illustrating the relationship between writing data and each of a word line, a chip line, and write data in the writing operation according to a modification of the twelfth embodiment;

FIG. 54 is a flowchart illustrating a reading operation according to a modification of the fifth to twelfth embodiments.

DETAILED DESCRIPTION

In general, according to one embodiment, a semiconductor memory device includes: a memory cell configured to hold 5-bit data according to a threshold; a word line coupled to the memory cell; and a row decoder configured to apply first to 31st voltages to the word line. A first bit of the 5-bit data is established by reading operations using first to sixth voltages. A second bit of the 5-bit data is established by reading operations using seventh to twelfth voltages. The second bit is different from the first bit. A third bit of the 5-bit data is established by reading operations using thirteenth to eighteenth voltages. The third bit is different from the first and second bits. A fourth bit of the 5-bit data is established by reading operations using nineteenth to 25th voltages. The fourth bit is different from the first to third bits. A fifth bit of the 5-bit data is established by reading operations using 26th to 31st voltages. The fifth bit is different from the first to fourth bits. The first to 31st voltages are different voltages.

1. First Embodiment

A semiconductor storage device according to the first embodiment will be described. As the semiconductor memory device, a NAND flash memory with memory cells arranged on a semiconductor substrate two dimensionally or above a semiconductor substrate three dimensionally will be described by way of example.

1.1 Configuration 1.1.1 Overall Configuration of Memory System

Figure 1:
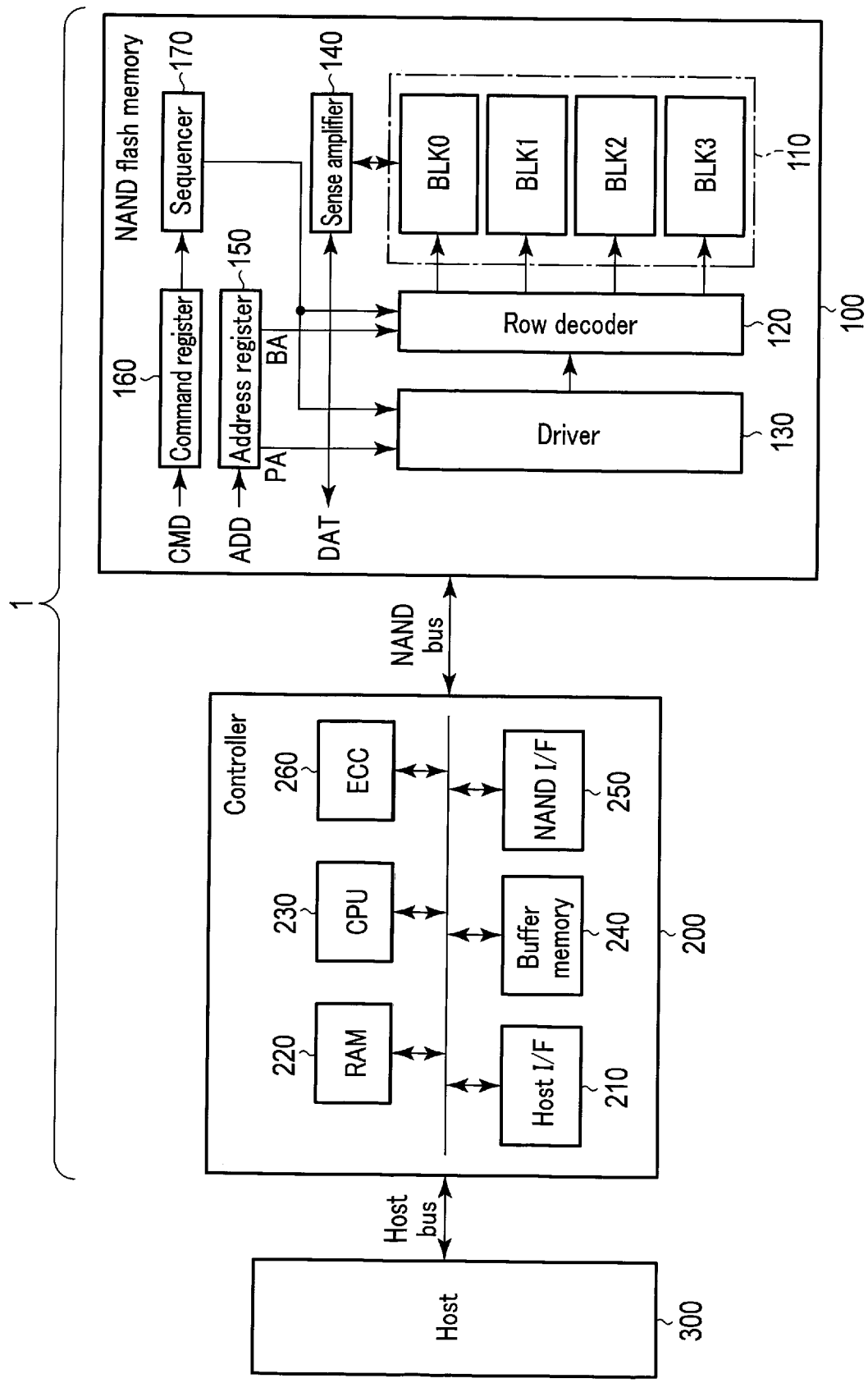
FIG. 1 is a block diagram of a memory system according to a first embodiment.

First, a rough overall configuration of a memory system including the semiconductor memory device according to the present embodiment will be described with reference to FIG. 1. FIG. 1 is a block diagram of the memory system according to the present embodiment.

As shown in FIG. 1, a memory system 1 includes a NAND flash memory 100 and a controller 200. The NAND flash memory 100 and the controller 200 may form one semiconductor device in combination, for example. The semiconductor device is, for example, a memory card such as an SD™ card, or a solid state drive (SSD).

The NAND flash memory 100 includes a plurality of memory cells to store data in a non-volatile manner. The controller 200 is connected to the NAND flash memory 100 by a NAND bus and is connected to a host apparatus 300 by a host bus. The controller 200 controls the NAND flash memory 100, and accesses the NAND flash memory 100 in response to an instruction received from the host apparatus 300. The host apparatus 300 is, for example, a digital camera or a personal computer or the like, and the host bus is, for example, an SD™ interface-compatible bus.

The NAND buses perform signal transmission/reception compliant with a NAND interface. The signal includes, for example, a chip enable signal CEn, an address latch enable signal ALE, a command latch enable signal CLE, a write enable signal WEn, a read enable signal REn, a ready/busy signal RBn, and an input/output signal I/O.

The signal CEn is a signal for enabling the NAND flash memory 100. Signals CLE and ALE are signals for notifying the NAND flash memory 100 that the input/output signal I/O to the NAND flash memory 100 is a command and an address, respectively. Signal WEn is asserted at the low level, and is used for taking an input signal I/O in the NAND flash memory 100. Signal REn is also asserted at the low level, and is used for reading an output signal I/O from the NAND flash memory 100. The ready/busy signal RBn indicates whether the NAND flash memory 100 is in a ready state (a state where an instruction from the controller 200 can be received) or in a busy state (a state where an instruction from the controller 200 cannot be received), and the low level indicates the busy state. The input/output signal I/O is, for example, an 8-bit signal. The input/output signal I/O is an entity of data transmitted and received between the NAND flash memory 100 and the controller 200, and is a command, an address, write data, read data, or the like.

1.1.2 Configuration of Controller 200

Details of the configuration of the controller 200 will be described with continued reference to FIG. 1. As shown in FIG. 1, the controller 200 includes a host interface circuit 210, an embedded memory (RAM) 220, a processor (CPU) 230, a buffer memory 240, and a NAND interface circuit 250.

The host interface circuit 210 is coupled to the host apparatus 300 via the host bus to transfer instructions and data received from the host apparatus 300 respectively to the processor 230 and the buffer memory 240. The host interface circuit 210 also transfers data in the buffer memory 240 to the host apparatus 300 in response to an instruction from the processor 230.

The processor 230 controls the operation of the entire controller 200. For example, upon receipt of a write instruction from the host apparatus 300, the processor 230 issues, in response thereto, a write instruction to the NAND interface circuit 250. Similar processing is performed at the time of reading or erasing. The processor 230 also executes various processes, such as wear leveling, for managing the NAND flash memory 100.

The NAND interface circuit 250 is coupled to the NAND flash memory 100 via the NAND bus to communicate with the NAND flash memory 100. Based on an instruction from the processor 230, the NAND interface circuit 250 outputs the signals ALE, CLE, WEn, and REn to the NAND flash memory 100. During writing, the NAND interface circuit 250 transfers a write command issued by the processor 230 and write data in the buffer memory 240 to the NAND flash memory 100 as I/O signals I/O. Moreover, during reading, the NAND interface circuit 250 transfers the read command issued by the processor 230 to the NAND flash memory 100 as an I/O signal I/O and further receives the data read from the NAND flash memory 100 as an I/O signal I/O and transfers the data to the buffer memory 240.

The buffer memory 240 temporarily holds write data and read data.

The embedded memory 220 is, for example, a semiconductor memory, such as a DRAM, and is used as a work area of the processor 230. The embedded memory 220 holds firmware that allows the NAND flash memory 100 to be managed, various management tables, and the like.

1.1.3 Configuration of NAND Flash Memory 100

1.1.3.1 Overall Configuration of NAND Flash Memory 100

Next, a configuration of the NAND flash memory 100 will be described. As shown in FIG. 1, the NAND flash memory 100 includes a memory cell array 110, a row decoder 120, a driver circuit 130, a sense amplifier 140, an address register 150, a command register 160, and a sequencer 170.

The memory cell array 110 includes, for example, four blocks BLK (BLK0 to BLK3) each including a plurality of nonvolatile memory cells associated with rows and columns. The memory cell array 110 stores data provided from the controller 200.

The row decoder 120 selects one of the blocks BLK0 to BLK3 and further selects a row direction the selected block BLK.

The driver circuit 130 supplies a voltage to the selected block BLK via the row decoder 120.

The sense amplifier 140, during data reading, senses data read from the memory cell array 110 and outputs the data DAT to the controller 200. In data writing, the sense amplifier 140 transfers write data DAT received from the controller 200 to the memory cell array 110.

The address register 150 holds an address ADD received from the controller 200. The command register 160 holds a command CMD received from the controller 200.

The sequencer 170 controls the operation of the entire NAND flash memory 100 based on the command CMD held in the command register 160.

1.1.3.2 Configuration of Block BLK

Figure 2:
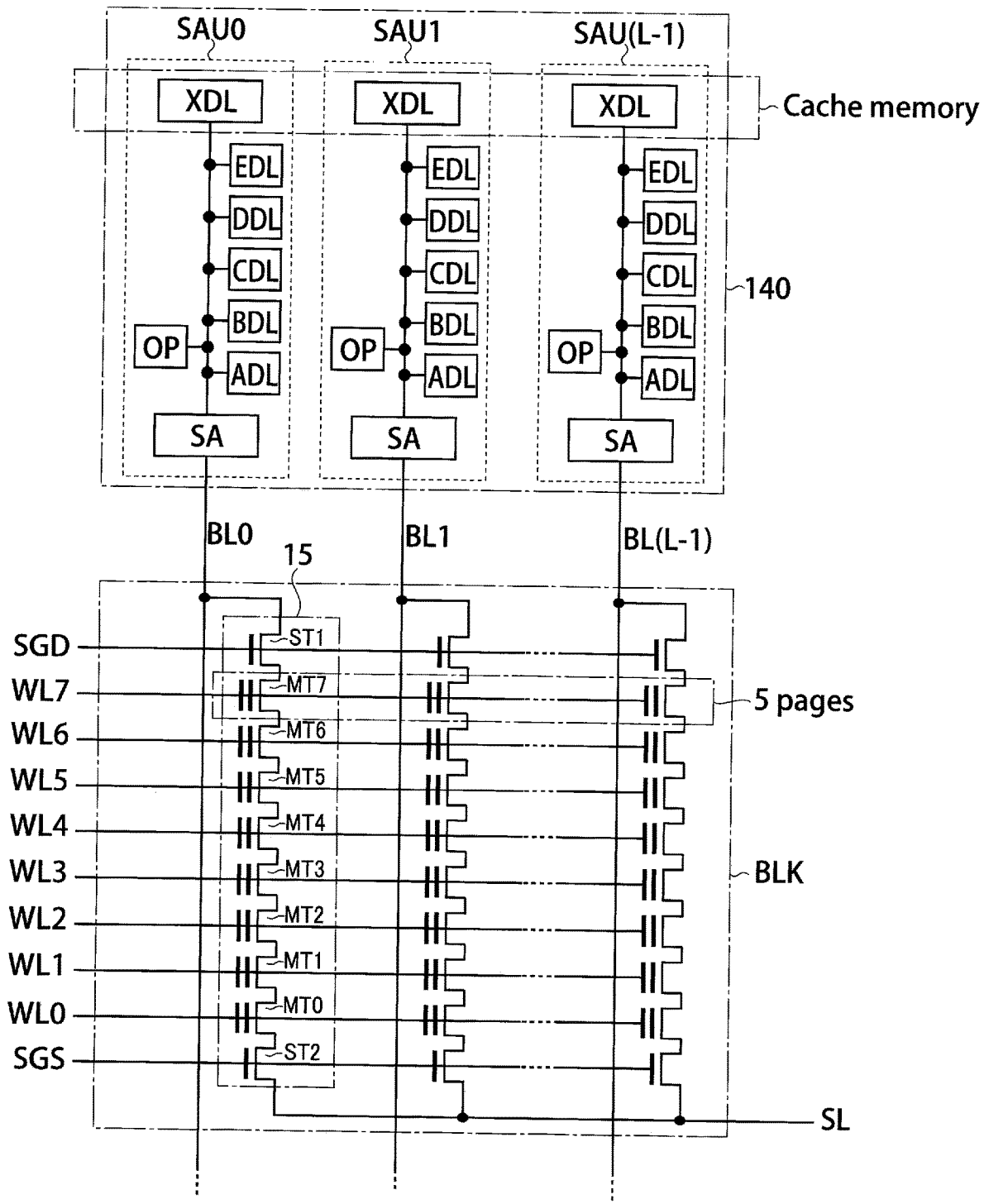
FIG. 2 is a circuit diagram of a memory cell array according to the first embodiment.

Next, a configuration of the block BLK will be described with reference to FIG. 2. FIG. 2 is a circuit diagram of the blocks BLK and the sense amplifier 140.

As shown in FIG. 2, the block BLK includes a plurality of NAND strings 15. Each of the NAND strings 15 includes, for example, eight memory cell transistors MT (MT0 to MT7) and selection transistors ST1 and ST2. The memory cell transistor MT includes a control gate and a charge storage layer, and holds data in a nonvolatile manner. The memory cell transistors MT are coupled in series between the source of selsection transistor ST1 and the drain of selsection transistor ST2.

The gates of selection transistors ST1 and ST2 in the same block are coupled in common to selection gate lines SGD and SGS, respectively. Similarly, the control gates of the memory cell transistors MT0 to MT7 in the same block are coupled in common to the word lines WL0 to WL7, respectively.

The drains of selection transistors ST1 of the NAND strings 15 in the same column in the memory cell array 110 are coupled in common to a bit line BL (BL0 to BL(L−1), where (L−1) is a natural number equal to or larger than 1). Namely, the bit line BL couples the NAND strings 15 together in common among a plurality of blocks BLK. Moreover, the sources of a plurality of selection transistors ST2 are coupled in common to a source line SL.

In this example, one memory cell transistor MT can hold, for example, 5-bit data. The bits of the 5-bit data will be referred to as a bottom bit, a lower bit, a middle bit, an upper bit, and a top bit, in ascending order from the least significant bit. A set of bottom bits held in memory cells coupled to the same word line will be referred to as "a bottom page", a set of lower bits held in memory cells coupled to the same word line will be referred to as "a lower page", a set of middle bits held in memory cells coupled to the same word line will be referred to as "a middle page", a set of upper bits held in memory cells coupled to the same word line will be referred to as "an upper page", and a set of top bits held in memory cells coupled to the same word line will be referred to as "a top page". Namely, five pages are assigned to one word line WL, and the block BLK including eight word lines WL has a capacity of 40 pages. In other words, "page" may also be defined as a part of a memory space formed by memory cells coupled to the same word line. Data may be written or read in units of pages (this reading method is called page-by-page reading). Data is erased in units of blocks BLK.

The memory cell array may be configured such that memory cell transistors are three-dimensionally stacked above a semiconductor substrate. Such a configuration is described, for example, in U.S. patent application Ser. No. 12/407,403, entitled "THREE-DIMENSIONAL STACKED NONVOLATILE SEMICONDUCTOR MEMORY", filed on Mar. 19, 2009. This is also described in U.S. patent application Ser. No. 12/406,524 filed on Mar. 18, 2009 entitled "THREE-DIMENSIONAL STACKED NONVOLATILE SEMICONDUCTOR MEMORY", U.S. patent application Ser. No. 12/679,991 filed on Mar. 25, 2010 entitled "NONVOLATILE SEMICONDUCTOR MEMORY DEVICE AND METHOD FOR MANUFACTURING THE SAME", and U.S. patent application Ser. No. 12/532,030 filed on Mar. 23, 2009 entitled "SEMICONDUCTOR MEMORY AND METHOD FOR MANUFACTURING THE SAME". These patent applications are incorporated herein by reference in their entirety.

1.1.3.3 Configuration of Sense Amplifier 140

Next, a configuration of the sense amplifier 140 will be described with reference to FIG. 2. As shown in FIG. 2, the sense amplifier 140 includes sense amplifier units SAU (SAU0 to SAU(L−1)) provided for respective bit lines BL.

The sense amplifier units SAU each include a sense section SA, an arithmetic operation section OP, and six latch circuits ADL, BDL, CDL, DDL, EDL, and XDL.

The sense section SA senses data read out to the corresponding bit line BL, and applies a voltage to the bit line BL in accordance with write data. That is, the sense section SA is a module that directly controls the bit line BL.

The latch circuits ADL, BDL, CDL, DDL, and EDL temporarily store read data and write data. The arithmetic operation section OP performs various logical operations, such as a logical add (OR) operation, a logical multiply (AND) operation, a negation (NOT) operation, an exclusive OR (XOR) operation, and an exclusive NOR (XNOR) operation on data stored in the latch circuits ADL, BDL, CDL, DDL, and EDL.

The sense section SA, the latch circuits ADL, BDL, CDL, DDL, and EDL, and the arithmetic operation section OP are coupled to one another by a bus so that data can be transmitted and received therebetween. The bus is coupled further to the latch circuit XDL.

Data is input from and output to an external device at the sense amplifier 140 via the latch circuit XDL. More specifically, data received from the controller 200 is transferred to the latch circuits ADL, BDL, CDL, DDL, and EDL or the sense section SA via the latch circuit XDL. Data of the latch circuits ADL, BDL, CDL, DDL, and EDL or the sense section SA is transmitted to the controller 200 via the latch circuit XDL. The latch circuit XDL functions as a cache memory of the NAND flash memory 100. Therefore, even if the latch circuits ADL, BDL, CDL, DDL, and EDL are in use, the NAND flash memory 100 can be in the ready state as long as the latch circuit XDL is available.

1.1.3.4 Data Held in Memory Cell Transistors and Threshold Voltage

Figure 3:
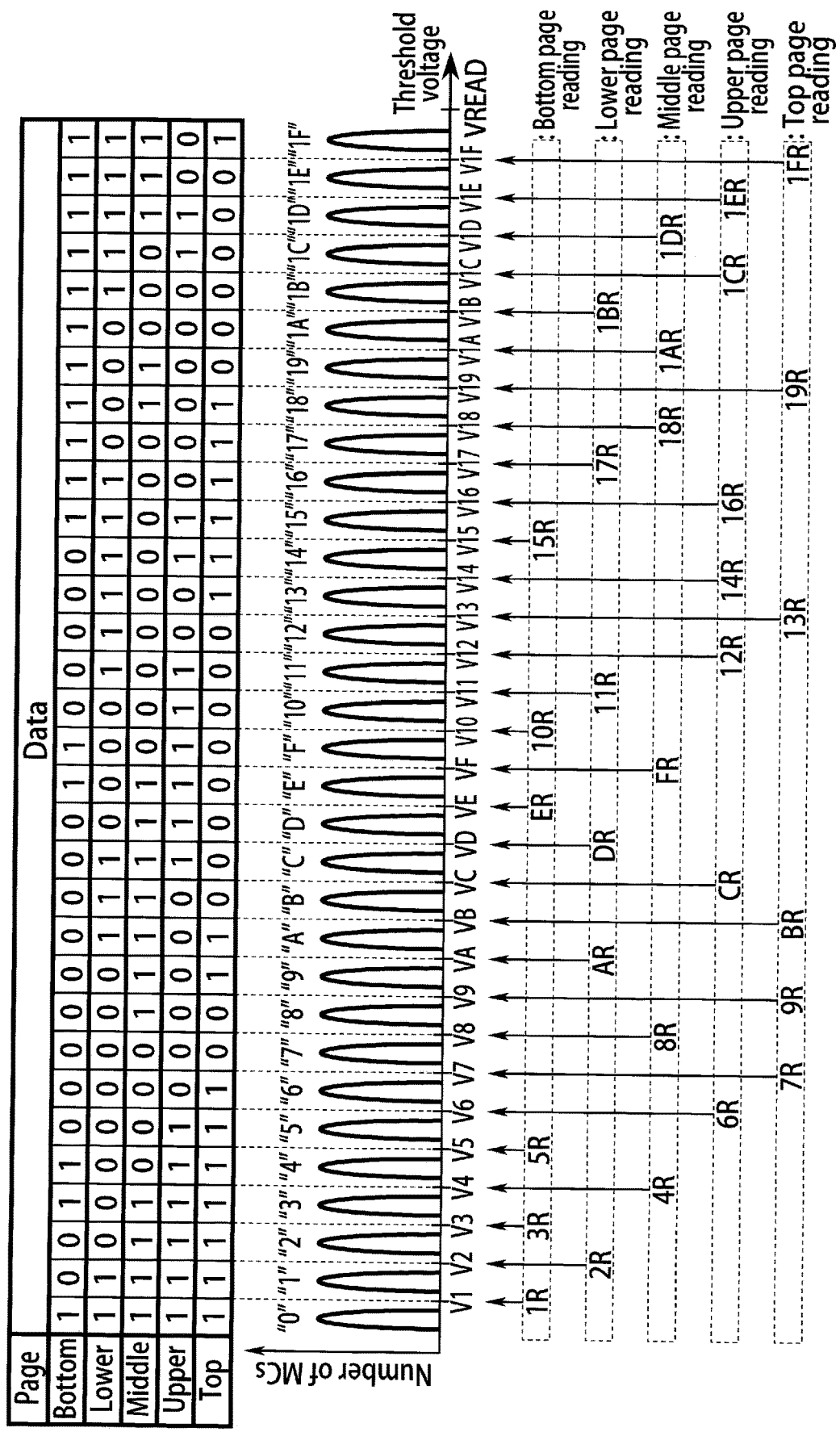
FIG. 3 is a diagram illustrating possible data, a threshold distribution, and read voltages for memory cells according to the first embodiment.

Data held in the memory cell transistors MT, threshold voltages and read levels of the respective data will be explained with reference to FIG. 3. FIG. 3 is a diagram illustrating possible data, a threshold distribution, and voltages used during reading, for the memory cell transistors MT.

As described above, the memory cell transistors MT can take 32 states in accordance with their threshold voltages. The 32 states are hereinafter referred to as a "0" state, "1" state, "2" state, "F" state, . . . , "10" state, "11" state, . . . , and "1F state" in hexadecimal notation in order from data with the lowest threshold voltage.

The threshold voltage of the memory cell transistor MT in the "0" state is lower than a voltage V1 and corresponds to a data erase state. The threshold voltage of the memory cell transistor MT in the "1" state is equal to or higher than the voltage V1 and lower than a voltage V2 (>V1). The threshold voltage of the memory cell transistor MT in the "2" state is equal to or higher than the voltage V2 and lower than a voltage V3 (>V2). The threshold voltage of the memory cell transistor MT in the "3" state is equal to or higher than the voltage V3 and lower than a voltage V4 (>V3). The threshold voltage of the memory cell transistor MT in the "4" state is equal to or higher than the voltage V4 and lower than a voltage V5 (>V4). The threshold voltage of the memory cell transistor MT in the "5" state is equal to or higher than the voltage V5 and lower than a voltage V6 (>V5). The threshold voltage of the memory cell transistor MT in the "6" state is equal to or higher than the voltage V6 and lower than a voltage V7 (>V6). The threshold voltage of the memory cell transistor MT in the "7" state is equal to or higher than the voltage V7 and lower than a voltage V8 (>V7). The threshold voltage of the memory cell transistor MT in the "8" state is equal to or higher than the voltage V8 and lower than a voltage V9 (>V8). The threshold voltage of the memory cell transistor MT in the "9" state is equal to or higher than the voltage V9 and lower than a voltage VA (>V9). The threshold voltage of the memory cell transistor MT in the "A" state is equal to or higher than voltage VA and lower than voltage VB (>VA). The threshold voltage of the memory cell transistor MT in the "B" state is equal to or higher than the voltage VB and lower than a voltage VC (>VB). The threshold voltage of the memory cell transistor MT in the "C" state is equal to or higher than the voltage VC and lower than a voltage VD (>VC). The threshold voltage of the memory cell transistor MT in the "D" state is equal to or higher than the voltage VD and lower than a voltage VE (>VD). The threshold voltage of the memory cell transistor MT in the "E" state is equal to or higher than the voltage VE and lower than a voltage VF (>VE). The threshold voltage of the memory cell transistor MT in the "F" state is equal to or higher than the voltage VF and lower than a voltage V10.

The threshold voltage of the memory cell transistor MT in the "10" state is equal to or higher than the voltage V10 and lower than a voltage V11 (>V10). The threshold voltage of the memory cell transistor MT in the "11" state is equal to or higher than the voltage V11 and lower than a voltage V12 (>V11). The threshold voltage of the memory cell transistor MT in the "12" state is equal to or higher than the voltage V12 and lower than a voltage V13 (>V12). The threshold voltage of the memory cell transistor MT in the "13" state is equal to or higher than the voltage V13 and lower than a voltage V14 (>V13). The threshold voltage of the memory cell transistor MT in the "14" state is equal to or higher than the voltage V14 and lower than a voltage V15 (>V14). The threshold voltage of the memory cell transistor MT in the "15" state is equal to or higher than the voltage V15 and lower than a voltage V16 (>V15). The threshold voltage of the memory cell transistor MT in the "16" state is equal to or higher than the voltage V16 and lower than a voltage V17 (>V16). The threshold voltage of the memory cell transistor MT in the "17" state is equal to or higher than the voltage V17 and lower than a voltage V18 (>V17). The threshold voltage of the memory cell transistor MT in the "18" state is equal to or higher than the voltage V18 and lower than a voltage V19 (>V18). The threshold voltage of the memory cell transistor MT in the "19" state is equal to or higher than the voltage V19 and lower than a voltage V1A (>V19). The threshold voltage of the memory cell transistor MT in the "1A" state is equal to or higher than the voltage V1A and lower than a voltage V1B (>V1A). The threshold voltage of the memory cell transistor MT in the "1B" state is equal to or higher than the voltage V1B and lower than a voltage V1C (>V1B). The threshold voltage of the memory cell transistor MT in the "1C" state is equal to or higher than the voltage V1C and lower than a voltage V1D (>V1C). The threshold voltage of the memory cell transistor MT in the "1D" state is equal to or higher than the voltage V1D and lower than a voltage V1E (>V1D). The threshold voltage of the memory cell transistor MT in the "1E" state is equal to or higher than the voltage V1E and lower than a voltage V1F (>V1E). The threshold voltage of the memory cell transistor MT in the "1F" state is equal to or higher than voltage V1F and lower than a voltage VREAD. Of the 32 states accordingly distributed, the "1F" state is the highest threshold voltage state.

The above-described threshold distribution is obtained by writing 5-bit (5-page) data including the above-mentioned bottom bit, lower bit, middle bit, upper bit, and top bit. The relationship between the above 32 states in hexadecimal notation and the bottom bit, lower bit, middle bit, upper bit, and top bit is as follows:

"0" state: "11111" (represented in the order of "top/upper/middle/lower/bottom")
"1" state: "11110"
"2" state: "11100"
"3" state: "11101"
"4" state: "11001"
"5" state: "11000"
"6" state: "10000"
"7" state: "00000"
"8" state: "00100"
"9" state: "10100"
"A" state: "10110"
"B" state: "00110"
"C" state: "01110"
"D" state: "01100"
"E" state: "01101"
"F" state: "01001"
"10" state: "01000"
"11" state: "01010"
"12" state: "00010"
"13" state: "10010"
"14" state: "11010"
"15" state: "11011"
"16" state: "10011"
"17" state: "10001"
"18" state: "10101"
"19" state: "00101"
"1A" state: "00001"
"1B" state: "00011"
"1C" state: "01011"
"1D" state: "01111"
"1E" state: "00111"
"1F" state: "10111"

Only one of the five bits is different between data corresponding to adjacent two states in the threshold distribution.

Therefore, when the bottom bit is read, a voltage corresponding to a boundary where the value ("0" or "1") of the bottom bit changes may be used. This also applies to the lower bit, the middle bit, the upper bit, and the top bit.

That is, as depicted in FIG. 3, the bottom page may be read by using, as read voltages, the voltage V1 that distinguishes the "0" state from the "1" state, the voltage V3 that distinguishes the "2" state from the "3" state, the voltage V5 that distinguishes the "4" state from the "5" state, the voltage VE that distinguishes the "D" state from the "E" state, the voltage V10 that distinguishes the "F" state from the "10" state, and the voltage V15 that distinguishes the "14" state from the "15" state. The reading operations using voltages V1, V3, V5, VE, V10, and V15 will be referred to as reading operations 1R, 3R, 5R, ER, 10R, and 15R, respectively.

The reading operation 1R is a process of determining whether or not the threshold voltage of the memory cell transistor MT is lower than the voltage V1. The reading operation 3R is a process of determining whether or not the threshold voltage of the memory cell transistor MT is lower than the voltage V3. The reading operation 5R is a process of determining whether or not the threshold voltage of the memory cell transistor MT is lower than the voltage V5. The reading operation ER is a process of determining whether or not the threshold voltage of the memory cell transistor MT is lower than the voltage VE. The reading operation 10R is a process of determining whether or not the threshold voltage of the memory cell transistor MT is lower than the voltage V10. The reading operation 15R is a process of determining whether or not the threshold voltage of the memory cell transistor MT is lower than the voltage V15.

The lower page may be read by using, as read voltages, the voltage V2 that distinguishes the "1" state from the "2" state, the voltage VA that distinguishes the "9" state from the "A" state, the voltage VD that distinguishes the "C" state from the "D" state, the voltage V11 that distinguishes the "10" state from the "11" state, the voltage V17 that distinguishes the "16" state from the "17" state, and the voltage V1B that distinguishes the "1A" state from the "1B" state. The reading operations using voltages V2, VA, VD, V11, V17, and V1B will be referred to as reading operations 2R, AR, DR, 11R, 17R, and 1BR, respectively.

The reading operation 2R is a process of determining whether or not the threshold voltage of the memory cell transistor MT is lower than the voltage V2. The reading operation AR is a process of determining whether or not the threshold voltage of the memory cell transistor MT is lower than the voltage VA. The reading operation DR is a process of determining whether or not the threshold voltage of the memory cell transistor MT is lower than the voltage VD. The reading operation 11R is a process of determining whether or not the threshold voltage of the memory cell transistor MT is lower than the voltage V11. The reading operation 17R is a process of determining whether or not the threshold voltage of the memory cell transistor MT is lower than the voltage V17. The reading operation 1BR is a process of determining whether or not the threshold voltage of the memory cell transistor MT is lower than the voltage V1B.

The middle page may be read by using, as read voltages, the voltage V4 that distinguishes the "3" state from the "4" state, the voltage V8 that distinguishes the "7" state from the "8" state, the voltage VF that distinguishes the "E" state from the "F" state, the voltage V18 that distinguishes the "17" state from the "18" state, the voltage V1A that distinguishes the "1B" state from the "1A" state, and the voltage V1D that distinguishes the "1C" state from the "1D" state. The reading operations using voltages V4, V8, VF, V18, V1A, and V1D will be referred to as reading operations 4R, 8R, FR, 18R, 1AR, and 1DR, respectively.

The reading operation 4R is a process of determining whether or not the threshold voltage of the memory cell transistor MT is lower than the voltage V4. The reading operation 8R is a process of determining whether or not the threshold voltage of the memory cell transistor MT is lower than the voltage V8. The reading operation FR is a process of determining whether or not the threshold voltage of the memory cell transistor MT is lower than the voltage VF. The reading operation 18R is a process of determining whether or not the threshold voltage of the memory cell transistor MT is lower than the voltage V18. The reading operation 1AR is a process of determining whether or not the threshold voltage of the memory cell transistor MT is lower than the voltage V1A. The reading operation 1DR is a process of determining whether or not the threshold voltage of the memory cell transistor MT is lower than the voltage V1D.

The upper page may be read by using, as read voltages, the voltage V6 that distinguishes the "5" state from the "6" state, the voltage VC that distinguishes the "B" state from the "C" state, the voltage V12 that distinguishes the "11" state from the "12" state, the voltage V14 that distinguishes the "13" state from the "14" state, the voltage V16 that distinguishes the "15" state from the "16" state, the voltage V1C that distinguishes the "1B" state from the "1C" state, and the voltage V1E that distinguishes the "1D" state from the "1E" state. The reading operations using voltages V6, VC, V12, V14, V16, V1C and V1E will be referred to as reading operations 6R, CR, 12R, 14R, 16R, 1CR and 1ER, respectively.

The reading operation 6R is a process of determining whether or not the threshold voltage of the memory cell transistor MT is lower than the voltage V6. The reading operation CR is a process of determining whether or not the threshold voltage of the memory cell transistor MT is lower than the voltage VC. The reading operation 12R is a process of determining whether or not the threshold voltage of the memory cell transistor MT is lower than the voltage V12. The reading operation 14R is a process of determining whether or not the threshold voltage of the memory cell transistor MT is lower than the voltage V14. The reading operation 16R is a process of determining whether or not the threshold voltage of the memory cell transistor MT is lower than the voltage V16. The reading operation 1CR is a process of determining whether or not the threshold voltage of the memory cell transistor MT is lower than the voltage V1C. The reading operation 1ER is a process of determining whether or not the threshold voltage of the memory cell transistor MT is lower than the voltage V1E.

The top page may be read by using, as read voltages, the voltage V7 that distinguishes the "6" state from the "7" state, the voltage V9 that distinguishes the "8" state from the "9" state, the voltage VB that distinguishes the "A" state from the "B" state, the voltage V13 that distinguishes the "12" state from the "13" state, the voltage V19 that distinguishes the "18" state from the "19" state, and the voltage V1F that distinguishes the "1E" state from the "1F" state. The reading operations using voltages V7, V9, VB, V13, V19, and V1F will be referred to as reading operations 7R, 9R, BR, 13R, 19R, and 1FR, respectively.

The reading operation 7R is a process of determining whether or not the threshold voltage of the memory cell transistor MT is lower than the voltage V7. The reading operation 9R is a process of determining whether or not the threshold voltage of the memory cell transistor MT is lower than the voltage V9. The reading operation BR is a process of determining whether or not the threshold voltage of the memory cell transistor MT is lower than the voltage VB. The reading operation 13R is a process of determining whether or not the threshold voltage of the memory cell transistor MT is lower than the voltage V13. The reading operation 19R is a process of determining whether or not the threshold voltage of the memory cell transistor MT is lower than the voltage V19. The reading operation 1FR is a process of determining whether or not the threshold voltage of the memory cell transistor MT is lower than the voltage V1F (whether or not the held data is "1F").

1.2 Reading Operation

Now, a method for reading data in the NAND flash memory 100 according to the present embodiment will be described.

1.2.1 First Example

Figure 4:
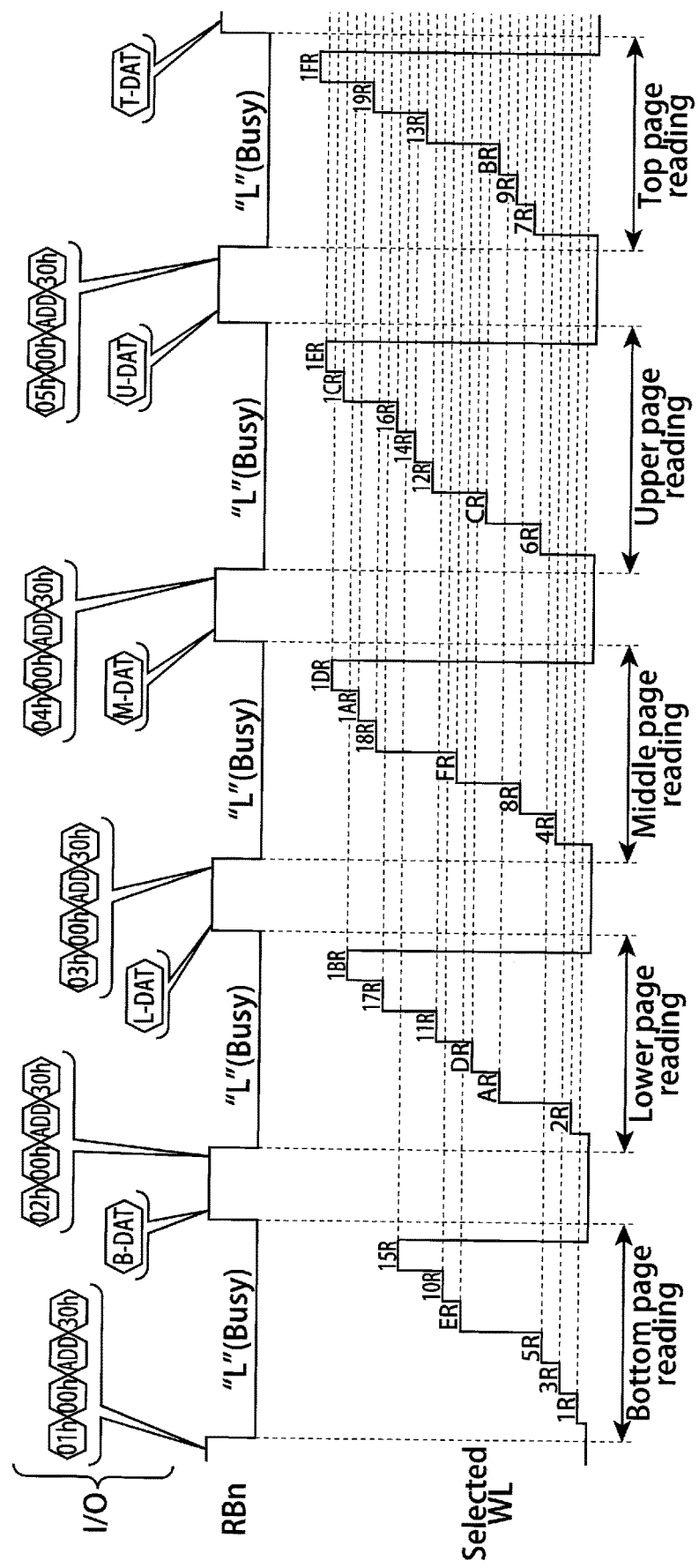
FIG. 4 and FIG. 5 are timing charts of various signals during a reading operation according to the first embodiment.

First, a first example of the reading method will be described. The first example is an example where the controller 200 issues a read command for each page. This method is referred to as page-by-page reading. FIG. 4 is a timing chart illustrating the I/O signal I/O, the ready/busy signal RBn, and the selected word line voltage during a reading operation in the present example.

As depicted in FIG. 4, the controller 200 issues and transmits commands "01h" and "00h" to the NAND flash memory 100. The command "01h" declares to the NAND flash memory 100 that the bottom page is to be accessed. The command "00h" declares that an address is to be input. The commands are stored in, for example, the command register 160 in the NAND flash memory 100.

Subsequently, the controller 200 issues the address ADD of an area to be accessed, further issues a command "30h", and transmits the address and the command to the NAND flash memory 100. The address ADD is stored in, for example, the address register 150, and the command "30h" is stored in the command register 160. The command "30h" is a command to cause the NAND flash memory 100 to perform a reading operation. FIG. 4 illustrates that the address ADD is transmitted during one cycle. However, for the NAND interface, the address is transmitted, for example, over five cycles: first two cycles transmit column addresses, and the subsequent three cycles transmit row addresses (page addresses). Instead of representing the access target page as "01h" or the like, page information may be included in a part of the address ADD transmitted over a plurality of cycles.

Therefore, in response to the command "30h" in the command register 160, the sequencer 170 in the NAND flash memory 100 starts an operation of reading bottom page corresponding to the page address held in the address register 150 and is set to the busy state.

In the NAND flash memory 100, the sense amplifier 140 precharges the bit line BL to a predetermined potential. Moreover, the row decoder 120 selects the word line WL corresponding to the address received from the controller 200. Then, the driver circuit 130 applies the voltage VREAD to the unselected word lines WL, while applying a read voltage VCGRV to the selected word line WL. The read voltage VCGRV corresponds to the read level described with reference to FIG. 3. As depicted in FIG. 4, during reading of the bottom page, voltages V1, V3, V5, VE, V10, and V15 are sequentially applied to the selected word line WL to perform the reading operations 1R, 3R, 5R, ER, 10R, and 15R.

For example, data read during the reading operation 1R is stored in the latch circuit EDL. Subsequently, the arithmetic operation section OP performs a logical operation on data read during the reading operation 3R and data in the latch circuit EDL, and the logical operation result is stored in the latch circuit EDL. Furthermore, the arithmetic operation section OP performs a logical operation on data read during the reading operation 5R and data in the latch circuit EDL, and the logical operation result is stored in the latch circuit EDL. The operation is also performed for the reading operations ER, 10R, and 15R, and the result is established as bottom page data B-DAT. Therefore, the data B-DAT in the latch circuit EDL is transferred to the latch circuit XDL, and the NAND flash memory 100 is set to the ready state.

In response to the setting of the NAND flash memory 100 to the ready state, the controller 200 toggles the signal REn. Then, in synchronism with the signal REn, the data B-DAT in the latch circuit XDL is transmitted to the controller 200.

When the lower page is read, the command "02h" I s issued instead of the command "01h" as depicted in FIG. 4. The command "02h" declares to the NAND flash memory 100 that the lower page is to be accessed. Subsequent operations are substantially similar to the corresponding operations for the bottom page. Differences are that the voltages V2, VA, VD, V11, V17, and V1B are used as read voltages, and that a latch circuit DDL is used. Lower page data L-DAT stored in the DDL is transferred to the XDL and then transmitted to the controller 200.

When the middle page data is read, the command "03h" is issued which declares to the NAND flash memory 100 that the middle page is to be accessed. Subsequent operations are substantially similar to the corresponding operations for the bottom page and the lower page. Differences are that the voltages V4, V8, VF, V18, V1A, and V1D are used as read voltages, and that a latch circuit CDL is used. Middle page data M-DAT stored in the CDL is transferred to the XDL and then transmitted to the controller 200.

When the upper page data is read, the command "04h" is issued which declares to the NAND flash memory 100 that the upper page is to be accessed. The voltages V6, VC, V12, V14, V16, V1C, and V1E are used as read voltages, and upper page data is established by seven reading operations. In the sense amplifier 140, the latch circuit BDL holds the upper page data. Upper page data U-DAT stored in the BDL is transferred to the XDL and then transmitted to the controller 200.

When the top page data is read, the command "05h" is issued which declares to the NAND flash memory 100 that the top page is to be accessed. The voltages V7, V9, VB, V13, V19, and VF are used as read voltages, and top page data is established by six reading operations. In the sense amplifier 140, a latch circuit ADL holds the top page data. Top page data T-DAT stored in the ADL is transferred to the XDL and then transmitted to the controller 200.

1.2.2 Second Example

Figure 5:
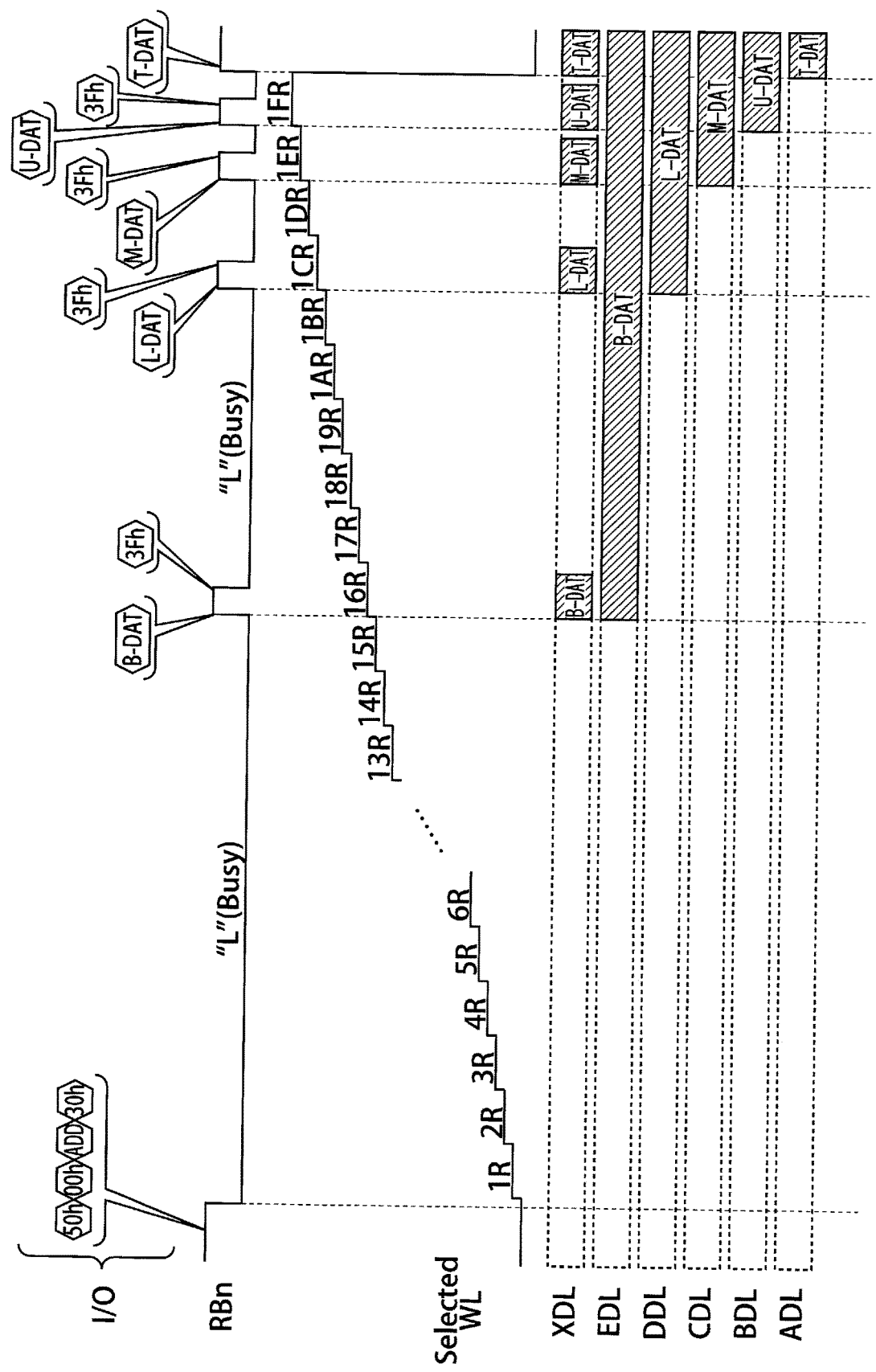

Now, a second example of the reading method will be described. The second example is not an example of page-by-page reading but is an example of a method in which the reading operations 1R to 1FR are sequentially performed by a single command input. This method is referred to as sequential reading. FIG. 5 is a timing chart illustrating the I/O signal I/O, the ready/busy signal RBn, the selected word line voltage, and the data held in the latch circuits ADL, BDL, CDL, DDL, EDL, and XDL during the reading operation according to the present example. Only differences from the first example will be described below.

As depicted in FIG. 5, the controller 200 sequentially issues commands "50h" and "00h", the address ADD, and a command "30h". The command "50h" is a prefix command that allows sequential reading to be performed. The command "30h" instructs the NAND flash memory 100 to perform reading.

In response to the command "30h", the NAND flash memory 100 is set to the busy state. A difference from the first example is that the voltage of the selected word line WL is sequentially stepped up to V1, V2, V3, . . . VF, V10, V11, . . . V1F. Then, at timings when the voltages are applied, the respective reading operations 1R, 2R, 3R, . . . FR, 10R, 11R, . . . 1FR are performed.

The data read during the reading operation 1R relates to the bottom page and thus stored in the latch circuit EDL. The data read during the reading operation 2R relates to the lower page and thus stored in the latch circuit DDL. Then, the data read during the reading operation 3R relates to the bottom page, and the arithmetic operation section OP performs a logical operation on this data and the data already held in the EDL. The result is held in the EDL. Subsequently, similar operations are performed.

Then, when the reading operation 15R is completed, the final bottom page data B-DAT is stored in the latch circuit EDL (the bottom page data is established by the 1R, the 3R, the 5R, the ER, the 10R, and the 15R). The data B-DAT is transferred to the latch circuit XDL. The NAND flash memory 100 is set to the ready state, and the controller 200 can read the data B-DAT from the NAND flash memory 100 by toggling the signal REn. Then, the controller 200 issues a command "3Fh" in order to read the lower page data. As a result, the NAND flash memory 100 is set to the busy state.

When the reading operation 1BR is completed, the final lower page data L-DAT is stored in the latch circuit DDL (the lower page data is established by the 2R, the AR, the DR, the 11R, the 17R, and the 1BR). The data L-DAT is transferred to the latch circuit XDL. Therefore, at this time, the controller 200 can read the data L-DAT from the NAND flash memory 100.

Subsequently, similarly, the middle page data is established when the reading operation 1DR is completed, the upper page data is established when the reading operation 1ER is completed, and the top page data is established when the reading operation 1FR is completed. Then, when the established data is transferred to the XDL, the controller 200 can read the data from the NAND flash memory 100.

1.3 Advantageous Effects According to Present Embodiment

In the configuration according to the present embodiment, the NAND flash memory that can hold 5-bit data (32-level data) establishes the bottom page data, the lower page data, the middle page data, and the top page data by six reading operations and establishes the upper page data by seven reading operations. The method of establishing four page by six reading operations and one page by seven reading operations is hereinafter referred to as "6-6-6-6-7 mapping". The 6-6-6-6-7 mapping allows the number of reading operations needed to establish the data to be averaged among the pages. Thus, the reliabilities of data of the respective pages can be uniformed, and the reliability of reading operations can be improved.

In the page-by-page reading of this embodiment described above, the bottom page, the lower page, the middle page, the upper page, and the top page are sequentially read in this order by way of example. However, the embodiment is not limited to this order, and the order of page reading may be changed. This also applies to descriptions of a second embodiment and subsequent embodiments. Furthermore, the bit sequences of the bottom page, the lower page, the middle page, the upper page, and the top page as described with reference to FIG. 3 may be changed to one another. For example, in FIG. 3, the bit sequence of the middle page may be changed to the bit sequence of the upper page. This also applies to descriptions of the second embodiment and subsequent embodiments.

2. Second Embodiment

Now, a semiconductor memory device according to a second embodiment will be described. The present embodiment relates to 5-5-7-7-7 mapping, which differs from the first embodiment. Only differences from the first embodiment will be described below.

Figure 6:
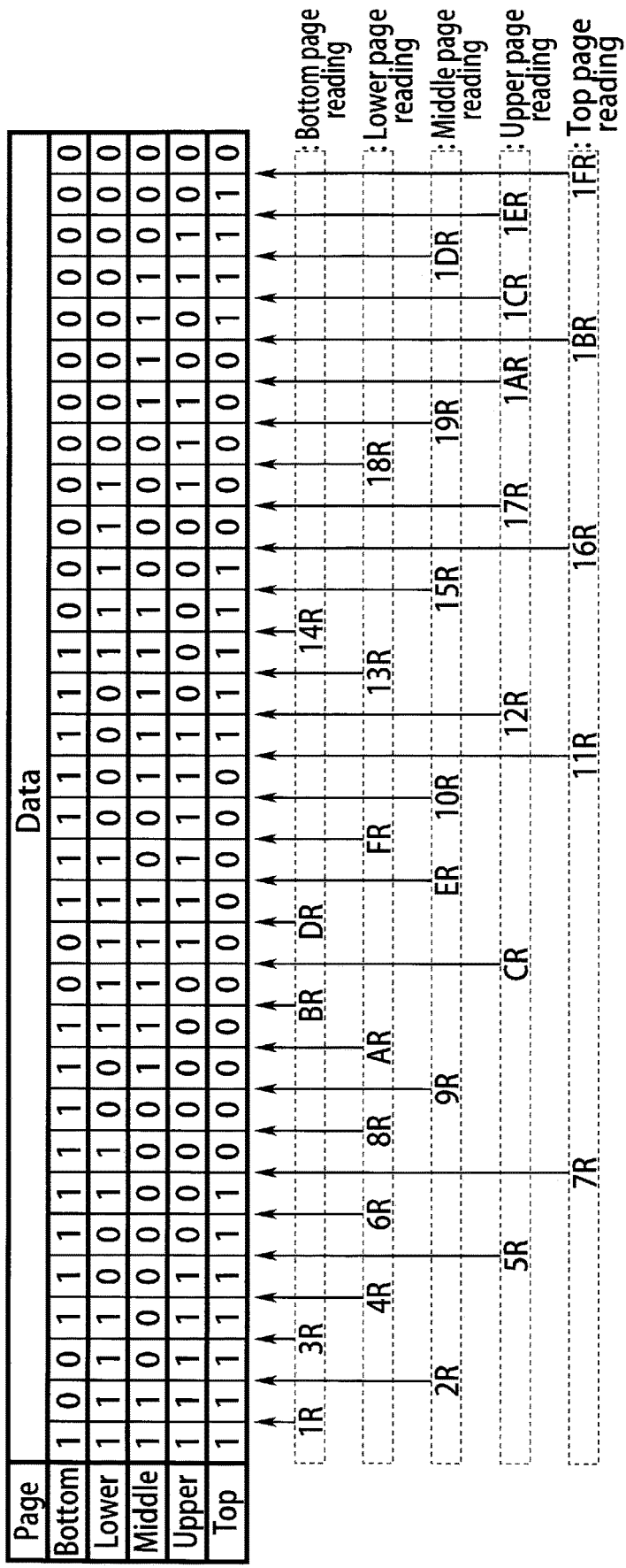
FIG. 6 is a diagram illustrating possible data and read voltages for memory cells according to a second embodiment.

2.1 Relationship Between Held Data and Read Voltages for Memory Cell Transistor FIG. 6 is a diagram illustrating possible data and read voltages for memory cell transistors according to the second embodiment, and corresponds to FIG. 3 described for the first embodiment (distribution of thresholds is not depicted).

In the present embodiment, the relationship between the "0" to "1F" states that may be assumed by the memory cell transistors and the bottom bit, the lower bit, the middle bit, the upper bit, and the top bit are as follows. "0" state: "11111" (represented in the order of "top/upper/middle/lower/bottom")
"1" state: "11110"
"2" state: "11010"
"3" state: "11011"
"4" state: "11001"
"5" state: "10001"
"6" state: "10011"
"7" state: "00011"
"8" state: "00001"
"9" state: "00101"
"A" state: "00111"
"B" state: "00110"
"C" state: "01110"
"D" state: "01111"
"E" state: "01011"
"F" state: "01001"
"10" state: "01101"
"11" state: "11101"
"12" state: "10101"
"13" state: "10111"
"14" state: "10110"
"15" state: "10010"
"16" state: "00010"
"17" state: "01010"
"18" state: "01000"
"19" state: "01100"
"1A" state: "00100"
"1B" state: "10100"
"1C" state: "11100"
"1D" state: "11000"
"1E" state: "10000"
"1F" state: "00000"

In the mapping of this embodiment, the bottom page is read using the voltages V1, V3, VB, VD and V14. The lower page is read using the voltages V4, V6, V8, VA, VF, V13 and V18. The middle page is read using the voltages V2, V9, VE, V10, V15, V19, and V1D. The upper page is read using the voltages V5, VC, V12, V17, V1A, V1C, and V1E. The top page is read using the voltages V7, V11, V16, V1B, and V1F.

2.2 Reading Operation

Now, a method for reading data in the NAND flash memory 100 according to the present embodiment will be described.

Page-by-Page Reading

Figure 7:
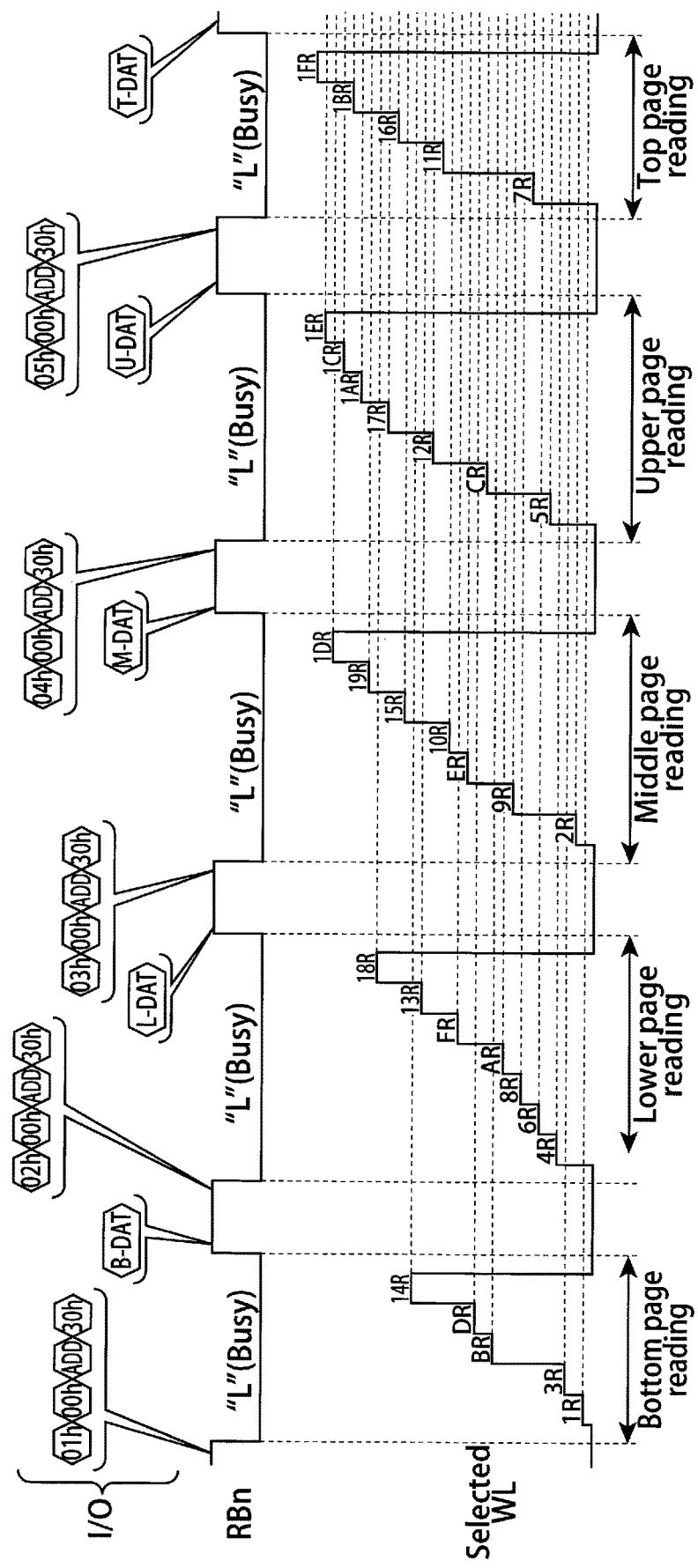
FIG. 7 and FIG. 8 are timing charts of various signals during a reading operation according to the second embodiment.

First, a case of page-by-page reading will be described using FIG. 7. FIG. 7 is a timing chart illustrating the I/O signal I/O, the ready/busy signal RBn, and the selected word line voltage during a reading operation in the present example.

As depicted in FIG. 7, during reading of the bottom page, voltages V1, V3, VB, VD, and V14 are sequentially applied to the selected word line WL to perform the reading operations 1R, 3R, BR, DR, and 14R. Bottom page data B-DAT is established by the five reading operations.

During reading of the lower page, voltages V4, V6, V8, VA, VF, V13, and V18 are sequentially applied to the selected word line WL to perform the reading operations 4R, 6R, 8R, VR, FR, 13R, and 18R. Lower page data L-DAT is established by the seven reading operations.

During reading of the middle page, voltages V2, V9, VE, V10, V15, V19, and ViD are sequentially applied to the selected word line WL to perform the reading operations 2R, 9R, ER, 10R, 15R, 19R and 1DR. Middle page data M-DAT is established by the seven reading operations.

During reading of the upper page, voltages V5, VC, V12, V17, V1A, V1C, and V1E are sequentially applied to the selected word line WL to perform the reading operations 5R, CR, 12R, 17R, 1AR, 1CR, and 1ER. Upper page data U-DAT is established by the seven reading operations.

During reading of the top page, voltages V7, V11, V16, V1B, and V1F are sequentially applied to the selected word line WL to perform the reading operations 7R, 11R, 16R, 1BR, and 1FR. Top page data T-DAT is established by the five reading operations.

<Sequential Reading>

Figure 8:
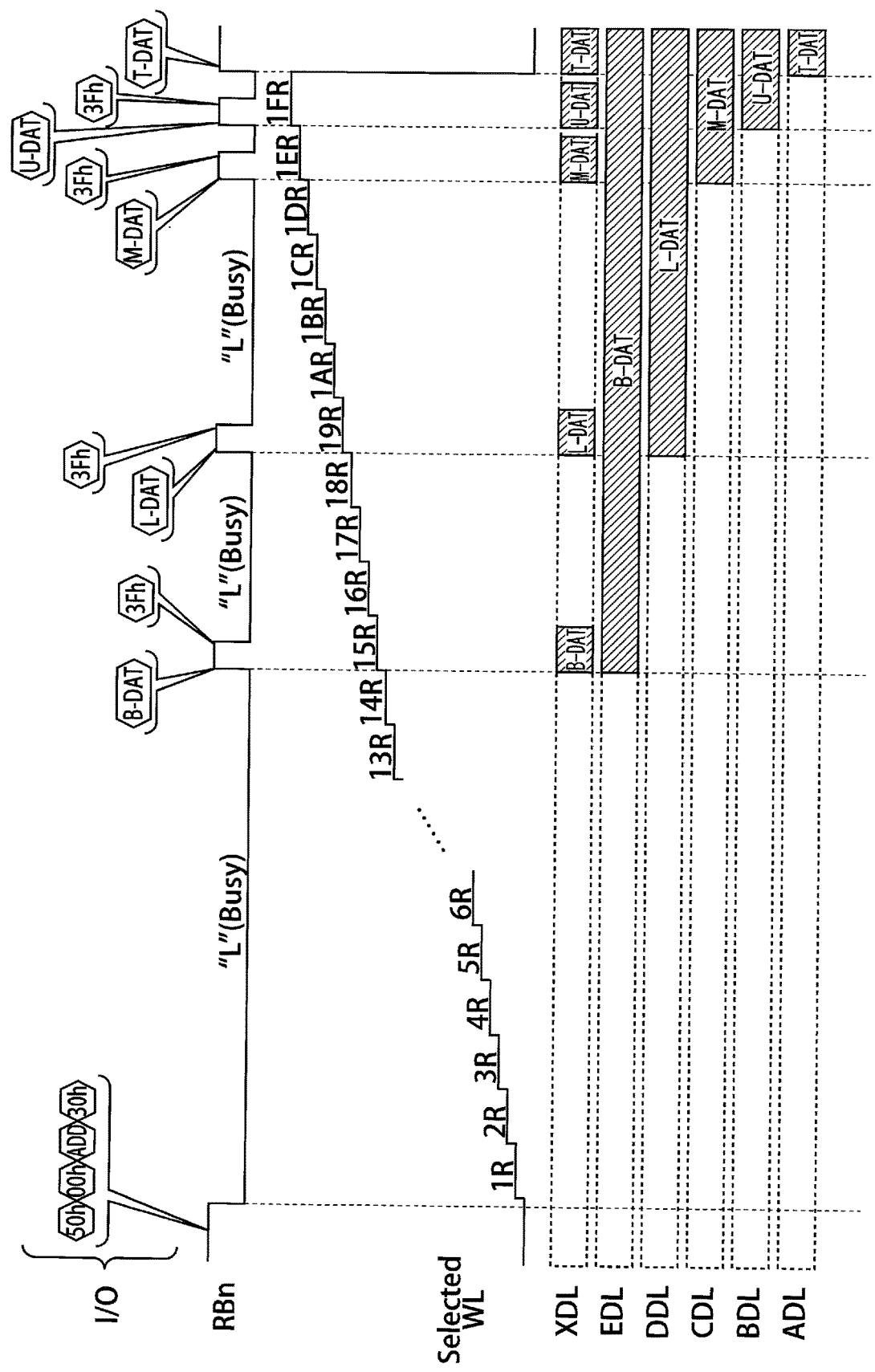

Now, a case of sequential reading will be described using FIG. 8. FIG. 8 is a timing chart illustrating the I/O signal I/O, the ready/busy signal RBn, the selected word line voltage, and the data in the latch circuits ADL, BDL, CDL, DDL, EDL, and XDL operate during the reading operation according to the present example.

As depicted in FIG. 8, a difference from FIG. 5 described in the first embodiment is that the bottom page data B-DAT is established when the reading operation 14R is completed, and the lower page data L-DAT is established when the reading operation 18R is completed.

2.3 Advantageous Effects According to Present Embodiment

According to the present embodiment, even if the rate of occurrence of errors differs between data to be read, the rates of occurrence of errors of the respective pages can be uniformed, and the reliability of reading operations can be improved.

Specifically, in the present embodiment, the reading operations 1R and 1FR are performed in different page reading operations. The reading operation 1R specifies a memory cell transistor in an erase state. The reading operation 1FR specifies a memory cell transistor having the highest threshold. Among the 32 distributed thresholds, the memory cell transistor of the erase state is more likely to be affected by disturbance from the environment and to suffer varying threshold than those in the other states. More specifically, the threshold may rise to be the "1" state or "2" state. Thus, in the reading operation 1R, the rate of occurrence of errors is higher than those in the other reading operations. Contrarily, in the "1F" state, the threshold is likely to lower. For example, when some time has elapsed since the data was written, the threshold may drop from the "1F" state to the "1E" state or the "1D" state. Therefore, in the reading operation 1FR also, the rate of occurrence of errors is higher than those in the other reading operations.

According to the present embodiment, the NAND flash memory, in which each memory cell can hold 5-bit data, establishes each of the bottom page data and the top page data by five reading operations and establishes the other page data by seven reading operations. Such a method is referred to as "5-5-7-7-7 mapping" in this specification.

In the "5-5-7-7-7 mapping" of this embodiment, the reading operations 1R and 1FR are respectively assigned to the bottom page and the top page, for which the data is established by the five reading operations. Thus, the number of reading operations for the bottom page and the top page (five) is less than those for the other pages (seven), while the operations 1R and 1FR with a relatively high rate of occurrence of errors are assigned to the bottom page and the top page. Therefore, even if the rate of occurrence of errors is high in the reading operations 1R and 1FR, the rates of occurrence of errors of the pages can be uniformed, and the reliability of reading operations can be improved, as in the case of first embodiment.

3. Third Embodiment

A semiconductor memory device according to a third embodiment will now be described. The present embodiment relates to 4-6-7-7-7 mapping, which differs from the first and second embodiments. Only differences from the first and second embodiments will be described below.

Figure 9:
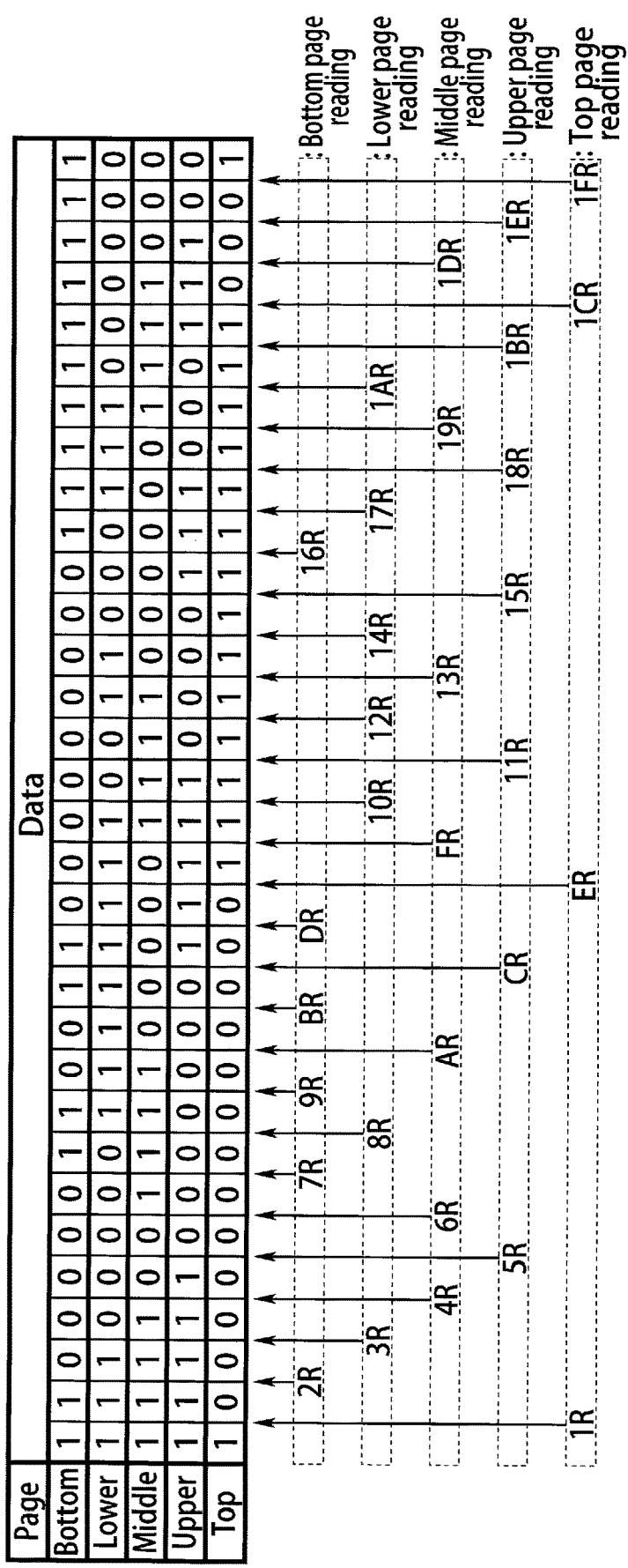
FIG. 9 is a diagram illustrating possible data and read voltages for memory cells according to a third embodiment.

3.1 Relationship Between Held Data and Read Levels for Memory Cell Transistor FIG. 9 is a diagram illustrating possible data and read voltages for memory cell transistors according to the third embodiment, and corresponds to FIG. 3 described for the first embodiment (distribution of thresholds is not depicted).

In the present embodiment, the relationship between the "0" to "1F" states that may be assumed by the memory cell transistors and the bottom bit, the lower bit, the middle bit, the upper bit, and the top bit are as follows. "0" state: "11111" (represented in the order of "top/upper/middle/lower/bottom")
"1" state: "01111"
"2" state: "01110"
"3" state: "01100"
"4" state: "01000"
"5" state: "00000"
"6" state: "00100"
"7" state: "00101"
"8" state: "00111"
"9" state: "00110"
"A" state: "00010"
"B" state: "00011"
"C" state: "01011"
"D" state: "01010"
"E" state: "11010"
"F" state: "11110"
"10" state: "11100"
"11" state: "10100"
"12" state: "10110"
"13" state: "10010"
"14" state: "10000"
"15" state: "11000"
"16" state: "11001"
"17" state: "11011"
"18" state: "10011"
"19" state: "10111"
"1A" state: "10101"
"1B" state: "11101"
"1C" state: "01101"
"1D" state: "01001"
"1E" state: "00001"
"1F" state: "10001"

In the mapping of this embodiment, the bottom page is read using the voltages V2, V7, V9, VB, VD and V16. The lower page is read using the voltages V3, V8, V10, V12, V14, V17, and V1A. The middle page is read using the voltages V4, V6, VA, VF, V13, V19, and V1D. The upper page is read using the voltages V5, VC, V11, V15, V18, V1B and V1E. The top page is read using the voltages V1, VE, V1C, and V1F.

3.2 Reading Operation

Now, a method for reading data in the NAND flash memory 100 according to the present embodiment will be described.

<Page-by-Page Reading>

Figure 10:
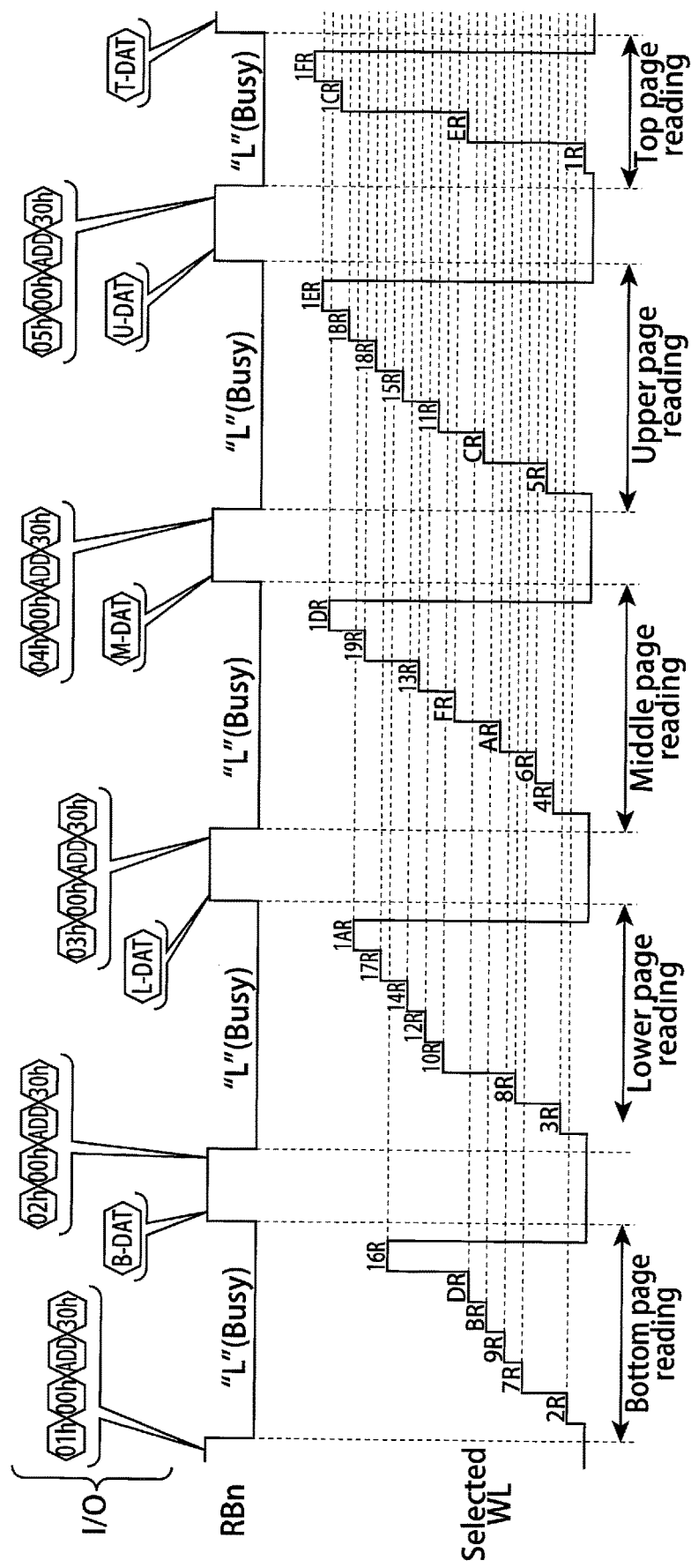
FIG. 10 and FIG. 11 are timing charts of various signals during a reading operation according to the third embodiment.

First, a case of page-by-page reading will be described using FIG. 10. FIG. 10 is a timing chart illustrating the I/O signal I/O, the ready/busy signal RBn, and the selected word line voltage during a reading operation in the present example.

As depicted in FIG. 10, during reading of the bottom page, voltages V2, V7, V9, VB, VD, and V16 are sequentially applied to the selected word line WL to perform the reading operations 2R, 7R, 9R, BR, DR, and 16R. Bottom page data B-DAT is established by the six reading operations.

During reading of the lower page, voltages V3, V8, V10, V12, V14, V17, and VIA are sequentially applied to the selected word line WL to perform the reading operations 3R, 8R, 10R, 12R, 14R, 17R, and 1AR. Lower page data is established by the seven reading operations.

During reading of the middle page, voltages V4, V6, VA, VF, V13, V19, and V1D are sequentially applied to the selected word line WL to perform the reading operations 4R, 6R, AR, FR, 13R, 19R, and 1DR. Middle page data is established by the seven reading operations.

During reading of the upper page, voltages V5, VC, V11, V15, V18, V1B, and V1E are sequentially applied to the selected word line WL to perform the reading operations 5R, CR, 11R, 15R, 18R, 1BR, and 1ER. Upper page data is established by the seven reading operations.

During reading of the top page, voltages V1, VE, V1C, and V1F are sequentially applied to the selected word line WL to perform the reading operations 1R, ER, 1CR and 1FR. Top page data is established by the four reading operations.

<Sequential Reading>

Figure 11:
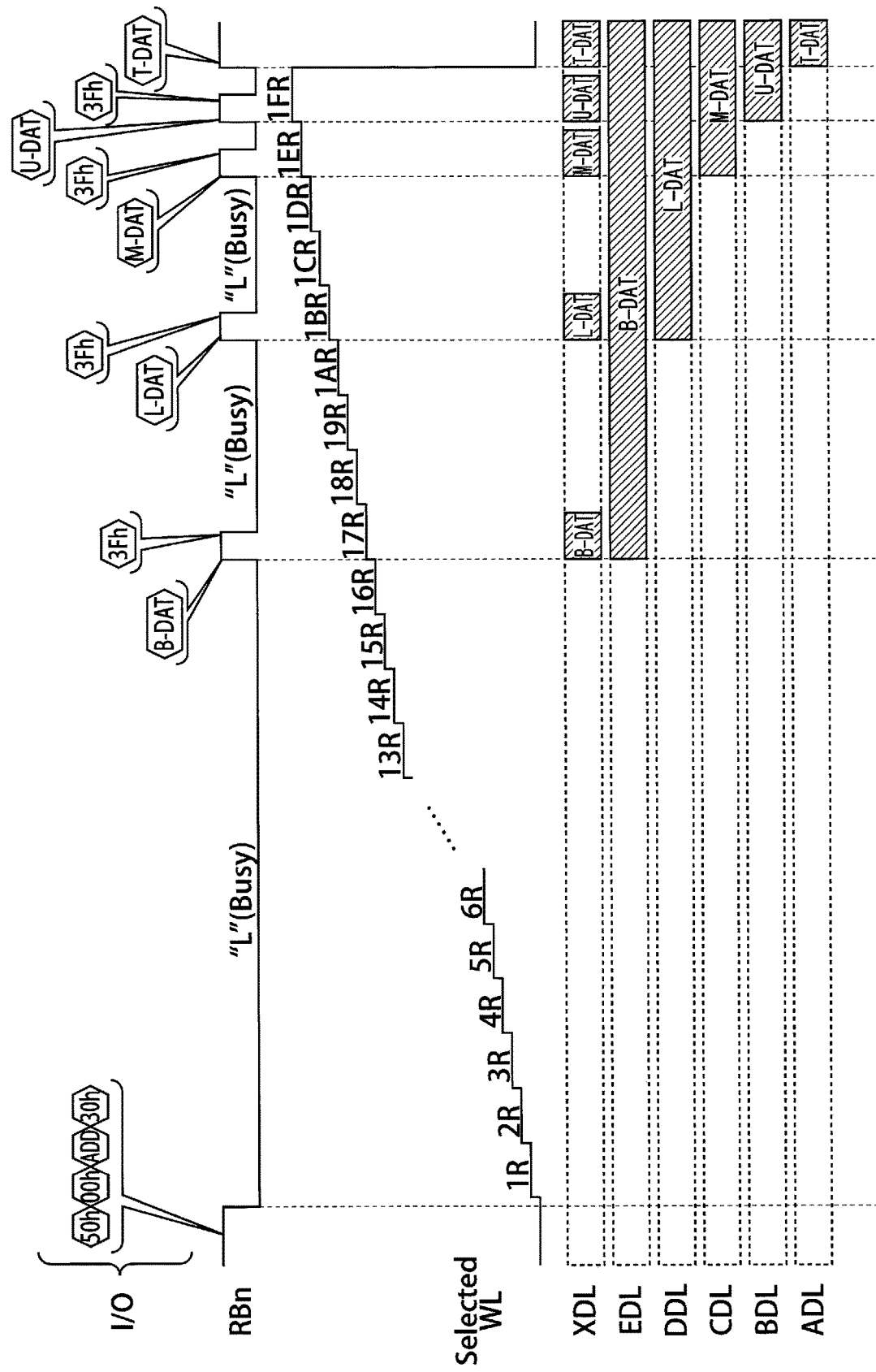

Now, a case of sequential reading will be described using FIG. 11. FIG. 11 is a timing chart illustrating the I/O signal I/O, the ready/busy signal RBn, the selected word line voltage, and the data in the latch circuits ADL, BDL, CDL, DDL, EDL, and XDL during the reading operation according to the present example.

As depicted in FIG. 11, a difference from FIG. 5 described in the first embodiment is that the bottom page data B-DAT is established when the reading operation 16R is completed, and the lower page data L-DAT is established when the reading operation 1AR is completed.

3.3 Advantageous Effects According to Present Embodiment

According to the embodiment, the top page data is established by the four reading operations, the bottom page data is established by the six reading operations, and the other page data are established by the seven reading operations. Such a method is referred to as "4-6-7-7-7 mapping" in this specification.

In the "4-6-7-7-7 mapping" of this embodiment, the reading operations 1R and 1FR are assigned to the top page, for which the data is established by the four reading operations. Thus, the number of reading operations for the bottom page and the top page (four) is less than those for the other pages (six and seven), while the operations 1R and 1FR with a relatively high rate of occurrence of errors are assigned to the top page. Therefore, even if the rate of occurrence of errors is high in the reading operations 1R and 1FR, the rates of occurrence of errors of the pages can be uniformed, and the reliability of reading operations can be improved, as in the case of first embodiment.

4. Fourth Embodiment

Now, a semiconductor memory device according to a fourth embodiment will be described. The present embodiment relates to 4-6-7-7-7 mapping that differs from the third embodiment. In the following description, only the matters different from the first and third embodiments will be described.

Figure 12:
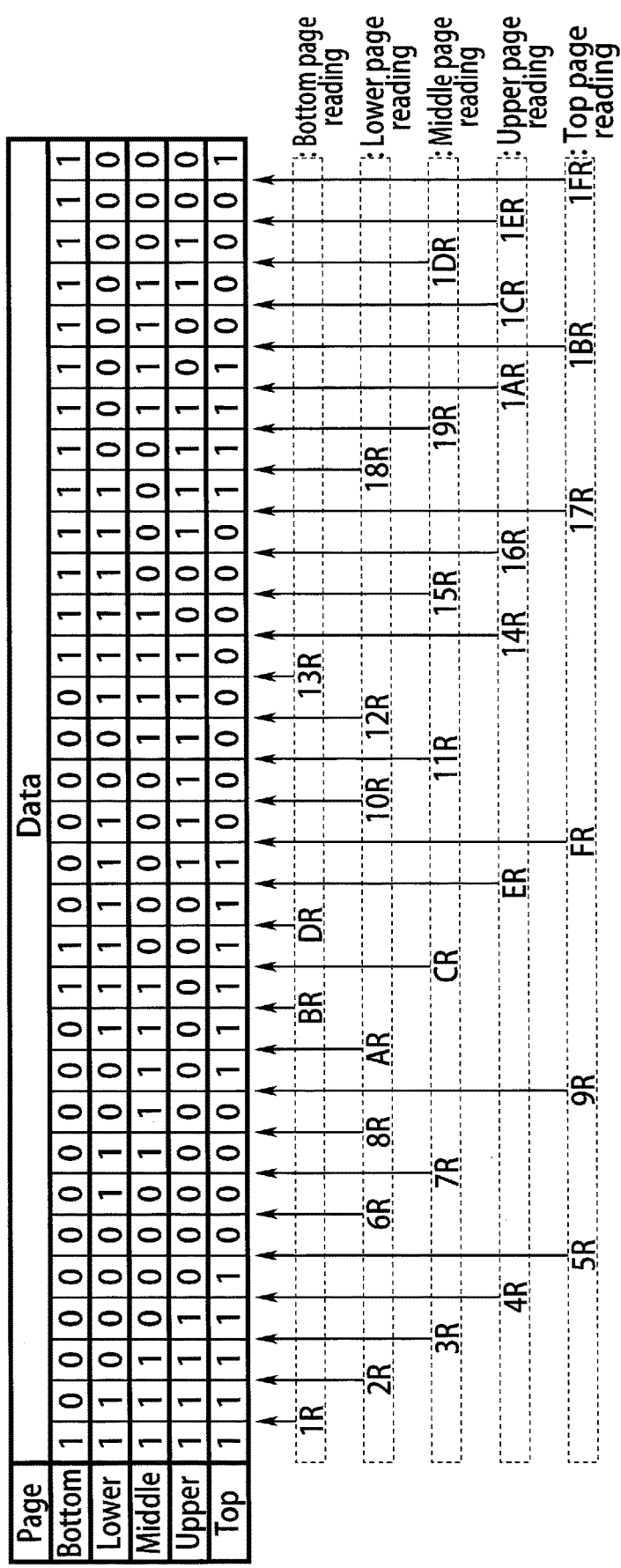
FIG. 12 is a diagram illustrating possible data and read voltages for memory cells according to a fourth embodiment.

4.1 Relationship Between Held Data and Read Levels for Memory Cell Transistor FIG. 12 is a diagram illustrating possible data and read voltages for memory cell transistors according to the fourth embodiment, and corresponds to FIG. 3 described for the first embodiment (distribution of thresholds is not depicted).

In the present embodiment, the relationship between the "0" to "1F" states that may be assumed by the memory cell transistors and the bottom bit, the lower bit, the middle bit, the upper bit, and the top bit are as follows.

"0" state: "11111" (represented in the order of "top/upper/middle/lower/bottom")
"1" state: "11110"
"2" state: "11100"
"3" state: "11000"
"4" state: "10000"
"5" state: "00000"
"6" state: "00010"
"7" state: "00110"
"8" state: "00100"
"9" state: "10100"
"A" state: "10110"
"B" state: "10111"
"C" state: "10011"
"D" state: "10010"
"E" state: "11010"
"F" state: "01010"
"10" state: "01000"
"11" state: "01100"
"12" state: "01110"
"13" state: "01111"
"14" state: "00111"
"15" state: "00011"
"16" state: "01011"
"17" state: "11011"
"18" state: "11001"
"19" state: "11101"
"1A" state: "10101"
"1B" state: "00101"
"1C" state: "01101"
"1D" state: "01001"
"1E" state: "00001"
"1F" state: "10001"

In the mapping of this embodiment, the bottom page is read using the voltages V1, VB, VD and V13. The lower page is read using the voltages V2, V6, V8, VA, V10, V12, and V18. The middle page is read using the voltages V3, V7, VC, V11, V15, V19, and V1D. The upper page is read using the voltages V4, VE, V14, V16, V1A, V1C and V1E. The top page is read using the voltages V5, V9, VF, V17, V1B, and V1F.

4.2 Reading Operation

Now, a method for reading data in the NAND flash memory 100 according to the present embodiment will be described.

<Page-by-Page Reading>

Figure 13:
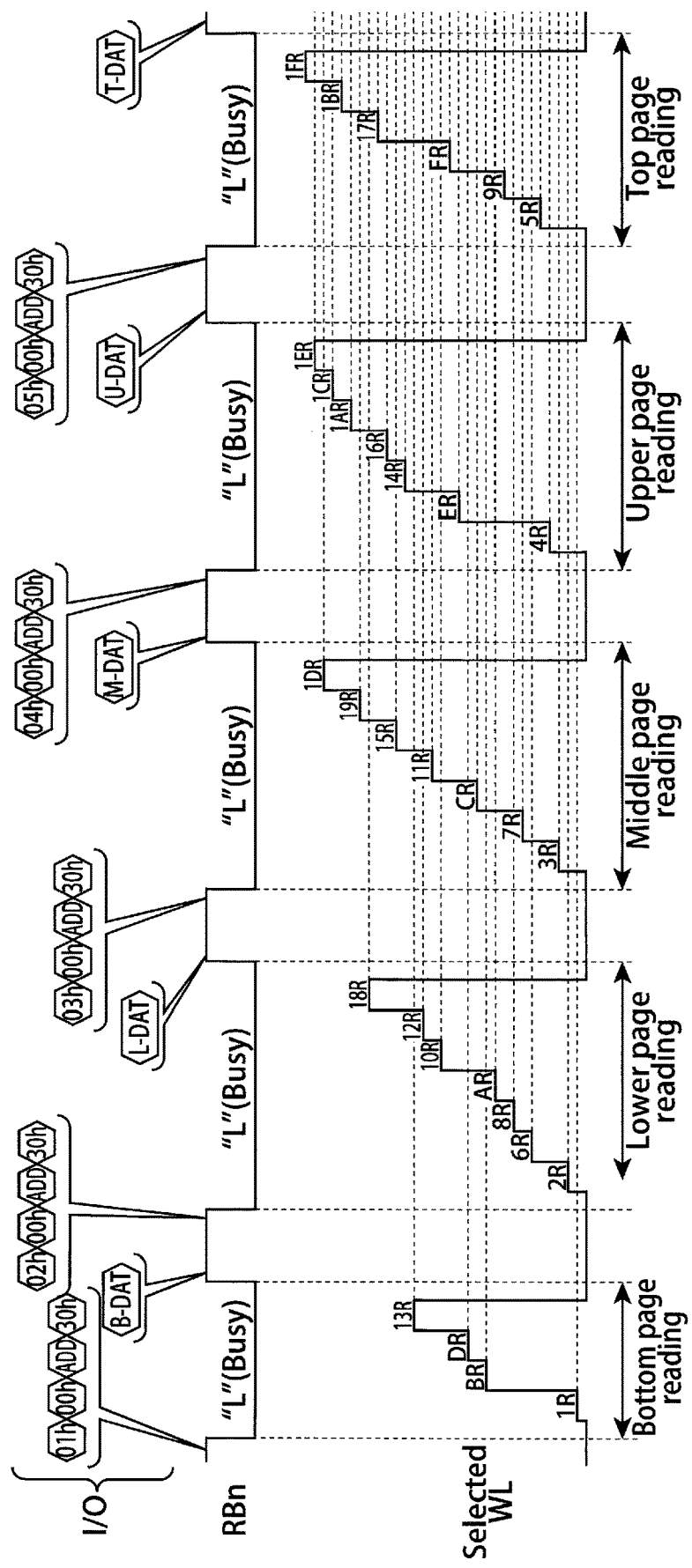
FIG. 13 and FIG. 14 are timing charts of various signals during a reading operation according to the fourth embodiment.

First, a case of page-by-page reading will be described using FIG. 13. FIG. 13 is a timing chart illustrating the I/O signal I/O, the ready/busy signal RBn, and the selected word line voltage during a reading operation in the present example.

As depicted in FIG. 13, during reading of the bottom page, voltages V1, VB, VD, and V13 are sequentially applied to the selected word line WL to perform the reading operations 1R, BR, DR, and 13R. Bottom page data B-DAT is established by the four reading operations.

During reading of the lower page, voltages V2, V6, V8, VA, V10, V12, and V18 are sequentially applied to the selected word line WL to perform the reading operations 2R, 6R, 8R, AR, 10R, 12R, and 18R. Lower page data is established by the seven reading operations.

During reading of the middle page, voltages V3, V7, VC, V11, V15, V19, and V1D are sequentially applied to the selected word line WL to perform the reading operations 3R, 7R, CR, 11R, 15R, 19R and 1DR. Middle page data is established by the seven reading operations.

During reading of the upper page, voltages V4, VE, V14, V16, V1A, V1C, and V1E are sequentially applied to the selected word line WL to perform the reading operations 4R, ER, 14R, 16R, 1AR, 1CR, and 1ER. Upper page data is established by the seven reading operations.

During reading of the top page, voltages V5, V9, VF, V17, V1B, and V1F are sequentially applied to the selected word line WL to perform the reading operations 5R, 9R, FR, 17R, 1BR, and 1FR. Top page data is established by the six reading operations.

<Sequential Reading>

Figure 14:
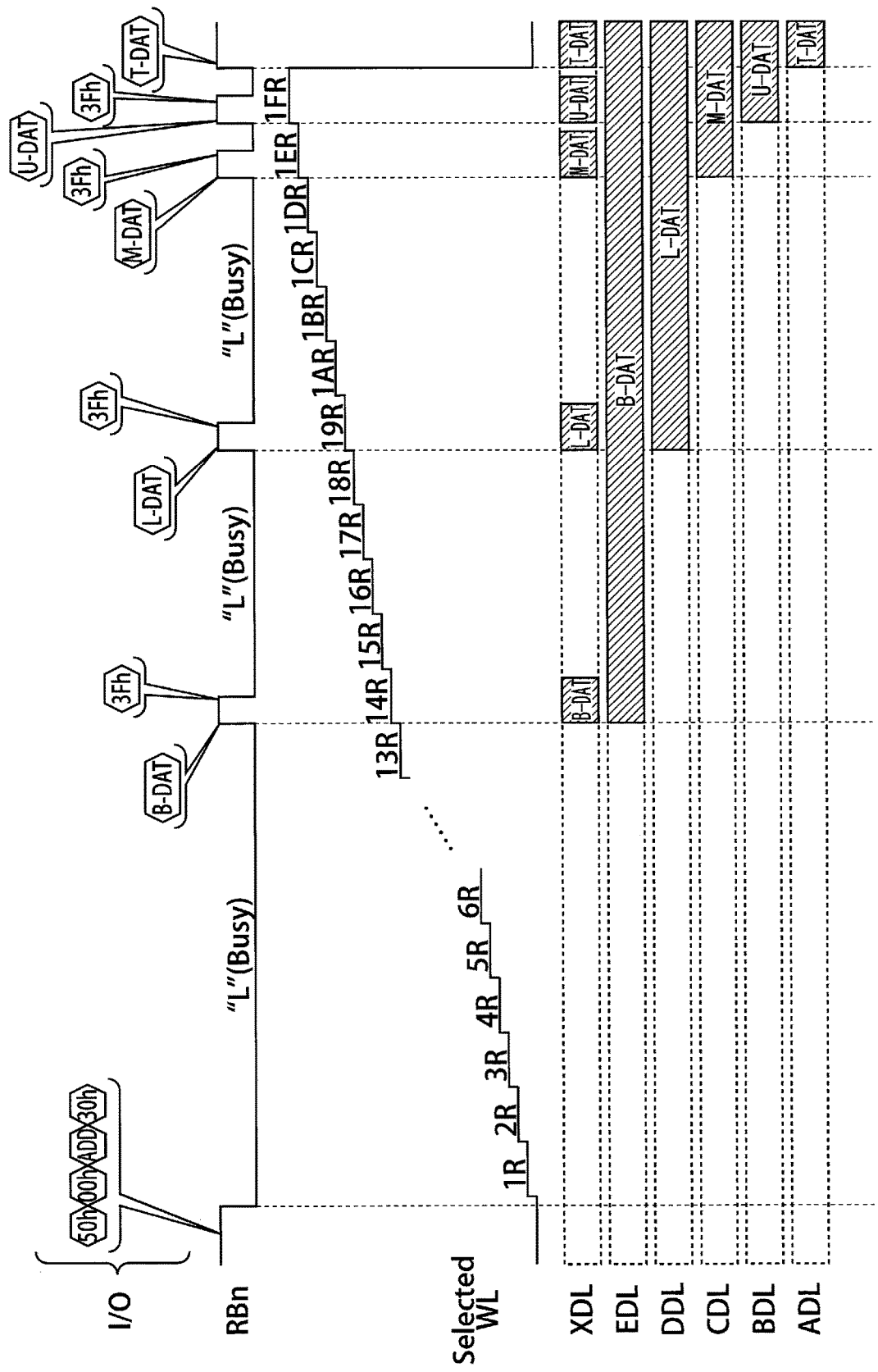

Now, a case of sequential reading will be described using FIG. 14. FIG. 14 is a timing chart illustrating the I/O signal I/O, the ready/busy signal RBn, the selected word line voltage, and the data in the latch circuits ADL, BDL, CDL, DDL, EDL, and XDL during the reading operation according to the present example.

As depicted in FIG. 14, a difference from FIG. 5 described in the first embodiment is that the bottom page data B-DAT is established when the reading operation 13R is completed.

4.3 Advantageous Effects According to Present Embodiment

In the "4-6-7-7-7 mapping" of this embodiment, the reading operations 1R is assigned to the bottom page and the top page, for which the data is established by the four reading operations, and the reading operation 1FR is assigned to the top page, for which the data is established by the six reading operations. This is because the error occurrence rate in the reading operation 1R may be higher than that in the reading operation 1FR. Thus, according to the present embodiment, even if the error occurrence rate is extremely high in the reading operation 1R, the error occurrence rate of the pages can be uniformed, and the reliability of reading operations can be improved, as in the case of first embodiment.

Moreover, in the present embodiment, the cache memory XDL can be quickly released. That is, in the mapping of the embodiment, the first page data is established during the reading operation 13R (the bottom page in the example of FIG. 12). Therefore, at this time, the NAND flash memory 100 can transmit data to the controller 200, enabling a reduction in read latency.

5. Fifth Embodiment

A semiconductor memory device according to a fifth embodiment will now be described. The present embodiment relates to a writing operation and a reading operation for the semiconductor memory device according to the first to fourth embodiments. In the following description, only the matters different from the first to fourth embodiments will be described.

5.1 Data Writing Operation

FIG. 15 is a flowchart showing a data writing operation according to the present embodiment. As depicted in FIG. 15, the host apparatus 300 first issues a write instruction for writing data in the NAND flash memory 100, and transmits the write instruction to the controller 200 together with write data (step S10).

The controller 200 causes, for example, the buffer memory 240 to store the data received from the host apparatus 300. Then, for example, the processor 230 divides the data in units of pages (step S20). The expression "divides the data" in this step does not necessarily mean that the data, which is a set of "0" and "1", is physically divided into a plurality of bit sequences, but may simply mean that bit sequences to be assigned to the respective pages of the NAND flash memory 100 are determined. Subsequently, an ECC circuit 260 of the controller 200 generates a parity based on the data divided in units of pages (step S21), and generates page data by adding the parity to the data (step S22). Next, for example, the processor 230 or the ECC circuit 260 scrambles the data by exchanging bits of pages among five pages (top, upper, middle, lower, and bottom pages) assigned to one word line WL, and (step S23). The processor 230 issues a write command and transmits it to the NAND flash memory 100 together with the scrambled data (step S24).

The NAND flash memory 100 that received the write command writes the scrambled data into the memory cells corresponding to a designated address in the memory cell array 110 (step S30). At this time, the NAND flash memory 100 writes the data in full sequence programming. The full sequence programming is a method of receiving data of the five pages and performing the programming based on the data, thereby changing the threshold of a memory transistor MT of the erase state directly to a targeted threshold. Thus, in the full sequence programming, a writing operation is performed by using a program verification voltage corresponding to the targeted threshold. However, the programming method is not limited to the full sequence programming, and 2-stage programming may be used depending on circumstances. In the 2-stage programming, an intermediate threshold between the threshold of the erase state and a targeted threshold is used as a first program verification voltage, and data is written using the first program verification voltage in first-stage programming. Thereafter, in second-stage programming, data is written using an actually targeted threshold as a second program verification voltage.

Figure 16:
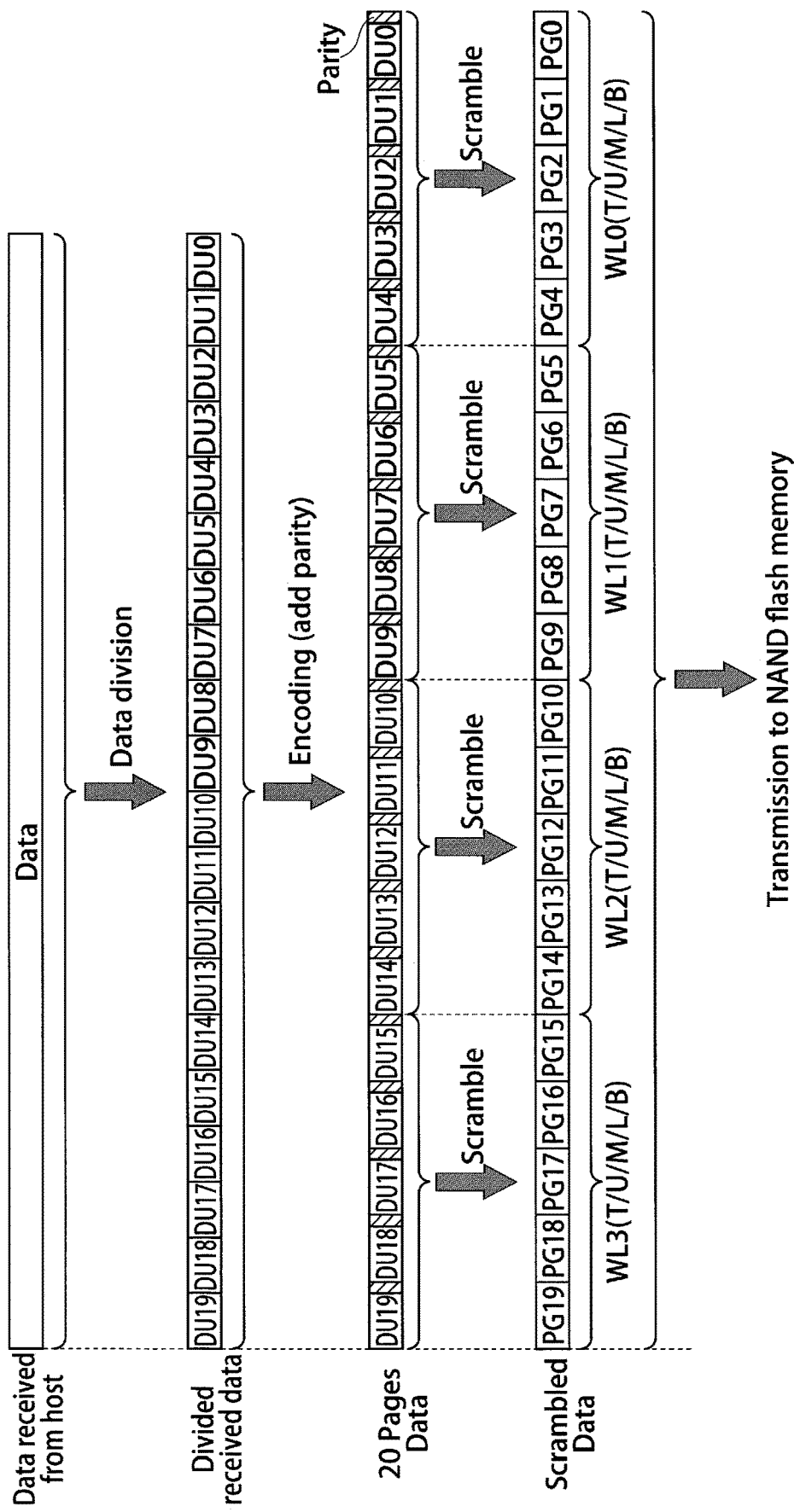
FIG. 16 is a conceptual diagram illustrating processes of a controller in the writing operation according to the fifth embodiment.
Figure 17:
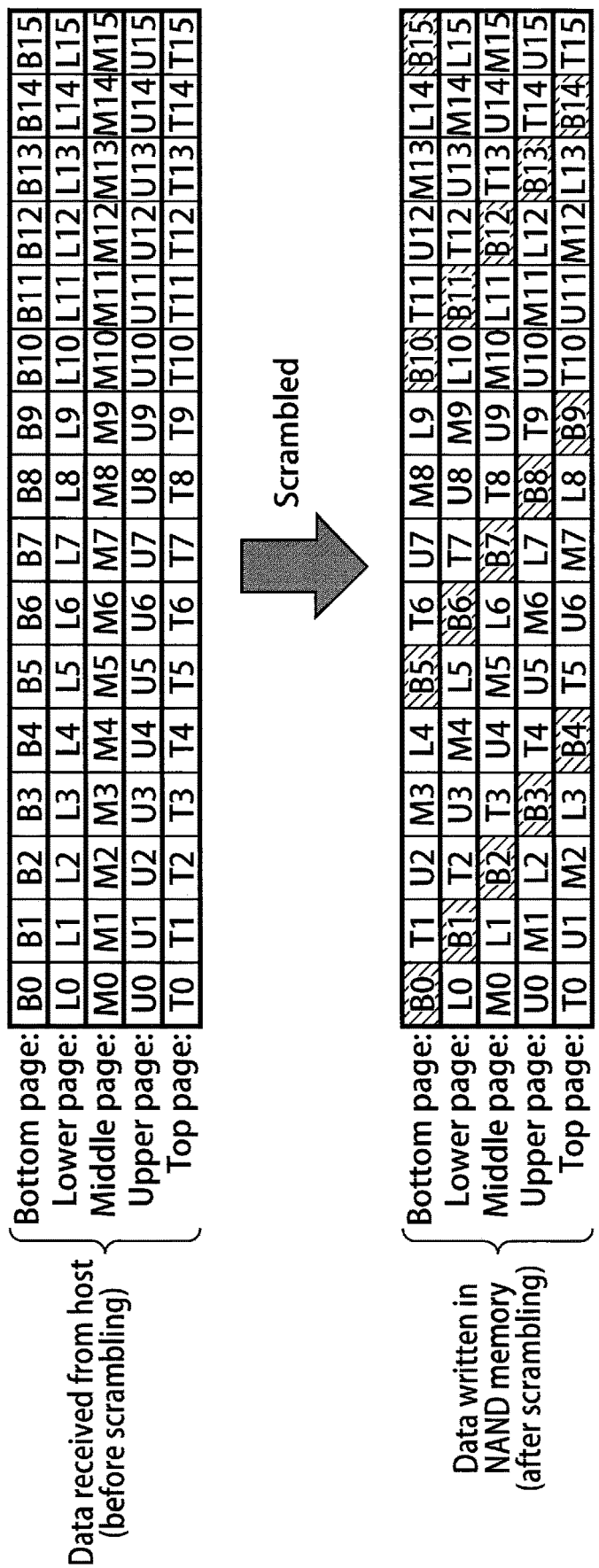
FIG. 17 is a conceptual diagram illustrating a data scramble method according to the fifth embodiment.
Figure 18:
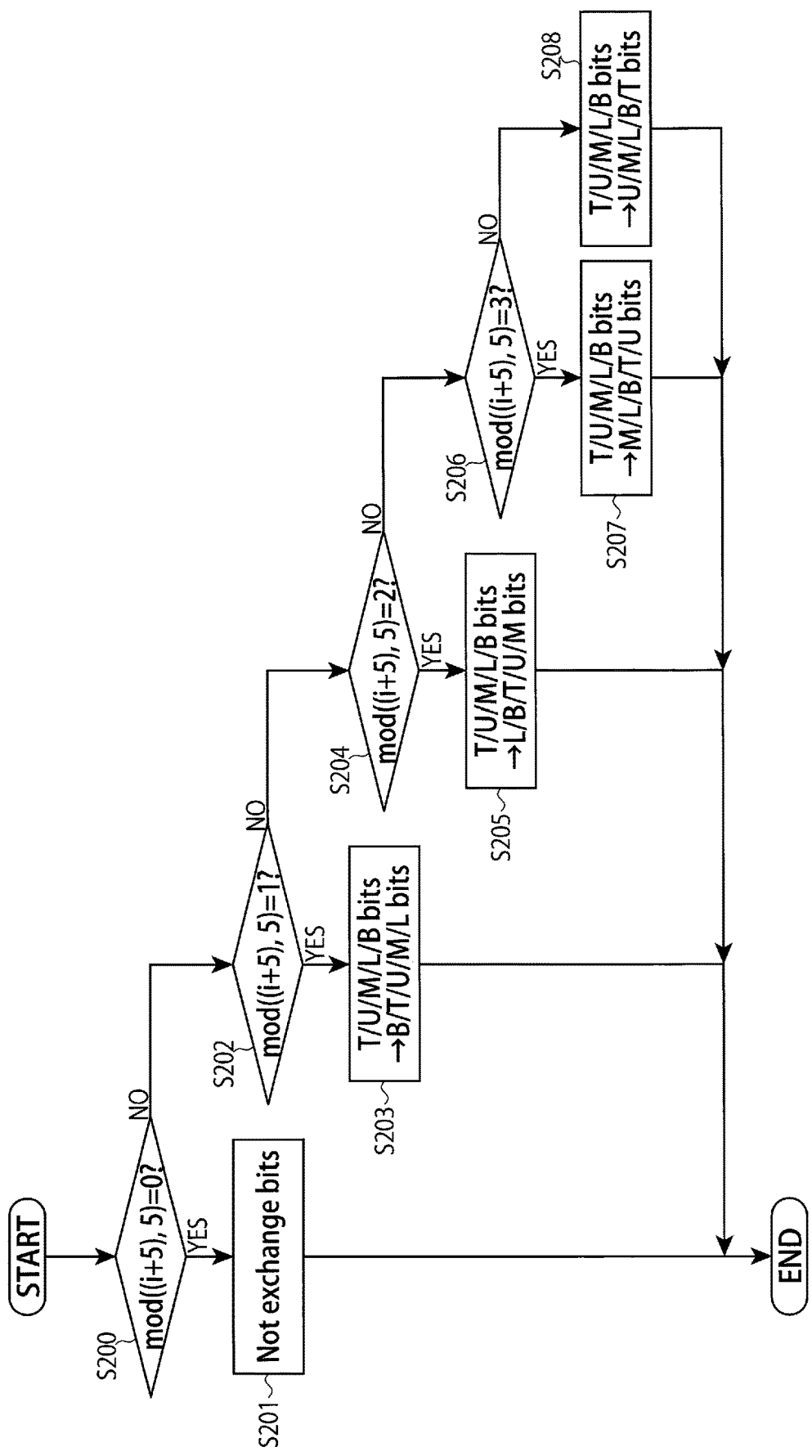
FIG. 18 is a flowchart illustrating the data scramble method according to the fifth embodiment.
Figure 19:
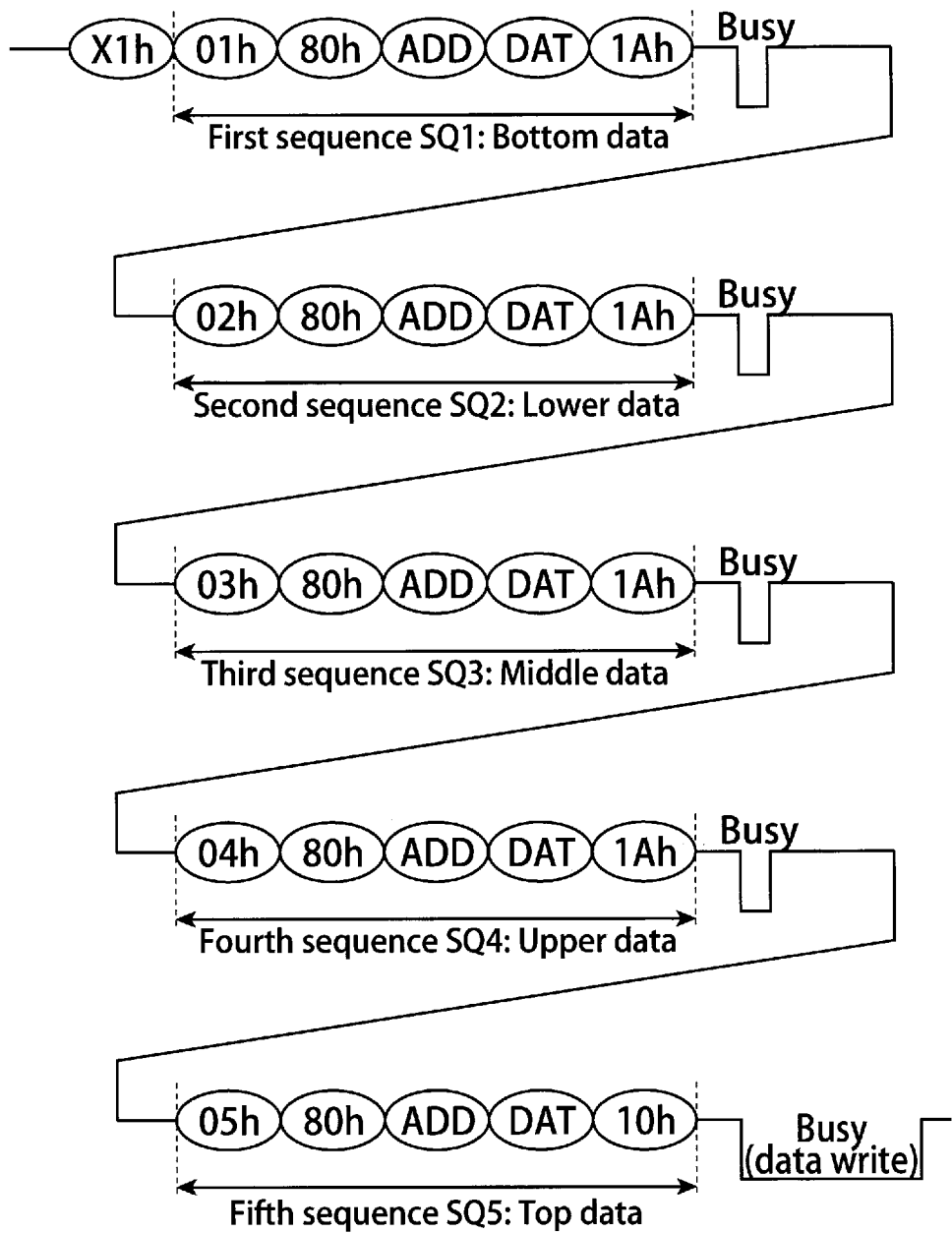
FIG. 19 is a schematic diagram illustrating write command sequences according to the fifth embodiment.

Data is written in the NAND flash memory 100 in the manner as described above. Details of the above operation will be described with reference to FIG. 16 to FIG. 19. FIG. 16 is a conceptual diagram roughly illustrating a flow of processing of the controller explained in FIG. 15. FIG. 17 is a conceptual diagram illustrating the data scramble method in step S23). FIG. 18 is a flowchart describing step S23. FIG. 19 is a schematic diagram showing command sequences issued in step S24.

It is assumed that the controller 200 receives write data corresponding to, for example, 20 pages, from the host apparatus 300, as shown in FIG. 16. The controller 200 divides the received data in units of pages as described in connection with step S20. In the example shown in FIG. 16, the divided data are respectively referred to as data units DU (DU0 to DU19). One data unit DU has a data size that is smaller than the page size. This is because write data for one page is generated by adding a parity to a data unit.

Then, as described above in connection with step S21, the ECC circuit 260 generates a parity for each of the data units DU, and applies the parity to the data unit DU. The parts represented by diagonal lines in FIG. 16 are parities. Then, as described above in connection with step S23, for example, the processor 230 or the ECC circuit 260 scrambles the data. In FIG. 16, for example, it is assumed that the data units DU0 to DU4 respectively correspond to the bottom, lower, middle, upper, and top pages of the word line WL0. In this case, the processor 230 or the ECC circuit 260 scrambles the data among data units DU0 to DU4. It also scrambles the parities in the same manner. Furthermore, it is assumed that data units DU5 to DU9 respectively correspond to the bottom, lower, middle, upper, and top pages of the word line WL1. In this case, the processor 230 or the ECC circuit 260 scrambles the data among the data units DU5 to DU9. Data are scrambled among data units DU10 to DU14 and among data units DU15 to DU19 in the same manner. As a result, the data units DU0 to DU4 and their parities are scrambled, and data PG0 to PG4 to be written in the respective pages of the word line WL0 are generated. Furthermore, the data units DU5 to DU9 and their parities are scrambled, and data PG5 to PG9 to be written in the respective pages of the word line WL1 are generated. Page data PG10 to PG14 to be written in the word line WL2 and page data PG15 to PG19 to be written in the word line WL3 are also generated in the same manner.

A specific example of the data scrambling in step S23 will be described with reference to FIG. 17. The upper part in FIG. 17 represents data before scrambling (data units DU and parities). For simplicity of explanation, a page having a size of 16 bits is illustrated as an example. Bits B0, B1, B2, . . . B15 included in the bottom page in the diagram correspond to, for example, the data unit DU0 and its parity in FIG. 16. Bits L0, L1, L2, . . . L15 included in the lower page correspond to the data unit DU1 and its parity. Bits M0, M1, M2, . . . M15 included in the middle page correspond to the data unit DU2 and its parity. Bits U0, U1, U2, . . . U15 included in the upper page correspond to the data unit DU3 and its parity. Bits T0, T1, T2, . . . T15 included in the top page correspond to the data unit DU4 and its parity.

The lower part of FIG. 17 represents data after scrambling. For example, the bottom page in the diagram corresponds to the data PG0, the lower page corresponds to the data PG1, the middle page corresponds to the data PG2, the upper page corresponds to the data PG3, and the top page corresponds to the data PG4. In the data after scrambling, for reference, only the bottom bits before scrambling are represented with diagonal lines. As illustrated, data of the least significant bit (first bit) (T0/U0/M0/L0/B0) remain unchanged, while the data of the second bit (T1/U1/M1/L1/B1) are shifted by one bit between pages. Specifically, the bottom bit is replaced by the top bit T1, the lower bit is replaced by the bottom bit B1, the middle bit is replaced by the lower bit L1, the upper bit is replaced by the middle bit M1, and the top bit is replaced by the upper bit U1. The data of the third bit (T2/U2/M2/L2/B2) are further shifted by one bit between pages. Specifically, the bottom bit is replaced by the upper bit U2, the lower bit is replaced by the top bit T2, the middle bit is replaced by the bottom bit B2, the upper bit is replaced by the lower bit L2, and the top bit is replaced by the middle bit M2. Subsequently, similar operations are performed.

As a result of the scrambling described above, the bottom page (data PG0), the lower page (data PG1), the middle page (data PG2), the upper page (data PG3), and the top page (data PG4) are generated as follows:

PG0:<B0/T1/U2/M3/L4/B5/T6/U7/M8/L9/B10/T11/U12/M13/L14/B15>
PG1:<L0/B1/T2/U3/M4/L5/B6/T7/U8/M9/L10/B11/T12/U13/M14/L15>
PG2:<M0/L1/B2/T3/U4/M5/L6/B7/T8/U9/M10/L11/B12/T13/U14/M15>
PG3:<U0/M1/L2/B3/T4/U5/M6/L7/B8/T9/U10/M11/L12/B13/T14/U15>
PG4:<T0/U1/M2/L3/B4/T5/U6/M7/L8/B9/T10/U11/M12/L13/B14/T15>

The method of scrambling data by exchanging bits among all pages (in this example, 5 pages) assigned to one word line WL, described above, is hereinafter referred to as a full page scramble method.

FIG. 18 is a flowchart of the scrambling process described above. In FIG. 18, i is a variable, that represents a bit line number of bit line BL (BLi). For example, if one page corresponds to 16 bits as in the case shown in FIG. 17, i is 0 to 15.

As depicted, for example, the processor 230 determines a bit line BL corresponding to each bit of write data. In the case of a bit line BL of the number corresponding to a multiple of 5, namely, if the remainder of dividing (i+5) by 5 is 0 (YES in step S200), the bits are not exchanged among the pages (step S201). The expression "mod(X,Y)" in FIG. 18 is a formula for calculating a remainder of dividing X by Y. Therefore, the top, upper, middle, lower, and bottom bits corresponding to BL0, BL5, BL10, and BL15 are all maintained as the top, upper, middle, lower, and bottom bits even after the scrambling.

In the case of mod((i+5),5)=1 (YES in step S202), the top, upper, middle, lower, and bottom bits corresponding to BL1, BL6, and BL11 respectively change to the bottom, top, upper, middle, and lower bits in the data after the scrambling (step S203). In other words, the top, upper, middle, lower, and bottom bits in the data after the scrambling are respectively replaced by the upper, middle, lower, bottom, and top bits in the data before the scrambling.

In the case of mod((i+5),5)=2 (YES in step S204), the top, upper, middle, lower, and bottom bits corresponding to BL2, BL7, and BL12 respectively change to the lower, bottom, top, upper, and middle, bits in the data after the scrambling (step S205). In other words, the top, upper, middle, lower, and bottom bits in the data after the scrambling are respectively replaced by the middle, lower, bottom, top, and upper bits in the data before the scrambling.

Furthermore, in the case of mod((i+5),5)=3 (YES in step S206), the top, upper, middle, lower, and bottom bits corresponding to BL3, BL8, and BL13 respectively change to the middle, lower, bottom, top, and upper bits in the data after the scrambling (step S207). In other words, the top, upper, middle, lower, and bottom bits in the data after the scrambling are respectively replaced by the lower, bottom, top, upper, and middle bits in the data before the scrambling.

In the case of mod((i+5),5)=4 (NO in step S206), the top, upper, middle, lower, and bottom bits corresponding to BL4, BL9, and BL14 respectively change to the upper, middle, lower, bottom, and top bits in the data after the scrambling (step S208). In other words, the top, upper, middle, lower, and bottom bits in the data after the scrambling are respectively replaced by the bottom, top, upper, middle, and lower bits in the data before the scrambling.

Thus, the scrambled data is generated by exchanging the respective bits of data of the top, upper, middle, lower, and bottom bits among the five pages. In the example described above, the data is exchanged for each bit. However, the data may be exchanged in units of columns, not for each bit. In the NAND flash memory, a plurality of bit lines (for example, eight consecutive bit lines) BL (BL0 to BL7, BL8 to BL15, etc.) may be handled in units of columns. A column address transmitted from the controller 200 designates a set of a plurality of bit lines BL. In this case, each of the bits B0 to B15, L0 to L15, . . . T0 to T15 in FIG. 17 and the above explanation may be a series of bits of one column, not 1-bit data. The scramble method is not limited to the rule shown in FIG. 18, but various methods may be used as long as bits can be exchanged among a plurality of pages.

When the data scrambling is completed as described above, the processor 230 of the controller 200 issues a write command for data to the NAND flash memory 100 described above as step S24. FIG. 19 is a conceptual diagram illustrating command sequences transmitted from the controller 200 to the NAND flash memory 100.

As illustrated, the controller 200 first issues a prefix command "X1h". The command "X1h" declares to the NAND flash memory 100 that data is to be written using the full page scramble method. In this example, the command "X1h" may not necessarily be issued, since the controller 200 performs scrambling whereas the NAND flash memory 100 performs normal read processing. Subsequently, the controller 200 issues a first sequence SQ1 and transfers it to the NAND flash memory 100. The first sequence SQ1 is a sequence for transferring bottom page data in the write data after scrambling. In the first sequence SQ1, the command "01h" is first issued. The command "01h" designates a bottom page. Subsequently, the controller 200 issues a command "80h" to declare that an address is to be input, and transmits an address ADD, for example, over five cycles. The address ADD designates a block BLK and a page in which the bottom page data is to be programmed. Subsequently, the controller 200 transmits the bottom page data DAT of the scrambled write data to the NAND flash memory 100, and finally issues a command "1Ah". The command "1Ah" is a command to cause the NAND flash memory 100 to take the data in the sense amplifier 140. Then, the NAND flash memory 100 is temporarily set to the busy state, while the bottom page data is held in, for example, the latch circuit ADL.

After that, when the NAND flash memory 100 returns to the ready state, the controller 200 issues a second sequence SQ2 and transfers it to the NAND flash memory 100. The second sequence SQ2 is a sequence for transferring lower page data in the write data after scrambling. The second sequence SQ2 differs from the first sequence SQ1 in the following respects:

The command "02h" is issued instead of "01h" and the lower page is designated.

Data DAT corresponds to the lower page in the scrambled data.

The lower page data is held by, for example, the latch circuit BDL.

The controller 200 issues third to fifth sequences SQ3 to SQ5, and transfers the middle page data, the upper page data and the top page data to the NAND flash memory 100. The transferred middle page data, the upper page data, and the top page data is held by, for example, the latch circuits CDL, DDL, and EDL. In the fifth sequence SQ5, the command "10h" is issued instead of the command "1Ah". The command "10h" instructs the NAND flash memory 100 to perform an operation to write data to the memory cell array 110. The NAND flash memory 100 is set to the busy state in response to the command "10h", and performs full sequence programming using data for the received five pages.

5.2 Data Reading Operation

Next, a method of reading the scrambled data will be described. FIG. 20A is a flowchart showing the reading operation according to the present embodiment. As shown in FIG. 20A, first, the host apparatus 300 issues a data read instruction from the NAND flash memory 100, and transmits it to the controller 200 (step S11).

In response to the instruction received from the host apparatus 300, the controller 200 issues a read command for the data (which is the scrambled data) written in the NAND flash memory 100, and transmits it to the NAND flash memory 100 (step S25).

In response to the received read command, the NAND flash memory 100 reads data from the memory cell array 110 (step S31). At this time, the sequential reading of the first embodiment described above is used for reading of the data. As a result, the latch circuits XDL, ADL, BDL, CDL, and DDL of the sense amplifier 140 respectively hold bottom bits (B0/T1/U2/M3/L4/B5/T6/U7/M8/L9/B10/T11/U12/M13/L14/B15) of the scrambled data, lower bits (L0/B1/T2/U3/M4/L5/B6/T7/U8/M9/L10/B11/T12/U13/M14/L15), middle bits (M0/L1/B2/T3/U4/M5/L6/B7/T8/U9/M10/L11/B12/T13/U14/M15), upper bits (U0/M1/L2/B3/T4/U5/M6/L7/B8/T9/U10/M11/L12/B13/T14/U15), and top bits (T0/U1/M2/L3/B4/T5/U6/M7/L8/B9/T10/U11/M12/L13/B14/T15). Thus, the scrambled data read from the memory cell array 110 is transmitted to the memory controller 200, and held by, for example, the buffer memory 240.

Thereafter, the processor 230 or the ECC circuit 260 of the controller 200 exchanges bits among pages, thereby decoding the scrambled data (step S26). In other words, the data of the lower part of FIG. 17 is converted to the data of the upper part. As a result, the data unit DU and its parity are restored. Then, the ECC circuit 260 performs error correction (step S27), and transmits the error-corrected data to the host apparatus 300 (step S28).

Figure 20B:
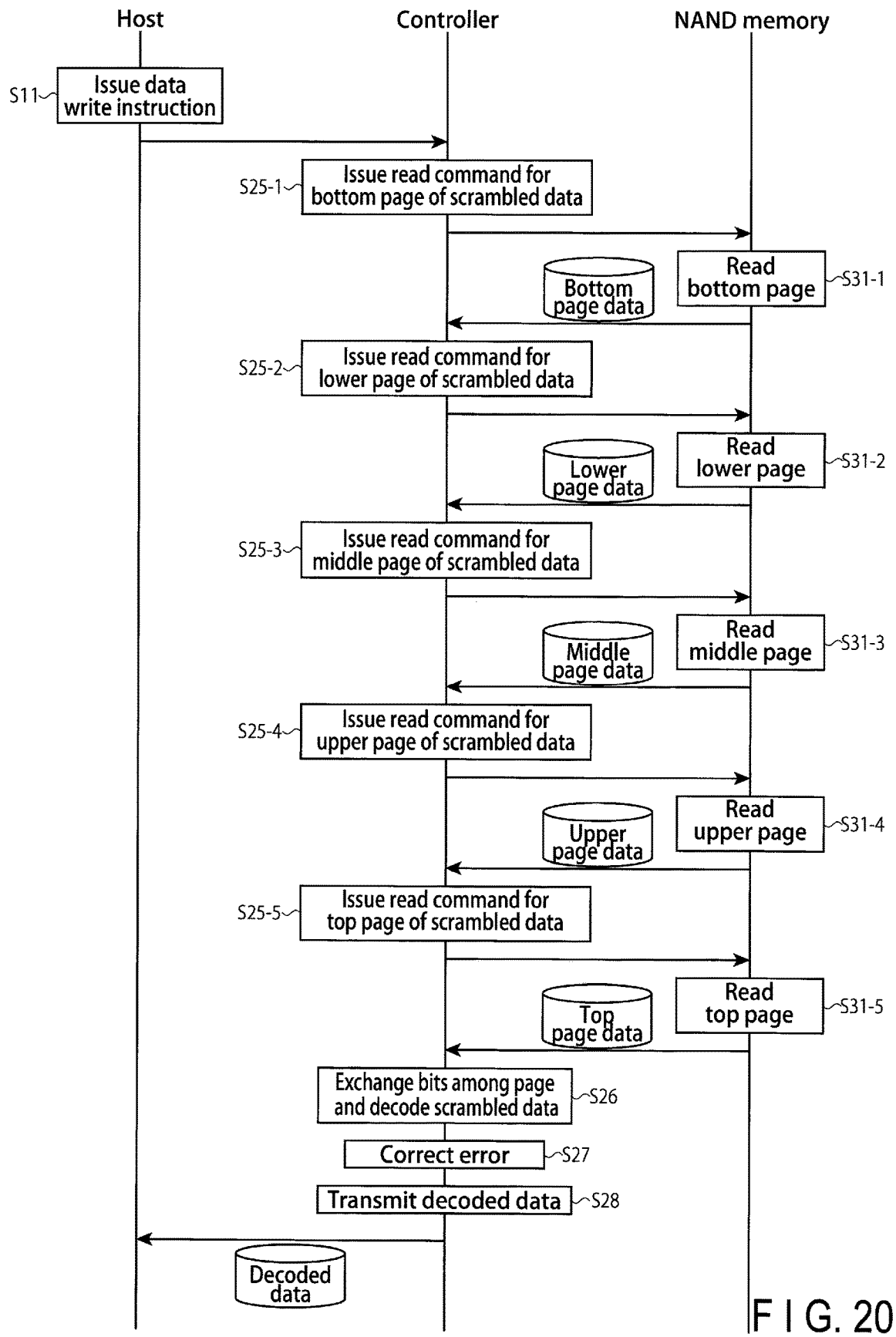

In the manner described above, the data is read from the NAND flash memory 100. In the example described above with reference to FIG. 20A, the NAND flash memory 100 performs the sequential reading in response to the instruction of step S25 from the controller 200. However, the controller 200 may issue a page by page reading command, and the NAND flash memory 100 may perform a page by page reading. Such an example is shown in FIG. 20B. FIG. 20B is a flowchart showing an operation of the memory system, in a case where the page by page reading command is issued. Specifically, five pages, namely, bottom, lower, middle, upper, and top pages are read from the NAND flash memory 100.

As shown in FIG. 20B, the host controller 200 issues a read command for each of the bottom page, the lower page, the middle page, the upper page, and the top page (step S25-1 to S25-5) upon receipt of a data read instruction from the host apparatus 300. In response to these commands, the NAND flash memory 100 reads the bottom page data, the lower page data, the middle page data, the upper page data, and the top page data from the memory cell array 110, and transmits the read data to the controller 200 each time the data is read (step S31-1 to S31-5). After the step S31-5, the data for the five pages are completely collected in the controller 200. The controller 200 decodes the data by exchanging bits among the pages (step S26).

Thus, the controller 200 may request NAND flash memory 100 to perform a page by page reading. In this case, the NAND flash memory 100 may read only a necessary page, and does not need to perform the full sequential reading. Therefore, the method shown in FIG. 20B may be preferable in, for example, fifth, sixth, ninth, and tenth embodiments described later. In the following, however, the case of reading data by the method shown in FIG. 20A will be described as an example.

Figure 21:
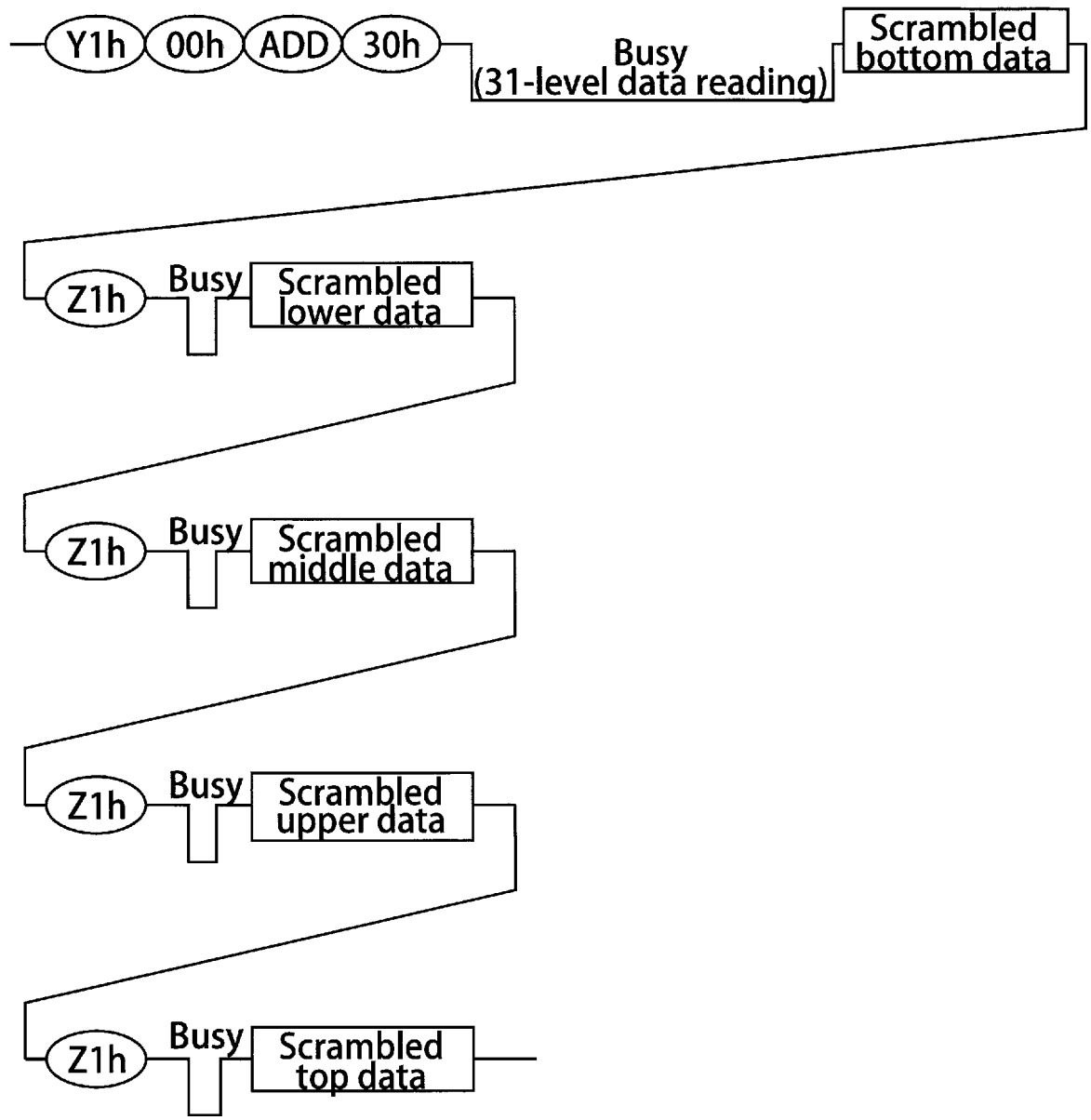
FIG. 21 is a schematic diagram illustrating read command sequences according to the fifth embodiment.

FIG. 21 is a conceptual diagram illustrating command sequences issued in step S25. As illustrated in FIG. 21, the controller 200 first issues a prefix command "Y1h". The command "Y1h" declares to the NAND flash memory 100 that the data written using the full page scramble method is to be read. However, it is the controller 200 that decodes the read scrambled data, whereas the NAND flash memory 100 performs the normal sequential reading. Therefore, the command "Y1h" may be omitted. Thereafter, in the same manner as in the first embodiment, the command "00h", the address ADD, and the command "30h" are issued. Then, the NAND flash memory 100 is set to the busy state, and performs the sequential reading in response to the command "Y1h". In the sequential reading in response to the command "Y1h", all of the reading operations 1R to 1FR described with reference to FIG. 3 are performed. This reading method is referred to as full sequential reading to be distinguished from the sequential reading, which performs only a part of the reading operations 1R to 1FR. In this embodiment, the bottom page (B0/T1/U2/M3/L4/B5/T6/U7/M8/L9/B10/T11/U12/M13/L14/B15) of the scrambled data is held by the latch circuit XDL, the lower page (L0/B1/T2/U3/M4/L5/B6/T7/U8/M9/L10/B11/T12/U13/M14/L15) is held by the latch circuit ADL, the middle page (M0/L1/B2/T3/U4/M5/L6/B7/T8/U9/M10/L11/B12/T13/U14/M15) is held by the latch circuit BDL, the upper page (U0/M1/L2/B3/T4/U5/M6/L7/B8/T9/U10/M11/L12/B13/T14/U15) is held by the latch circuit CDL, and the top page (T0/U1/M2/L3/B4/T5/U6/M7/L8/B9/T10/U11/M12/L13/B14/T15) is held by latch circuit DDL.

When the NAND flash memory 100 is returned to the ready state, the controller 200 toggles the read enable signal REn. As a result, the bottom page of the scrambled data held by the latch circuit XDL is transmitted to the controller 200.

Subsequently, the controller issues a command "Z1h" and transmits it to the NAND flash memory 100. The command "Z1h" transfers data between latch circuits in the sense amplifier 140. Specifically, the data in the latch circuit ADL is transferred to the latch circuit XDL, the data in the latch circuit BDL is transferred to the latch circuit ADL, the data in the latch circuit CDL is transferred to the latch circuit BDL, the data in the latch circuit DDL is transferred to the latch circuit CDL, and the data in the latch circuit EDL is transferred to the latch circuit DDL. When the controller 200 toggles the read enable signal REn, the lower page data is transmitted to the controller 200.

Thereafter, by issuing the command "Z1h" and the read enable signal REn, the middle page data, the upper page data, and the top page data are sequentially transmitted to the controller 200.

In the case of using the method of FIG. 20B, the following command sequence shown in FIG. 21 is issued in the step S25-1 to S25-5:

<Y1h><00h><ADD><30h>.

In this manner, the page designated by the address ADD is read.

Figure 22A:
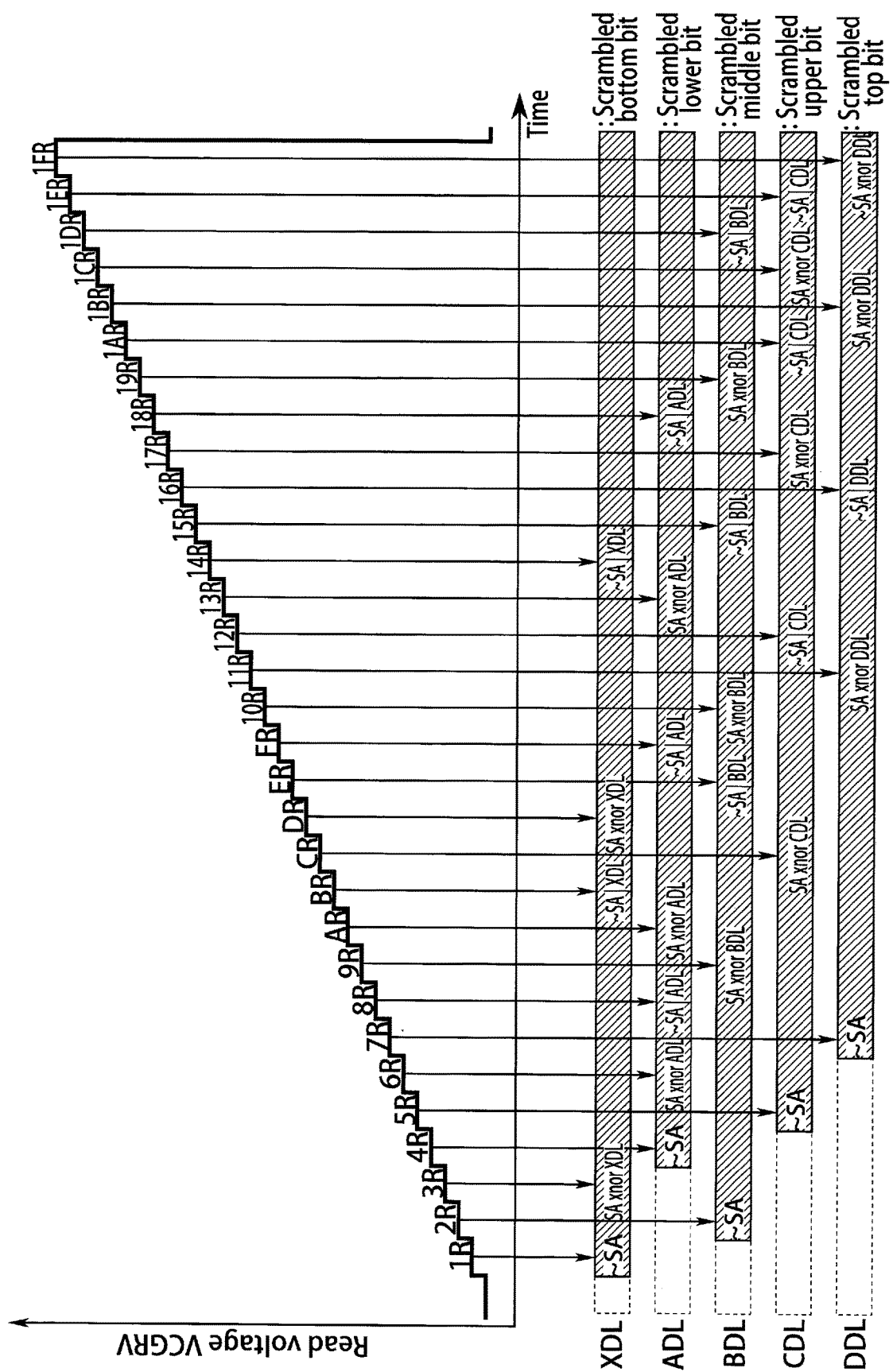
FIG. 22A is a timing chart of various signals during a reading operation according to the fifth embodiment.

FIG. 22A is a timing chart showing a change in potential of the selected word line WL and the data held by each of the latch circuits in the sense amplifier 140, when the step S31 illustrated in FIG. 20A is performed. The data mapping in FIG. 6 is applied to this case.

As illustrated, the row decoder 120 sequentially applies the voltages V1 to V1F to the selected word line WL. As a result, the reading operations 1R to 1FR are sequentially performed. In the following, arithmetic operations in the reading operations 1R to 1FR and data held in each of the latch circuits in the sense amplifier 140 will be described. In FIG. 22A and the following description, the data held by the sense section SA, and the latch circuits ADL, BDL, CDL, DDL and XDL are represented as SA, ADL, BDL, CDL, DDL and XDL. Furthermore, the symbol "~" represents a negation operation (=NOT), the symbol "xnor" represents an exclusive NOR operation, and the symbol "|" represents a logical add operation (=OR).

Reading operation 1R: Read result SA is inverted and held by the latch circuit XDL.

$$XDL = \sim SA$$

Reading operation 2R: Read result SA is inverted and held by the latch circuit BDL.

$$BDL = \sim SA$$

Reading operation 3R: Read result SA is XNORed with the data held by the latch circuit XDL.

$$XDL = SA \; xnor \; XDL$$

Reading operation 4R: Read result SA is inverted and held by the latch circuit ADL.

$$ADL = \sim SA$$

Reading operation 5R: Read result SA is inverted and held by the latch circuit CDL.

$$CDL = \sim SA$$

Reading operation 6R: Read result SA is XNORed with the data held by the latch circuit ADL.

$$ADL = SA \; xnor \; ADL$$

Reading operation 7R: Read result SA is inverted and held by the latch circuit DDL.

$$DDL = \sim SA$$

Reading operation 8R: Read result SA is inverted and ORed with the data held by the latch circuit ADL.

$$ADL = \sim SA \, | \, ADL$$

Reading operation 9R: Read result SA is XNORed with the data held by the latch circuit BDL.

$$BDL = SA \; xnor \; BDL$$

Reading operation AR: Read result SA is XNORed with the data held by the latch circuit ADL.

$$ADL = SA \; xnor \; ADL$$

Reading operation BR: Read result SA is inverted and ORed with the data held by the latch circuit XDL.

$$XDL = \sim SA \, | \, XDL$$

Reading operation CR: Read result SA is XNORed with the data held by the latch circuit CDL.

$$CDL = SA \; xnor \; CDL$$

Reading operation DR: Read result SA is XNORed with the data held by the latch circuit XDL.

$$XDL = SA \; xnor \; XDL$$

Reading operation ER: Read result SA is inverted and ORed with the data held by the latch circuit BDL.

$$BDL = \sim SA \, | \, BDL$$

Reading operation FR: Read result SA is inverted and ORed with the data held by the latch circuit ADL.

$$ADL = {\sim}SA \mid ADL$$

Reading operation 10R: Read result SA is XNORed with the data held by the latch circuit BDL.

$$BDL = SA\ xnor\ BDL$$

Reading operation 11R: Read result SA is XNORed with the data held by the latch circuit DDL.

$$DDL = SA\ xnor\ DDL$$

Reading operation 12R: Read result SA is inverted and ORed with the data held by the latch circuit CDL.

$$ADL = {\sim}SA \mid CDL$$

Reading operation 13R: Read result SA is XNORed with the data held by the latch circuit ADL.

$$ADL = SA\ xnor\ ADL$$

Reading operation 14R: Read result SA is inverted and ORed with the data held by the latch circuit XDL.

$$XDL = {\sim}SA \mid XDL$$

Reading operation 15R: Read result SA is inverted and ORed with the data held by the latch circuit BDL.

$$BDL = {\sim}SA \mid BDL$$

Reading operation 16R: Read result SA is inverted and ORed with the data held by the latch circuit DDL.

$$DDL = {\sim}SA \mid DDL$$

Reading operation 17R: Read result SA is XNORed with the data held by the latch circuit CDL.

$$CDL = SA\ xnor\ CDL$$

Reading operation 18R: Read result SA is inverted and ORed with the data held by the latch circuit ADL.

$$ADL = {\sim}SA \mid ADL$$

Reading operation 19R: Read result SA is XNORed with the data held by the latch circuit BDL.

$$BDL = SA\ xnor\ BDL$$

Reading operation 1AR: Read result SA is inverted and ORed with the data held by the latch circuit CDL.

$$CDL = {\sim}SA \mid CDL$$

Reading operation 1BR: Read result SA is XNORed with the data held by the latch circuit DDL.

$$DDL = SA\ xnor\ DDL$$

Reading operation 1CR: Read result SA is XNORed with the data held by the latch circuit CDL.

$$CDL = SA\ xnor\ CDL$$

Reading operation 1DR: Read result SA is inverted and ORed with the data held by the latch circuit BDL.

$$BDL = {\sim}SA \mid BDL$$

Reading operation 1ER: Read result SA is inverted and ORed with the data held by the latch circuit CDL.

$$CDL = {\sim}SA \mid CDL$$

Reading operation 1FR: Read result SA is inverted and XNORed with the data held by the latch circuit DDL.

$$DDL = {\sim}SA\ xnor\ DDL$$

In the manner described above, the bottom bit (B0/T1/U2/M3/L4/ ... B15) is established at the reading operation 14R, and held by the latch circuit XDL. The lower bit (L0/B1/T2/U3/M4/ ... L15) is established at the reading operation 18R, and held by the latch circuit ADL. The middle bit (M0/L1/B2/T3/U4/ ... M15) is established at the reading operation 1DR, and held by the latch circuit BDL. The upper bit (U0/M1/L2/B3/T4/ ... U15) is established at the reading operation 1ER, and held by the latch circuit CDL. The top bit (T0/U1/M2/L3/B4/ ... T15) is established at the reading operation 1FR, and held by the latch circuit DDL.

Thereafter, the scrambled data in the latch circuits XDL, ADL, BDL, CDL, and DDL are read by the controller 200. FIG. 22B is a flowchart of a process of decoding the scrambled data (step S25 in FIG. 20A), that is, a process opposite to the process of FIG. 18.

As depicted, for example, the processor 230 or the ECC circuit 260 determines a bit line BL corresponding to each bit of read data. In the case of a bit line BL of the number corresponding to a multiple of 5, namely, if the remainder of dividing (i+5) by 5 is 0 (YES in step S300), the bits are not exchanged among the pages (step S301). This is the same as in the scrambling. Therefore, the top, upper, middle, lower, and bottom bits corresponding to BL0, BL5, BL10, and BL15 are all maintained as the top, upper, middle, lower, and bottom bits even after the decoding.

On the other hand, in the case of mod((i+5),5)=1 (YES in step S302), the top, upper, middle, lower, and bottom bits of the scrambled data corresponding to BL1, BL6, and BL11 respectively change to the upper, middle, lower, bottom, and top bits (step S303). In other words, the top, upper, middle, lower, and bottom bits in the decoded data are respectively replaced by the bottom, top, upper, middle, and lower bits in the scrambled data.

In the case of mod((i+5),5)=2 (YES in step S304), the top, upper, middle, lower, and bottom bits of the scrambled data corresponding to BL2, BL7, and BL12 respectively change to the middle, lower, bottom, top, and upper bits in the scrambled data (step S305). In other words, the top, upper, middle, lower, and bottom bits in the decoded data are respectively replaced by the lower, bottom, top, upper, and middle bits in the scrambled data.

Furthermore, in the case of mod((i+5),5)=3 (YES in step S306), the top, upper, middle, lower, and bottom bits of the scrambled data corresponding to BL3, BL8, and BL13 respectively change to the lower, bottom, top, upper, and middle bits (step S307). In other words, the top, upper, middle, lower, and bottom bits in the decoded data are respectively replaced by the middle, lower, bottom, top, and upper bits in the scrambled data.

In the case of mod((i+5),5)=4 (NO in step S306), the top, upper, middle, lower, and bottom bits of the scrambled data corresponding to BL4, BL9, and BL14 respectively change to the bottom, top, upper, middle, and lower bits (step S308). In other words, the top, upper, middle, lower, and bottom bits in the decoded data are respectively replaced by the upper, middle, lower, bottom, and top bits in the scrambled data.

Thus, the scrambled data is decoded by exchanging the respective bits of data of the top, upper, middle, lower, and bottom bits among the five pages. In the example described above, the data is exchanged for each bit. However, the data may be exchanged in units of columns, not for each bit, as described with reference to FIG. 18.

5.3 Advantageous Effects According to Present Embodiment

As described above, according to the present embodiment, by scrambling (randomizing) the data, "0" data or "1" data is prevented from being concentrated in a specific area. Therefore, bias of charge distribution in the memory cell array 110 is prevented, so that the reliability of reading data can be improved.

Furthermore, according to the present embodiment, data is scrambled by exchanging bits among a plurality of pages. Therefore, the embodiment does not require a random number, which is generally required for scrambling data, and a random number generating circuit. Accordingly, data can be scrambled by a simple method.

The embodiment has been described with reference to the example shown in FIG. 21 as a command sequence during the reading operation. However, the embodiment is not limited to the example of FIG. 21. For example, necessary data (latch circuit) may be designated in the command sequence. Such a case will be described with reference to command sequences illustrated in FIG. 23A, FIG. 23B, and FIG. 23C.

FIG. 23A shows an example in which the controller 200 requests upper pages (U0/M1/L2/B3/T4/ . . . U15) of scrambled data. As illustrated in FIG. 23A, the controller 200 issues the command "04h" designating an upper page subsequent to the command "Y1h". Then, for example, the sequencer 170 of the NAND flash memory 100 causes the latch circuit XDL to hold the upper page data of the data read from the memory cell array 110 by the full sequential reading. Accordingly, after the NAND flash memory 100 returns to the ready state, the controller 200 toggles the read enable signal REn, thereby reading the upper page data.

FIG. 23B shows a case in which the controller 200 requests the lower page (L0/B1/T2/U3/M4/ . . . L15) and the upper page (U0/M1/L2/B3/T4/ . . . U15) of the scrambled data. As illustrated in FIG. 23B, the controller 200 issues a command "02h" designating the lower page following the command "Y1h". Then, for example, the sequencer 170 of the NAND flash memory 100 causes the latch circuit XDL to hold the lower page data of the data read from the memory cell array 110 by the full sequential reading. As a result, the middle page data is held by the latch circuit ADL, the upper page data is held by the latch circuit BDL, the top page data is held by the latch circuit CDL, and the bottom page data is held by the latch circuit DDL. Accordingly, after the NAND flash memory 100 returns to the ready state, the controller 200 toggles the read enable signal REn, thereby reading the lower page data. Furthermore, the controller 200 transfers the upper page data in the latch circuit BDL to the latch circuit ADL by issuing the command "Z1h", and the upper page data in the latch circuit ADL to the latch circuit XDL by issuing the command "Z1h" again. Thereafter, the controller 200 toggles the read enable signal REn, thereby reading the upper page data.

FIG. 23C shows a case in which the controller 200 requests the top page (T0/U1/M2/L3/B4/ . . . T15) and the upper page (U0/M1/L2/B3/T4/ . . . U15) of the scrambled data. As illustrated in FIG. 23C, the controller 200 issues a command "05h" designating the top page following the command "Y1h". Then, for example, the sequencer 170 of the NAND flash memory 100 causes the latch circuit XDL to hold the top page data of the data read from the memory cell array 110 by the full sequential reading. As a result, the bottom page data is held by the latch circuit ADL, the lower page data is held by the latch circuit BDL, the middle page data is held by the latch circuit CDL, and the upper page data is held by the latch circuit DDL. Accordingly, after the NAND flash memory 100 returns to the ready state, the controller 200 toggles the read enable signal REn, thereby reading the top page data. Furthermore, by issuing the command "Z1h" four times, the upper page data in the latch circuit DDL is transferred to the latch circuit XDL via the latch circuits CDL, BDL, and ADL. Then, the controller 200 toggles the read enable signal REn, thereby reading the upper page data.

As described above, a read command sequence may be issued, while designating necessary pages, namely, latch circuits.

Another case of a command sequence will be described with reference to FIG. 24 and FIG. 25. In the following case, a command that directly designates a second and subsequent page is used to designate data to be read from the sense amplifier 140 instead of designating the number of times of issuance of the command "Z1h" as shown in FIG. 23A, FIG. 23B, and FIG. 23C.

If the controller 200 reads only one page, for example, the upper page data, the command sequence shown in FIG. 23A applies. That is, the command "04h" designating the upper page is issued following the command "Y1h", and accordingly, the upper page data is stored in the latch circuit XDL.

Figure 24:
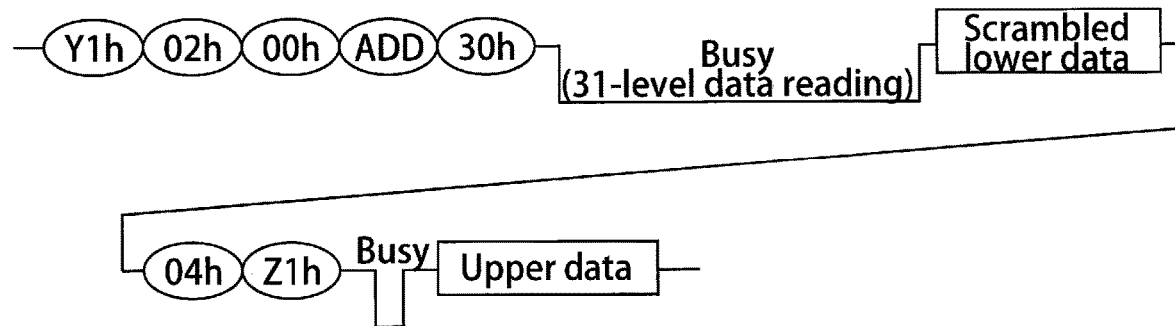
FIG. 24 and FIG. 25 are schematic diagrams illustrating read command sequences according to a second modification of the fifth embodiment.

FIG. 24, as well as FIG. 23B, shows a case in which the controller 200 requests the lower page (L0/B1/T2/U3/M4/ . . . L15) and the upper page (U0/M1/L2/B3/T4/ . . . U15) of the scrambled data. As illustrated in FIG. 24, the controller 200 issues a command "02h" designating the lower page following the command "Y1h". As a result, the lower page data is held by the latch circuit XDL. As in the case of FIG. 23B, the middle page data is held by the latch circuit ADL, the upper page data is held by the latch circuit BDL, the top page data is held by the latch circuit CDL, and the bottom page data is held by the latch circuit DDL. After reading the lower page data, the controller 200 issues a command "04h" designating the upper page, and subsequently, the command "Z1h". By the combination of the commands "04h" and "Z1h", the upper page data held by the latch circuit BDL is transferred to the latch circuit XDL, so that the controller 200 can read the upper page data.

Figure 25:
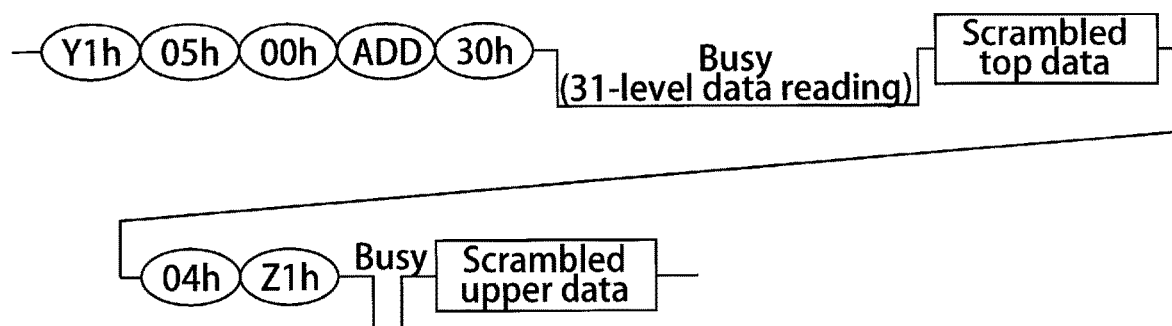

FIG. 25, as well as FIG. 23C, shows a case in which the controller 200 requests the top page (T0/U1/M2/L3/B4/ . . . T15) and the upper page (U0/M1/L2/B3/T4/ . . . U15) of the scrambled data. As illustrated in FIG. 25, the controller 200 issues a command "04h" designating the top page following the command "Y1h". As a result, the top page data is held by the latch circuit XDL. As in the case of FIG. 23B, the bottom page data is held by the latch circuit ADL, the lower page data is held by the latch circuit BDL, the middle page data is held by the latch circuit CDL, and the upper page data is held by the latch circuit DDL. After reading the top page data, the controller 200 issues a command "04h" designating the upper page, and subsequently, the command "Z1h". By the combination of the commands "04h" and "Z1h", the upper page data held by the latch circuit DDL is transferred to the latch circuit XDL, so that the controller 200 can read the upper page data.

6. Sixth Embodiment

A semiconductor memory device according to a sixth embodiment will now be described. The present embodiment relates to a data scramble method that differs from the fifth embodiment. In the following description, only the matters different from the fifth embodiment will be described.

6.1 Data Writing Operation

Figure 26:
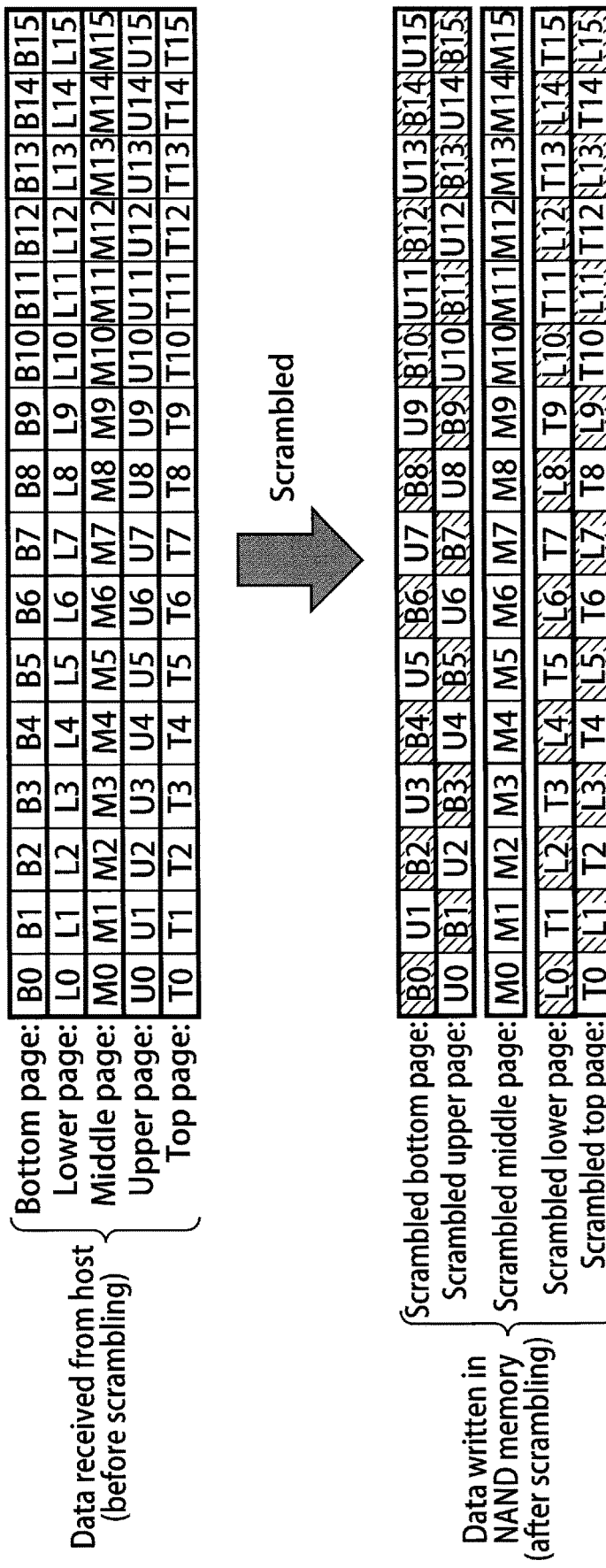
FIG. 26 is a conceptual diagram illustrating a data scramble method according to a sixth embodiment.

The data writing operation is the same as that illustrated in FIG. 15 for the fifth embodiment. The sixth embodiment differs from the fifth embodiment in data scramble method. The scrambling method will be described with reference to FIG. 26. FIG. 26 corresponds to FIG. 17 used in the explanation of the fifth embodiment. The upper part in FIG. 26 represents data before scrambling (data units DU and parities). The lower part of FIG. 26 represents data after scrambling. In the data after scrambling in FIG. 26, for reference, the bottom and lower bits before scrambling are represented with diagonal lines.

As illustrated in FIG. 26, the scrambling method of the present embodiment is performed as follows:

The bottom page and the upper page are scrambled, so that the bottom page and the upper page of scrambled data are generated. At this time, bottom bits are replaced by upper bits at every other bit, and upper bits are replaced by bottom bits at every other bit.

The bits in the middle page are not replaced.

The lower page and the top page are scrambled, so that the lower page and the top page of scrambled data are generated. At this time, lower bits are replaced by top bits at every other bit, and top bits are replaced by lower bits at every other bit.

As a result of the scrambling described above, the bottom page (data PG0 mentioned in FIG. 16), the lower page (data PG1), the middle page (data PG2), the upper page (data PG3), and the top page (data PG4) are generated as follows:

PG0:<B0/U1/B2/U3/B4/U5/B6/U7/B8/U9/B10/U11/B12/U13/B14/U15>

PG1:<L0/T1/L2/T3/L4/T5/L6/T7/L8/T9/L10/T11/L12/T13/L14/T15>

PG2:<M0/M1/M2/M3/M4/M5/M6/M7/M8/M9/M10/M11/M12/M13/M14/M15>

PG3:<U0/B1/U2/B3/U4/B5/U6/B7/U8/B9/U10/B11/U12/B13/U14/B15>

PG4:<T0/L1/T2/L3/T4/L5/T6/L7/T8/L9/T10/L11/T12/L13/T14/L15>

The method of scrambling data by exchanging bits among some of the pages (in this example, 5 pages) assigned to one word line WL, described above, is hereinafter referred to as a partial page scramble method. In the partial page scramble method of this embodiment, two pages (the bottom page and the upper page) are scrambled, one page (the middle page) is maintained, and further two pages (the lower page and the top page) are scrambled. This method may be referred to as "(2+1+2) scrambling". Furthermore, in the following description, the bottom page, the lower page, the middle page, the upper page, and the top page in the scrambled data may be referred to as the scrambled bottom page, the scrambled lower page, the scrambled middle page, the scrambled upper page, and the scrambled top page.

In the (2+1+2) scrambling, the two pages to be scrambled are not limited to those shown in FIG. 26. For example, the bottom page and the upper page may be scrambled, and further the middle page and the top page may be scrambled; that is, the pages to be scrambled are not particularly limited. Furthermore, the data may be exchanged between pages in units of columns or in any other units, not in units of bits, as described above in connection with the fifth embodiment.

Figure 27:
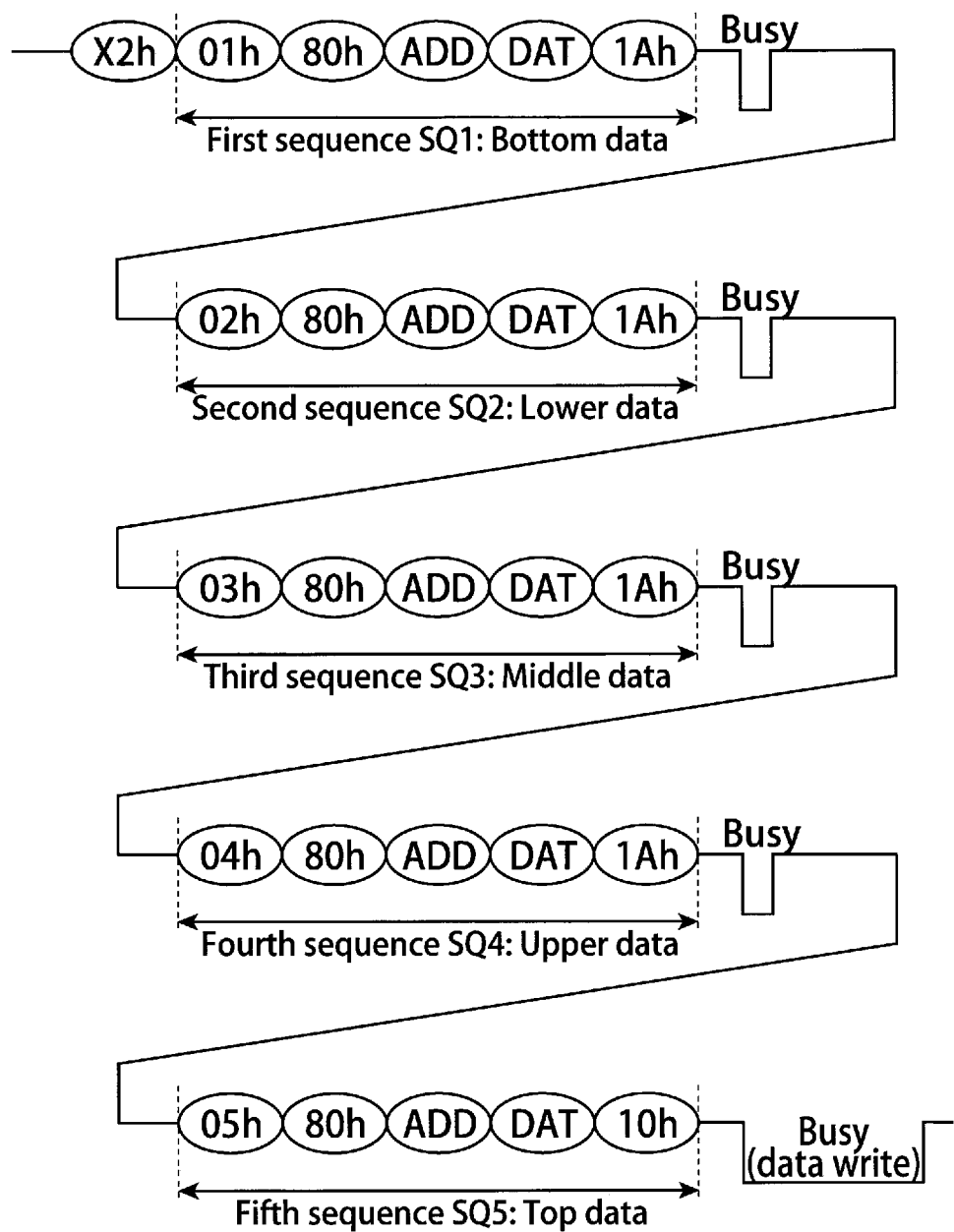
FIG. 27 is a schematic diagram illustrating write command sequences according to the sixth embodiment.

FIG. 27, corresponding to FIG. 19 which illustrates the fifth embodiment, is a conceptual diagram illustrating write command sequences transmitted from the controller 200 to the NAND flash memory 100.

As illustrated in FIG. 27, the controller 200 first issues a prefix command "X2h". The command "X2h" declares to the NAND flash memory 100 that data is to be written using the partial page scramble method, in particular the (2+1+2) scrambling. Of course, as in the fifth embodiment, the issuance of the command "X2h" may be omitted, since the controller 200 executes the data scrambling process. Then, the first to fifth sequences SQ1 to SQ5 are issued. The data transmitted in the first to fifth sequences SQ1 to SQ5 is scrambled data described with reference to FIG. 26. In response to the command "10h", the NAND flash memory 100 is set to the busy state, and performs the full sequence programming using data for the received five pages.

6.2 Data Reading Operation

Next, a method of reading the scrambled data will be described. The basic flow of the reading method is the same as that of the fifth embodiment illustrated in FIG. 20A; however, the sixth embodiment differs from the fifth embodiment in sequential reading method, which is determined by a prefix command issued from the controller 200.

Figure 28A:
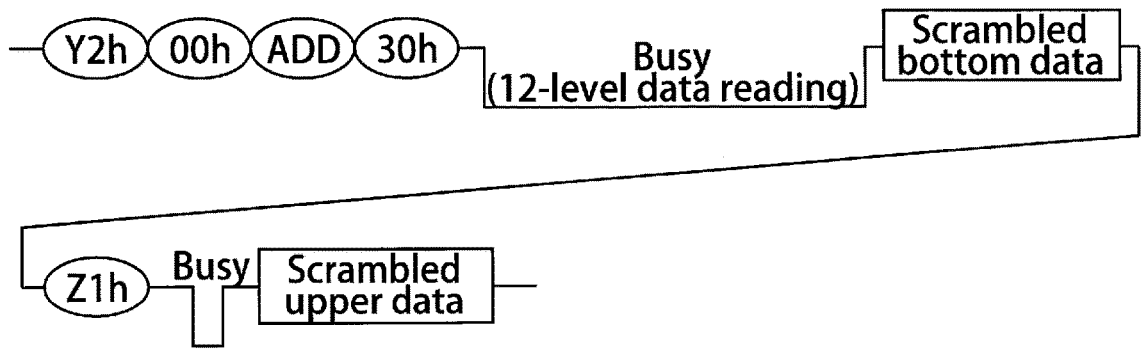
FIG. 28A, FIG. 28B, and FIG. 28C are schematic diagrams illustrating read command sequences according to the sixth embodiment.
Figure 28B:
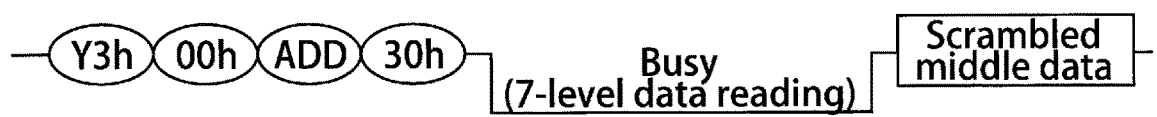
Figure 28C:
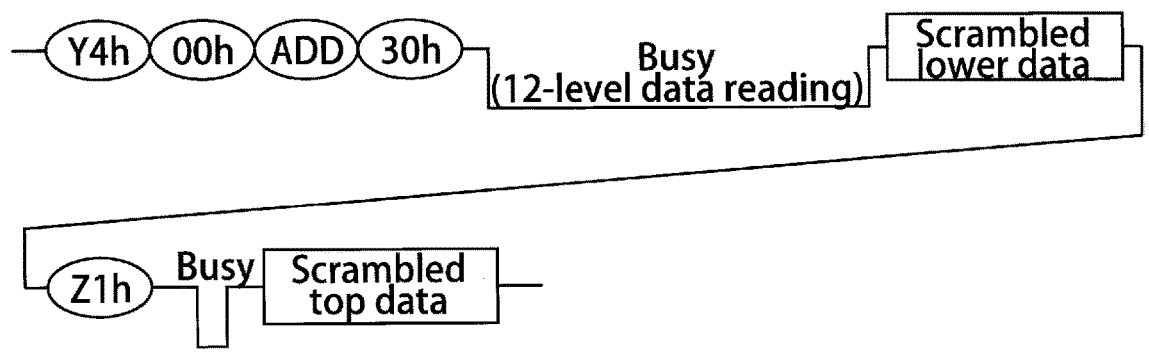

FIG. 28A, FIG. 28B, and FIG. 28C are conceptual diagrams illustrating command sequences issued in step S25. FIG. 28A shows a case in which the scrambled bottom page (B0/U1/B2/U3/B4/ . . . U15) and the scrambled upper page (U0/B1/U2/B3/U4 . . . B15) are read. FIG. 28B shows a case in which the scrambled middle page (M0/M1/M2/ . . . M15) is read. FIG. 28C shows a case in which the scrambled lower page (L0/T1/L2/T3/L4/ . . . T15) and the scrambled top page (T0/L1/T2/L3/T4 . . . L15) are read.

First, the case of FIG. 28A, in which the scrambled bottom page and the scrambled upper page are read, will be described. As illustrated in FIG. 28A, the controller 200 first issues a prefix command "Y2h". The command "Y2h" declares to the NAND flash memory 100 that the bottom page (B0/U1/B2/U3/B4/ . . . U15) and the upper page (U0/B1/U2/B3/U4 . . . B15) of the data scrambled by the (2+1+2) scrambling are to be read. Subsequently, as in the fifth embodiment, the command "00h", the address ADD and the command "30h" are issued. Then, the NAND flash memory 100 is set to the busy state, and in response to the command "Y2h", performs the sequential reading to read the scrambled bottom page and the scrambled upper page. The sequential reading for only some of the pages is hereinafter referred to as partial sequential reading. As a result, the scrambled bottom page (B0/U1/B2/U3/B4/ . . . U15) is held by the latch circuit XDL, and the scrambled upper page (U0/B1/U2/B3/U4 . . . B15) is held by the latch circuit ADL. Furthermore, the controller 200 issues the command "Z1h", so that the scrambled upper page data is transferred from the latch circuit ADL to the latch circuit XDL.

Next, the case of FIG. 28B, in which the scrambled middle page is read, will be described. As illustrated in FIG. 28B, the controller 200 first issues a prefix command "Y3h". The command "Y3h" declares to the NAND flash memory 100 that the middle page (M0/M1/M2/ . . . M15) of the data scrambled by the (2+1+2) scrambling are to be read. Subsequently, as in the fifth embodiment, the command "00h", the address ADD and the command "30h" are issued. Then, the NAND flash memory 100 is set to the busy state, and in response to the command "Y3h", performs the partial sequential reading to read the scrambled middle page. As a result, the scrambled middle page data is held by the latch circuit XDL.

Next, the case of FIG. 28C, in which the scrambled lower page data and the scrambled top page data are read, will be described. As illustrated in FIG. 28C, the controller 200 first issues a prefix command "Y4h". The command "Y4h" declares to the NAND flash memory 100 that the lower page (L0/T1/L2/T3/L4/ . . . T15) and the top page (T0/L1/T2/L3/T4 . . . L15) of the data scrambled by the (2+1+2) scrambling are to be read. Subsequently, as in the fifth embodiment, the command "00h", the address ADD and the command "30h" are issued. Then, the NAND flash memory 100 is set to the busy state, and in response to the command "Y4h", performs the partial sequential reading to read the scrambled lower page and the scrambled top page. As a result, the scrambled lower page (L0/T1/L2/T3/L4/ . . . T15) is held by the latch circuit XDL, and the scrambled top page (T0/L1/T2/L3/T4 . . . L15) is held by the latch circuit ADL. Furthermore, the controller 200 issues the command "Z1h", so that the scrambled top page data is transferred from the latch circuit ADL to the latch circuit XDL.

Figure 29A:
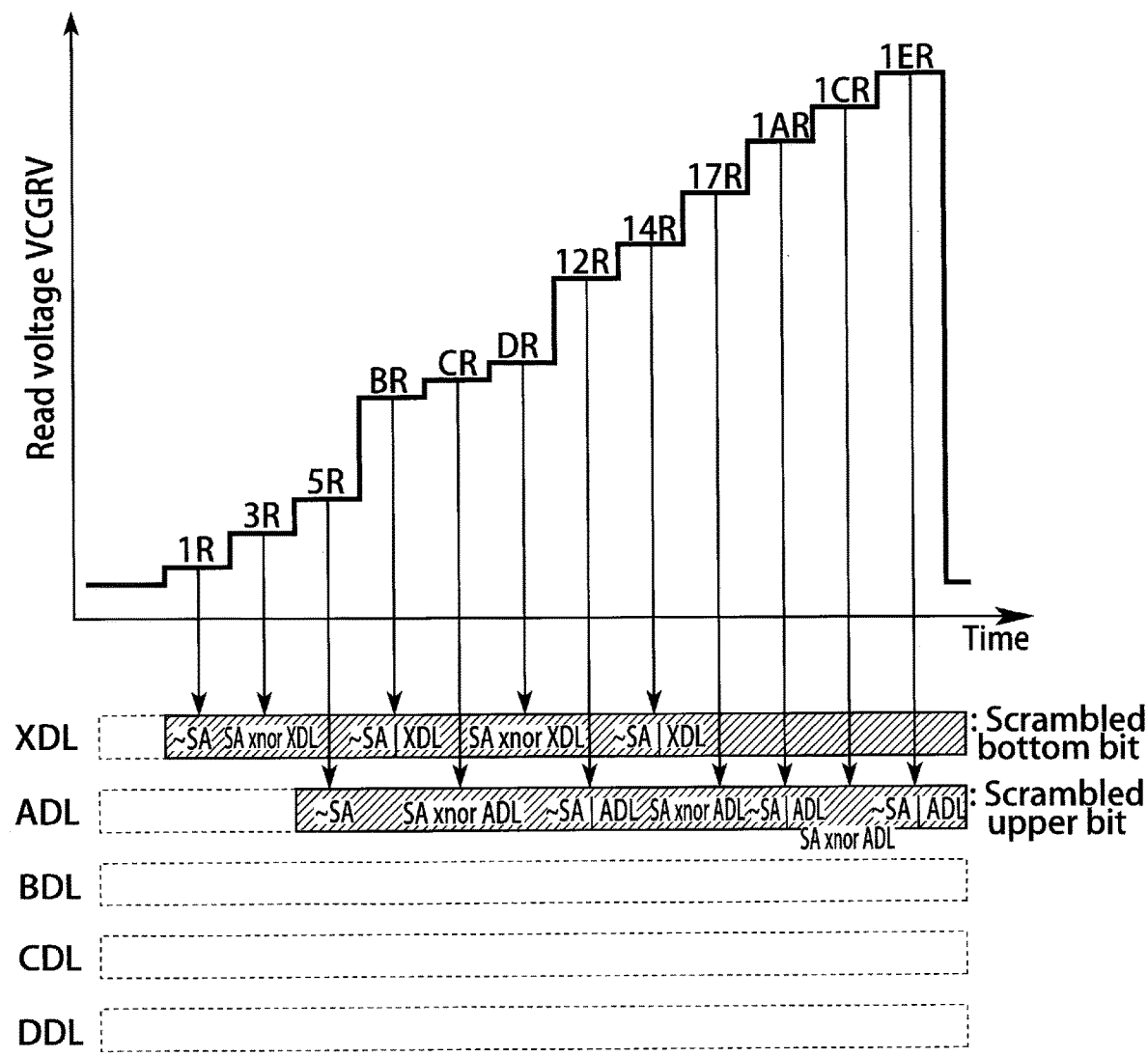

FIG. 29A is a timing chart of the case where the command sequence of FIG. 28A is issued, showing a change in potential of the selected word line WL and data held in each of the latch circuits in the sense amplifier 140, when step S31 in FIG. 20A is performed.

As illustrated, the row decoder 120 sequentially applies the voltages V1, V3, V5, VB, VC, VD, V12, V14, V17, V1A, V1C, and V1E to the selected word line WL. As a result, the reading operations 1R, 3R, 5R, BR, CR, DR, 12R, 14R, 17R, 1AR, 1CR, and 1ER are sequentially performed. In the following, arithmetic operations in the respective reading operations and data held in each of the latch circuits in the sense amplifier 140 will be described.

Reading operation 1R: Read result SA is inverted and held by the latch circuit XDL.

$$XDL = \sim SA$$

Reading operation 3R: Read result SA is XNORed with the data held by the latch circuit XDL.

$$XDL = SA \; xnor \; XDL$$

Reading operation 5R: Read result SA is inverted and held by the latch circuit ADL.

$$ADL = \sim SA$$

Reading operation BR: Read result SA is inverted and ORed with the data held by the latch circuit XDL.

$$XDL = \sim SA \mid XDL$$

Reading operation CR: Read result SA is XNORed with the data held by the latch circuit ADL.

$$ADL = SA \; xnor \; ADL$$

Reading operation DR: Read result SA is XNORed with the data held by the latch circuit XDL.

$$XDL = SA \; xnor \; XDL$$

Reading operation 12R: Read result SA is inverted and ORed with the data held by the latch circuit ADL.

$$ADL = \sim SA \mid ADL$$

Reading operation 14R: Read result SA is inverted and ORed with the data held by the latch circuit XDL.

$$XDL = {\sim}SA \mid XDL$$

Reading operation 17R: Read result SA is XNORed with the data held by the latch circuit ADL.

$$ADL = SA \text{ xnor } ADL$$

Reading operation 1AR: Read result SA is inverted and ORed with the data held by the latch circuit ADL.

$$ADL = {\sim}SA \mid ADL$$

Reading operation 1CR: Read result SA is XNORed with the data held by the latch circuit ADL.

$$ADL = SA \text{ xnor } ADL$$

Reading operation 1ER: Read result SA is inverted and ORed with the data held by the latch circuit ADL.

$$ADL = {\sim}SA \mid ADL$$

Of the data scrambled as described above, the scrambled bottom page data is established at the reading operation 14R, and the scrambled upper page data is established at the reading operation 1ER.

Next, the case in which the command sequence shown in FIG. 28B is issued will be described with reference to FIG. 29B. As illustrated, the row decoder 120 sequentially applies the voltages V2, V9, VE, V10, V15, V19, and V1D to the selected word line WL. As a result, the reading operations 2R, 9R, ER, 10R, 15R, 19R, and 1DR are sequentially performed. In the following, arithmetic operations in the respective reading operations and data held in each of the latch circuits in the sense amplifier 140 will be described.

Reading Operation 2R: XDL=~SA
Reading Operation 9R: XDL=SA xnor XDL
Reading Operation ER: XDL=~SA|XDL
Reading Operation 10R: XDL=SA xnor XDL
Reading Operation 15R: XDL=~SA|XDL
Reading Operation 19R: XDL=SA xnor XDL
Reading Operation 1DR: XDL=~SA|XDL In this manner, the scrambled middle page data are established.

Figure 29C:
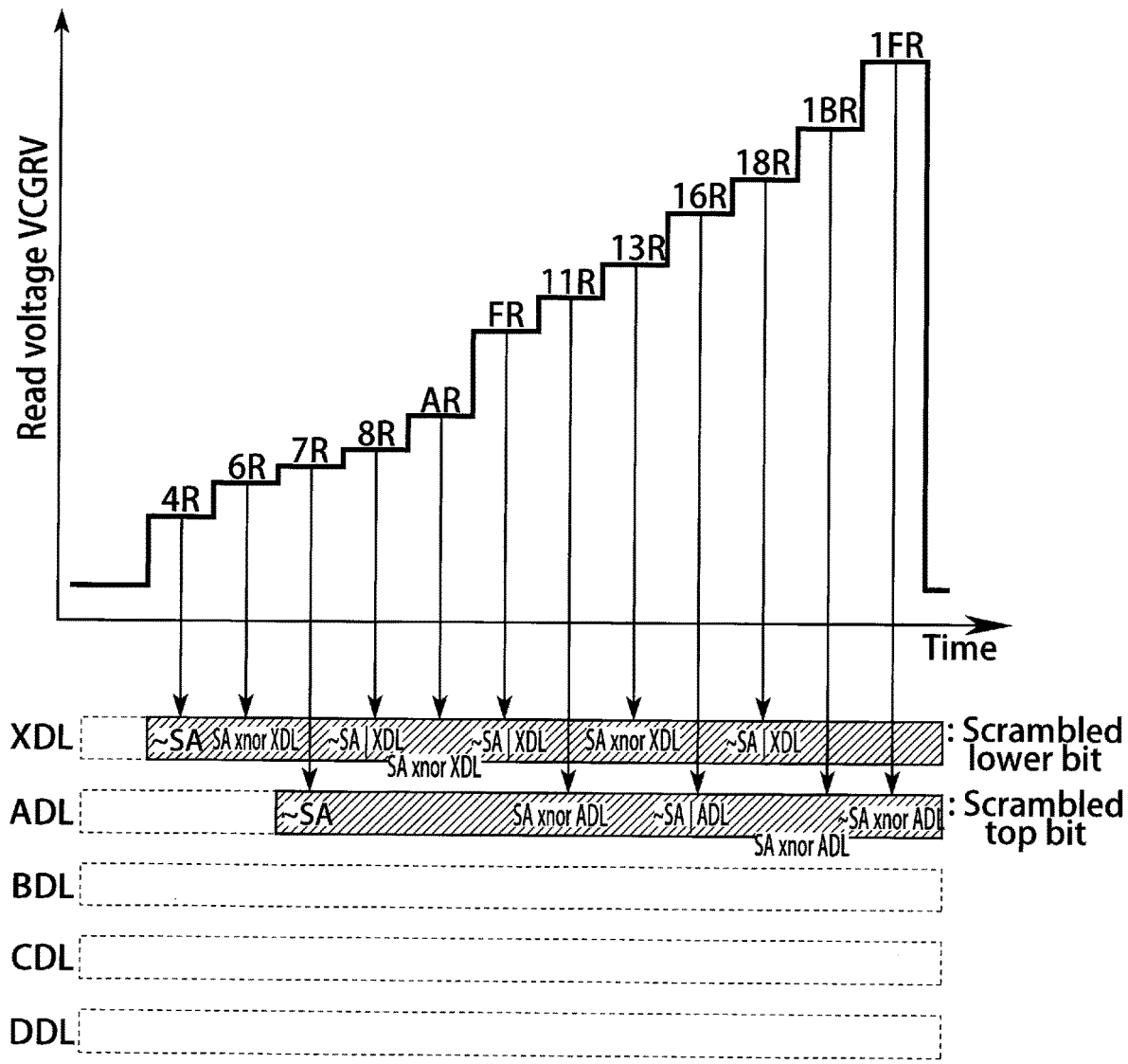

Next, the case in which the command sequence shown in FIG. 28C is issued will be described with reference to FIG. 29C. As illustrated, the row decoder 120 sequentially applies the voltages V4, V6, V7, V8, VA, VF, V11, V13, V16, V18, V1B, and V1F to the selected word line WL. As a result, the reading operations 4R, 6R, 7R, 8R, AR, FR, 11R, 13R, 16R, 18R, 1BR, and 1FR are sequentially performed. In the following, arithmetic operations in the respective reading operations and data held in each of the latch circuits in the sense amplifier 140 will be described.

Reading Operation 4R: XDL=~SA
Reading Operation 6R: XDL=SA xnor XDL
Reading Operation 7R: ADL=~SA
Reading Operation 8R: XDL=~SA|XDL
Reading Operation AR: XDL=~SA xnor XDL
Reading Operation FR: XDL=~SA|XDL
Reading Operation 11R: ADL=SA xnor ADL
Reading Operation 13R: XDL=SA xnor XDL
Reading Operation 16R: ADL=~SA ADL
Reading Operation 18R: XDL=~SA|XDL
Reading Operation 1BR: ADL=SA xnor ADL
Reading Operation 1FR: ADL=~SA xnor ADL Of the data scrambled as described above, the scrambled lower page data is established by the reading operation 18R, and the scrambled top page data is established by the reading operation 1FR.

6.3 Advantageous Effects According to Present Embodiment

The method of the present embodiment described above, for example, may be used as the data scramble method.

According to the present embodiment, since not full sequential reading but partial sequential reading may be performed to read data, the latency in data reading can be reduced.

In this embodiment described above, the command sequences shown in FIG. 28A, FIG. 28B, and FIG. 28C are used in reading operations. However, for example, necessary data (latch circuits) may be designated in the command sequences, as in the examples illustrated in FIG. 23A, FIG. 23B, and FIG. 23C concerning the fifth embodiment. Such a case will be described with reference to command sequences shown in FIG. 30A and FIG. 30B.

Figure 30A:
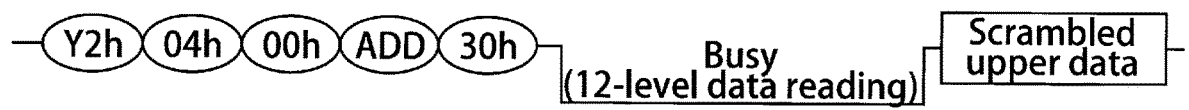
FIG. 30A and FIG. 30B are schematic diagrams illustrating read command sequences according to a modification of the sixth embodiment.

FIG. 30A shows a case in which the controller 200 requests the scrambled upper page data (U0/B1/U2/B3/U4/ . . . B15). As illustrated in FIG. 30A, the controller 200 issues a command "04h" designating the upper page following the command "Y2h". Then, for example, the sequencer 170 of the NAND flash memory 100 reads the scrambled upper page data (U0/B1/U2/B3/U4 . . . B15) from the memory cell array 110 through the partial sequential reading, and causes the latch circuit XDL to hold the data. Accordingly, after the NAND flash memory 100 returns to the ready state, the controller 200 toggles the read enable signal REn, thereby reading the scrambled upper page data.

Figure 30B:
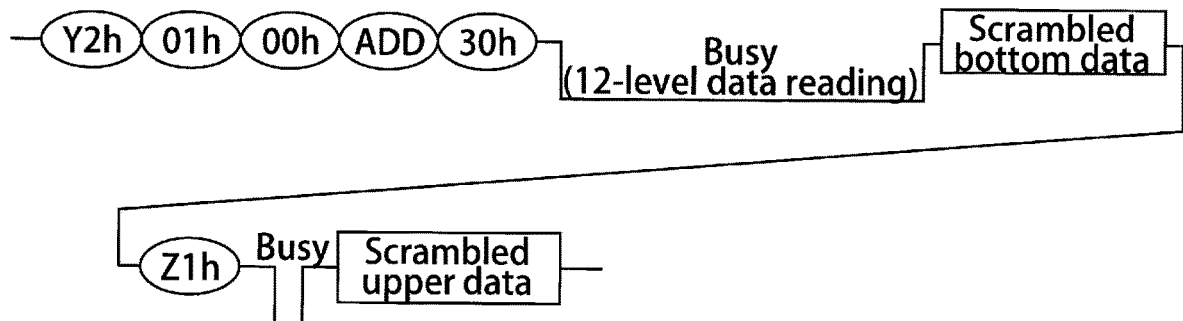

FIG. 30B shows a case in which the controller 200 requests the scrambled bottom page data and the scrambled upper page data. As illustrated in FIG. 30B, the controller 200 issues a command "01h" designating the bottom page following the command "Y2h". Then, for example, the sequencer 170 of the NAND flash memory 100 causes the latch circuit XDL to hold the scrambled bottom page data (B0/U1/B2/U3/B4/ . . . U15) of the data read from the memory cell array 110 through the partial sequential reading, and causes the latch circuit ADL to hold the scrambled upper page data (U0/B1/U2/B3/U4 . . . B15) of the data read from the memory cell array 110 through the partial sequential reading. As a result, the controller 200 can read the scrambled bottom page data, and can further transfer the scrambled upper page data in the latch circuit ADL to the latch circuit XDL by issuing the command "Z1h".

7. Seventh Embodiment

A semiconductor memory device according to a seventh embodiment will now be described. The present embodiment relates to a data scramble method that differs from the fifth and sixth embodiments. In the following description, only the matters different from the fifth and sixth embodiments will be described.

7.1 Data Writing Operation

Figure 31:
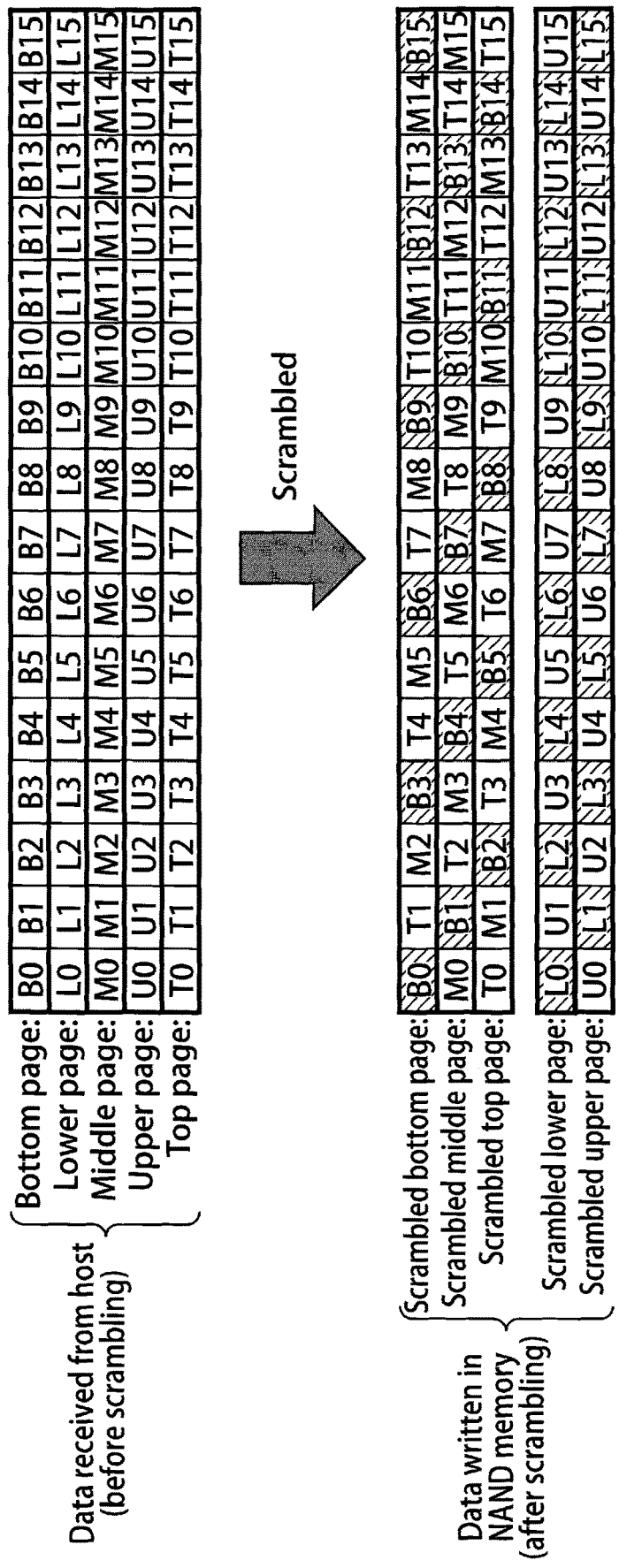
FIG. 31 is a conceptual diagram illustrating a data scramble method according to a seventh embodiment.

The data writing operation is the same as that illustrated in FIG. 15 for the fifth embodiment. The present embodiment differs from the fifth embodiment in data scrambling method. The scrambling method will be described with reference to FIG. 31. FIG. 31 corresponds to FIG. 17 used in the explanation of the fifth embodiment. The upper part in FIG. 31 represents data before scrambling (data units DU and parities). The lower part of FIG. 31 represents data after scrambling. In the data after scrambling in FIG. 31, for reference, the bottom and lower bits before scrambling are represented with diagonal lines.

As illustrated in FIG. 31, the scrambling method of the present embodiment is performed as follows:
- The bottom page, the middle page, and the top page are scrambled, so that the bottom page, the middle page, and the top page of scrambled data is generated. At this time, the bottom bit, middle bit, and top bit are respectively replaced by the top bit, bottom bit, and middle bit at the second bit, and further replaced by the middle bit, top bit, and bottom bit at the third bit. The same applies to the fourth and subsequent bits.
- The lower page and the upper page are scrambled, so that the lower page and the upper page of scrambled data is generated. At this time, lower bits are replaced by upper bits at every other bit, and upper bits are replaced by lower bits at every other bit.

As a result of the scrambling described above, the bottom page (data PG0 mentioned in FIG. 16), the lower page (data PG1), the middle page (data PG2), the upper page (data PG3), and the top page (data PG4) are generated as follows:
PG0:<B0/T1/M2/B3/T4/M5/B6/T7/M8/B9/T10/M11/B12/T13/M14/B15>
PG1:<L0/U1/L2/U3/L4/U5/L6/U7/L8/U9/L10/U11/L12/U13/L14/U15>
PG2:<M0/B1/T2/M3/B4/T5/M6/B7/T8/M9/B10/T11/M12/B13/T14/M15>
PG3:<U0/L1/U2/L3/U4/L5/U6/L7/U8/L9/U10/L11/U12/L13/U14/L15>
PG4:<T0/M1/B2/T3/M4/B5/T6/M7/B8/T9/M10/B11/T12/M13/B14/T15>

Thus, scrambling among three pages (bottom, middle, and top pages) is performed, and further scrambling between the remaining two pages (lower and upper pages) is performed. Such a method may be referred to as "(3+2) scrambling".

In the (3+2) scrambling, three pages or two pages to be scrambled are not limited to those shown in FIG. 31. The bits may be exchanged among the pages of all possible combinations. Furthermore, the data may be exchanged between pages in units of columns or in any other units, not in units of bits, as described above in connection with the fifth embodiment.

In the write command sequence of this embodiment, a command "X3h" is issued as a prefix command, instead of the command "X2h" which is used in the sixth embodiment described with reference to FIG. 27. The command "X3h" declares to the NAND flash memory 100 that data is to be written using the partial page scramble method, in particular, the (3+2) scrambling. Then, the first to fifth sequences SQ1 to SQ5 are issued as in the case of FIG. 27. The data transmitted by the first to fifth sequences SQ1 to SQ5 are scrambled data as described above with reference to FIG. 31. Since the controller 200 scrambles the data, the command "X3h" in particular may not necessarily be issued. In response to the command "10h", the NAND flash memory 100 is set to the busy state, and performs the full sequence programming using data for the received five pages.

7.2 Data Reading Operation

Next, a method of reading the scrambled data will be described. The basic flow of the reading method is the same as that of the fifth embodiment illustrated in FIG. 20A (or FIG. 20B); however, the seventh embodiment differs from the fifth embodiment in the sequential reading method, which is determined by a prefix command issued from the controller 200.

FIG. 32A and FIG. 32B are conceptual diagrams illustrating the command sequences issued in step S25. FIG. 32A shows a case in which the scrambled bottom page (B0/T1/M2/B3/T4/M5/ ... B15), the scrambled middle page (M0/B1/T2/M3/B4/T5/ ... M15), and the scrambled top page (T0/M1/B2/T3/M4/B5/ ... T15) are read. FIG. 32B shows a case in which the scrambled lower page (L0/U1/L2/U3/ ... U15) and the scrambled upper page (U0/L1/U2/L3/ ... L15) are read.

First, the case of FIG. 32A, in which the scrambled bottom page, the scrambled middle page, and the scrambled top page are read, will be described. As illustrated in FIG. 32A, the controller 200 first issues a prefix command "Y5h". The command "Y5h" declares to the NAND flash memory 100 that the three pages (the bottom page (B0/T1/M2/B3/T4/M5/ ... B15), the middle page (M0/B1/T2/M3/B4/T5/ ... M15), and the top page (T0/M1/B2/T3/M4/B5/ ... T15)) of the data scrambled by the (3+2) scrambling are to be read. Subsequently, as in the fifth embodiment, the command "00h", the address ADD and the command "30h" are issued. Then, the NAND flash memory 100 is set to the busy state, and in response to the command "Y5h", performs the partial sequential reading to read the scrambled bottom page (B0/T1/M2/ ... B15), the scrambled middle page (M0/B1/T2/ ... M15), and the scrambled top page (T0/M1/B2/ ... T15). As a result, the scrambled bottom page (B0/T1/M2/ ... B15) is held by the latch circuit XDL, the scrambled middle page (M0/B1/T2/ ... M15) is held by the latch circuit ADL, and the scrambled top page (T0/M1/B2/ ... T15) is held by the latch circuit BDL. Thus, the controller 200 issues the command "Z1h" after reading the scrambled bottom page, so that the scrambled middle page and the scrambled top page can be sequentially read.

Next, the case of FIG. 32B, in which the scrambled lower page and the scrambled upper page are read, will be described. As illustrated in FIG. 32B, the controller 200 first issues a prefix command "Y6h". The command "Y6h" declares to the NAND flash memory 100 that two pages of the data scrambled by the (3+2) scrambling (the lower page (L0/U1/L2/U3/ ... U15) and the upper page (U0/L1/U2/L3/ ... L15)) are to be read. Subsequently, as in the fifth embodiment, the command "00h", the address ADD and the command "30h" are issued. Then, the NAND flash memory 100 is set to the busy state, and in response to the command "Y6h", performs the partial sequential reading to read the scrambled lower page and the scrambled upper page. As a result, the scrambled lower page (L0/U1/L2/U3/ ... U15) is held by the latch circuit XDL, and the scrambled upper page (U0/L1/U2/L3/ ... L15) is held by the latch circuit ADL. Furthermore, the controller 200 issues the command "Z1h", so that the scrambled upper page data is transferred from the latch circuit ADL to the latch circuit XDL.

Figure 33A:
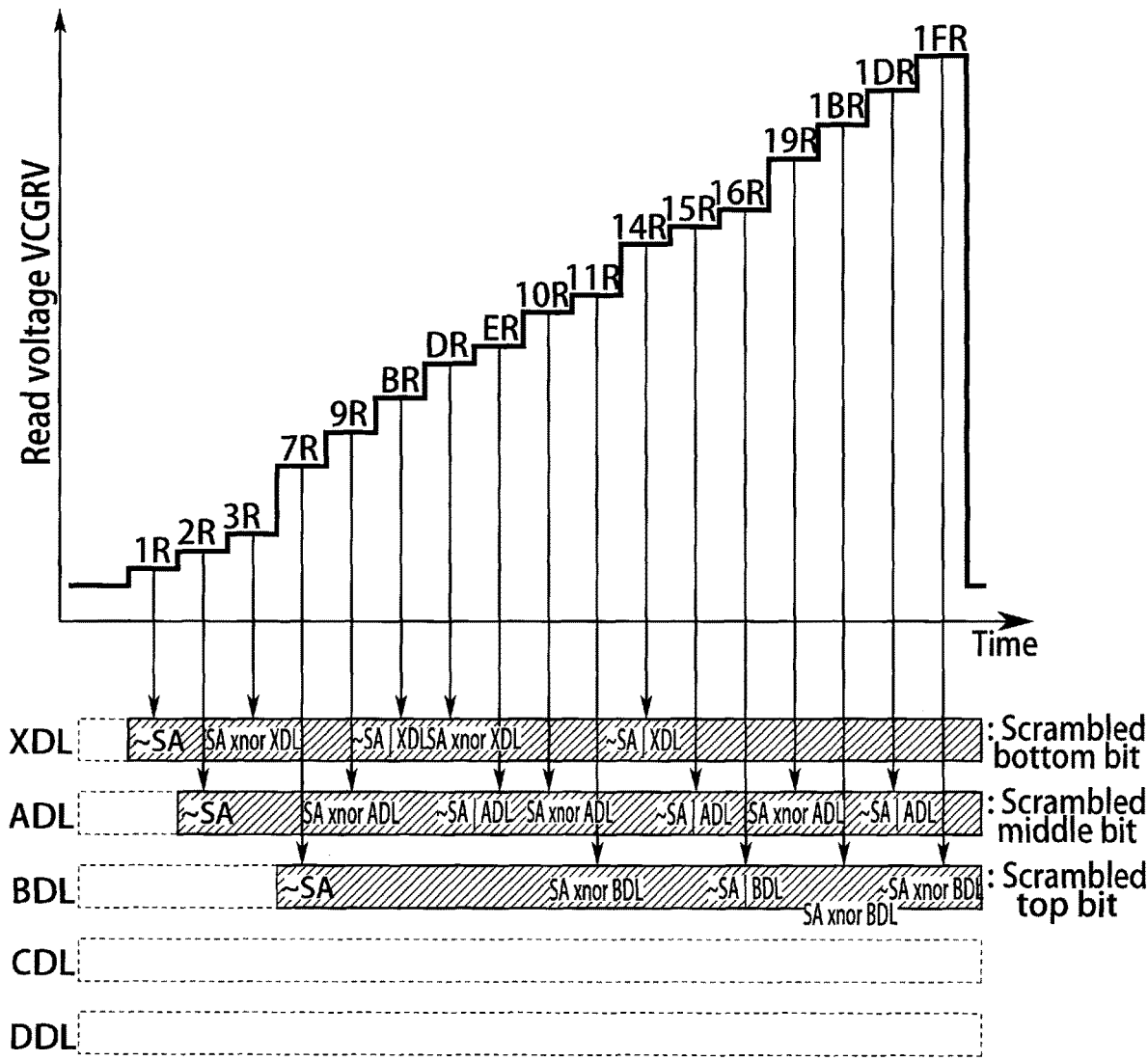
FIG. 33A and FIG. 33B are timing charts of various signals during a reading operation according to the seventh embodiment.

FIG. 33A is a timing chart of the case where the command sequence of FIG. 32A is issued, showing a change in potential of the selected word line WL and data held in each of the latch circuits in the sense amplifier 140, when step S31 in FIG. 20A is performed.

As illustrated, the row decoder 120 sequentially applies the voltages V1, V2, V3, V7, V9, VB, VD, VE, V10, V11, V14, V15, V16, V19, V1B, V1D, and V1F to the selected word line WL. As a result, the reading operations 1R, 2R, 3R, 7R, 9R, BR, DR, ER, 10R, 11R, 14R, 15R, 16R, 19R, 1BR, 1DR, and 1FR are sequentially performed. In the following, arithmetic operations in the respective reading operations and data held in each of the latch circuits in the sense amplifier 140 will be described.

Reading operation 1R: Read result SA is inverted and held by the latch circuit XDL.

$$XDL = \sim SA$$

Reading operation 2R: Read result SA is inverted and held by the latch circuit ADL.

$$ADL = \sim SA$$

Reading operation 3R: Read result SA is XNORed with the data held by the latch circuit XDL.
XDL=SA xnor XDL
Reading operation 7R: Read result SA is inverted and held by the latch circuit BDL.

$$BDL = \sim SA$$

Reading operation 9R: Read result SA is XNORed with the data held by the latch circuit ADL.

$$ADL = SA \; xnor \; ADL$$

Reading operation BR: Read result SA is inverted and ORed with the data held by the latch circuit XDL.

$$XDL = \sim SA \mid XDL$$

Reading operation DR: Read result SA is XNORed with the data held by the latch circuit XDL.

$$XDL = SA \; xnor \; XDL$$

Reading operation ER: Read result SA is inverted and ORed with the data held by the latch circuit ADL.

$$ADL = \sim SA \mid ADL$$

Reading operation 10R: Read result SA is XNORed with the data held by the latch circuit ADL.

$$ADL = SA \; xnor \; ADL$$

Reading operation 11R: Read result SA is XNORed with the data held by the latch circuit BDL.

$$BDL = SA \; xnor \; BDL$$

Reading operation 14R: Read result SA is inverted and ORed with the data held by the latch circuit XDL.

$$XDL = \sim SA \mid XDL$$

Reading operation 15R: Read result SA is inverted and ORed with the data held by the latch circuit ADL.

$$ADL = \sim SA \mid ADL$$

Reading operation 16R: Read result SA is inverted and ORed with the data held by the latch circuit BDL.

$$BDL = \sim SA \mid BDL$$

Reading operation 19R: Read result SA is XNORed with the data held by the latch circuit ADL.

$$ADL = SA \; xnor \; ADL$$

Reading operation 1BR: Read result SA is XNORed with the data held by the latch circuit BDL.

$$BDL = SA \; xnor \; BDL$$

Reading operation 1DR: Read result SA is inverted and ORed with the data held by the latch circuit ADL.

$$ADL = \sim SA \mid ADL$$

Reading operation 1FR: Read result SA is inverted and XNORed with the data held by the latch circuit BDL.

$$ADL = \sim SA \; xnor \; ADL$$

Of the data scrambled as described above, the scrambled bottom page data is established at the reading operation 14R, the scrambled middle page data is established at the reading operation 1DR, and the scrambled top page data is established at the reading operation 1FR.

Figure 33B:
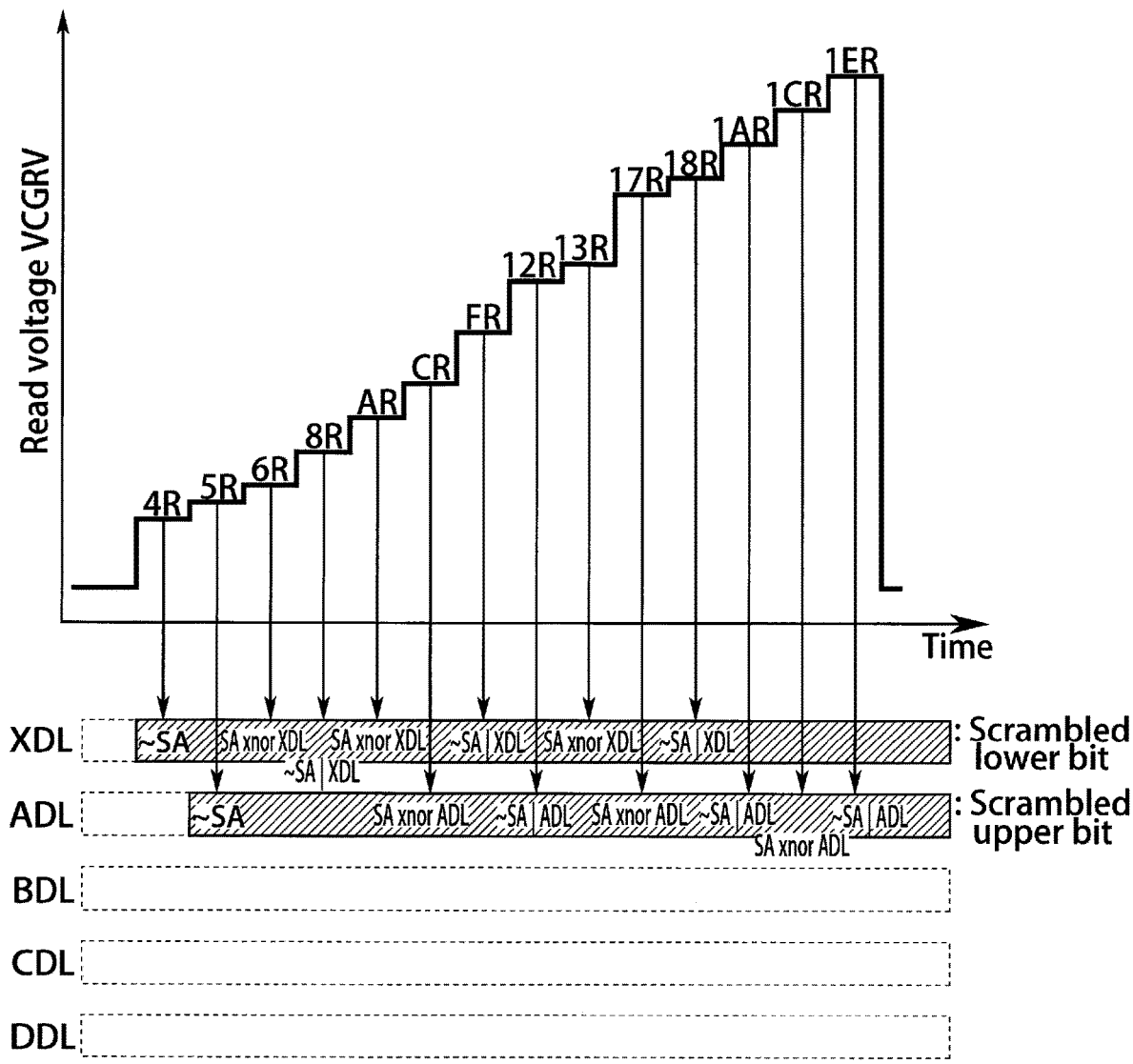

Next, the case in which the command sequence shown in FIG. 32B is issued will be described with reference to FIG. 33B. As illustrated, the row decoder 120 sequentially applies the voltages V4, V5, V6, V8, VA, VC, VF, V12, V13, V17, V18, V1A, V1C, and V1E to the selected word line WL. As a result, the reading operations 4R, 5R, 6R, 8R, AR, CR, FR, 12R, 13R, 17R, 18R, 1AR, 1CR, and 1ER are sequentially performed. In the following, arithmetic operations in the respective reading operations and data held in each of the latch circuits in the sense amplifier 140 will be described.

Reading operation 4R: Read result SA is inverted and held by the latch circuit XDL.

$$XDL = \sim SA$$

Reading operation 5R: Read result SA is inverted and held by the latch circuit ADL.

$$ADL = \sim SA$$

Reading operation 6R: Read result SA is XNORed with the data held by the latch circuit XDL.

$$XDL = SA\ xnor\ XDL$$

Reading operation 8R: Read result SA is ORed with the data held by the latch circuit XDL.

$$XDL = \sim SA\ |\ XDL$$

Reading operation AR: Read result SA is XNORed with the data held by the latch circuit XDL.

$$XDL = SA\ xnor\ XDL$$

Reading operation CR: Read result SA is XNORed with the data held by the latch circuit ADL.

$$ADL = SA\ xnor\ ADL$$

Reading operation FR: Read result SA is inverted and ORed with the data held by the latch circuit XDL.

$$XDL = \sim SA\ |\ XDL$$

Reading operation 12R: Read result SA is inverted and ORed with the data held by the latch circuit ADL.

$$ADL = \sim SA\ |\ ADL$$

Reading operation 13R: Read result SA is XNORed with the data held by the latch circuit XDL.

$$ADL = SA\ xnor\ ADL$$

Reading operation 17R: Read result SA is XNORed with the data held by the latch circuit ADL.

$$ADL = SA\ xnor\ ADL$$

Reading operation 18R: Read result SA is inverted and ORed with the data held by the latch circuit XDL.

$$XDL = \sim SA\ |\ XDL$$

Reading operation 1CR: Read result SA is XNORed with the data held by the latch circuit ADL.

$$ADL = SA\ xnor\ ADL$$

Reading operation 1ER: Read result SA is inverted and ORed with the data held by the latch circuit ADL.

$$ADL = \sim SA\ |\ ADL$$

Of the data scrambled as described above, the scrambled lower page data is established at the reading operation 18R, and the scrambled upper page data is established at the reading operation 1ER.

7.3 Advantageous Effects According to Present Embodiment

The method of the present embodiment described above, for example, may be used as the data scramble method.

In this embodiment described above, the command sequences shown in FIG. 32A and FIG. 32B are used in reading operations. However, for example, necessary data (latch circuits) may be designated in the command sequences, as in the examples illustrated in FIG. 23A, FIG. 23B, and FIG. 23C concerning the fifth embodiment. Such a case will be described with reference to command sequences shown in FIG. 34A and FIG. 34B.

Figure 34A:
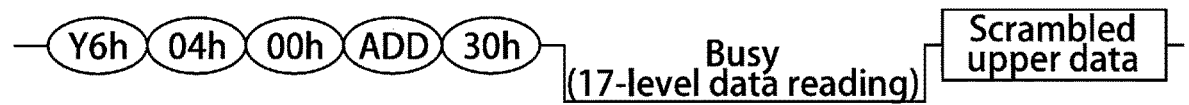
FIG. 34A and FIG. 34B are schematic diagrams illustrating read command sequences according to a modification of the seventh embodiment.

FIG. 34A shows a case in which the controller 200 requests the scrambled upper page data (U0/L1/U2/L3/As illustrated in FIG. 34A, the controller 200 issues a command "04h" designating the upper page following the command "Y6h". Then, for example, the sequencer 170 of the NAND flash memory 100 reads the scrambled upper page data (L0/U1/L2/ . . . U15) from the memory cell array 110 through the partial sequential reading, and causes the latch circuit XDL to hold the data. Accordingly, after the NAND flash memory 100 returns to the ready state, the controller 200 toggles the read enable signal REn, thereby reading the scrambled upper page data.

Figure 34B:
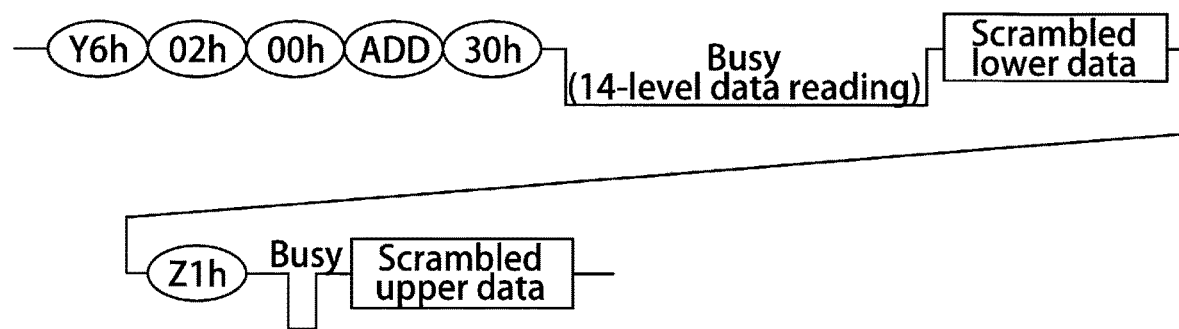

FIG. 34B shows a case in which the controller 200 requests the scrambled lower page (L0/U1/L2/U3/ . . . U15)

and the scrambled upper page (U0/L1/U2/L3/ . . . L15). As illustrated in FIG. 34B, the controller 200 issues a command "02h" designating the lower page following the command "Y6h". Then, for example, the sequencer 170 of the NAND flash memory 100 causes the latch circuit XDL to hold the scrambled lower page data (L0/U1/L2/U3/ . . . U15) read from the memory cell array 110 through the partial sequential reading, and causes the latch circuit ADL to hold the scrambled upper page data (U0/L1/U2/L3/ . . . L15) read from the memory cell array 110 through the partial sequential reading. As a result, the controller 200 can read the scrambled lower page data, and furthermore, the controller 200 issues the command "Z1h", so that the scrambled upper page data in the latch circuit ADL can be transferred to the latch circuit XDL and then read.

8. Eighth Embodiment

Next, a semiconductor memory device according to an eighth embodiment will be described. In the eighth embodiment, the fifth to seventh embodiments are applied to a semiconductor memory device including a memory cell configured to hold 4-bit data. In the following description, only the matters different from the fifth to seventh embodiments will be described.

8.1 Data Held in Memory Cell Transistor and Threshold Voltage

Figure 35:
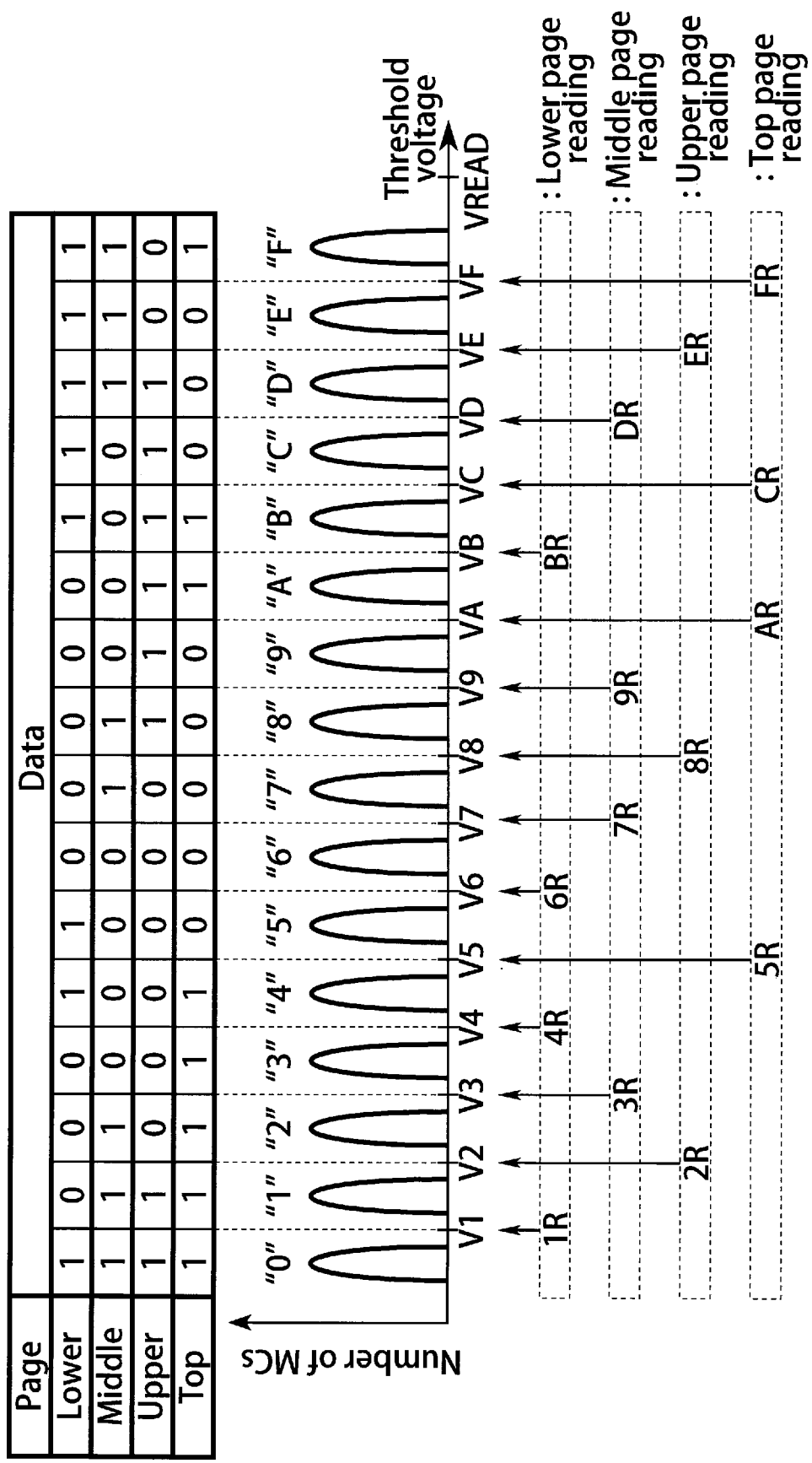
FIG. 35 is a diagram illustrating possible data, a threshold distribution, and read voltages for memory cells according to an eighth embodiment.

Data held in memory cell transistors MT, threshold voltages and read voltages of the respective data, according to the present embodiment, will be explained with reference to FIG. 35. FIG. 35 is a diagram illustrating possible data, threshold distribution, and voltages used in reading of memory cell transistors MT.

As described above, the memory cell transistors MT can take 16 states in accordance with their threshold voltages, that is, the "0" state to the "F" state in the first embodiment. The threshold distribution is obtained by writing 4-bit (4-page) data constituted by the lower bit, middle bit, upper bit, and top bit. The relationship between the above 16 states and the lower bit, middle bit, upper bit, and top bit is as follows:
"0" state: "1111" (represented in the order of "top/upper/middle/lower")
"1" state: "1110"
"2" state: "1010"
"3" state: "1000"
"4" state: "1001"
"5" state: "0001"
"6" state: "0000"
"7" state: "0010"
"8" state: "0110"
"9" state: "0100"
"A" state: "1100"
"B" state: "1101"
"C" state: "0101"
"D" state: "0111"
"E" state: "0011"
"F" state: "1011"
In this embodiment also, only one of the four bits is different between data corresponding to adjacent two states.

Accordingly, as shown in FIG. 35, the lower page is read by reading operations 1R, 4R, 6R, and BR using the voltages V1, V4, V6, and VB. The middle page is read by reading operations 3R, 7R, 9R, and DR using the voltages V3, V7, V9, and VD. The upper page is read by reading operations 2R, 8R, and ER using the voltages V2, V8, and VE. The upper page is read by reading operations 5R, AR, CR and FR using the voltages V5, VA, VC, and VF. Thus, the present embodiment uses "3-4-4-4 mapping".

8.2 Data Writing Operation

The method of writing data in the present embodiment is basically the same as that shown in FIG. 15 relating to the fifth embodiment. The present embodiment differs from the fifth embodiment in the following respects.
Data Scramble Method
In this embodiment, data is scrambled by exchanging bits among 4 pages (top, upper, middle, and lower pages), which are assigned to one word line WL in step S23 in FIG. 15. Therefore, in the case of FIG. 16, the data units DU0 to DU3 and their parities are scrambled, and data PG0 to PG3 to be written in the respective pages of the word line WL0 are generated. Furthermore, the data units DU4 to DU7 and their parities are scrambled, and data PG4 to PG7 to be written in the word line WL1 are generated. Furthermore, the data units DU8 to DU11 and their parities are scrambled, and data PG8 to PG11 to be written in the word line WL2 are generated. Subsequently, similar operations are performed.

Figure 36A:
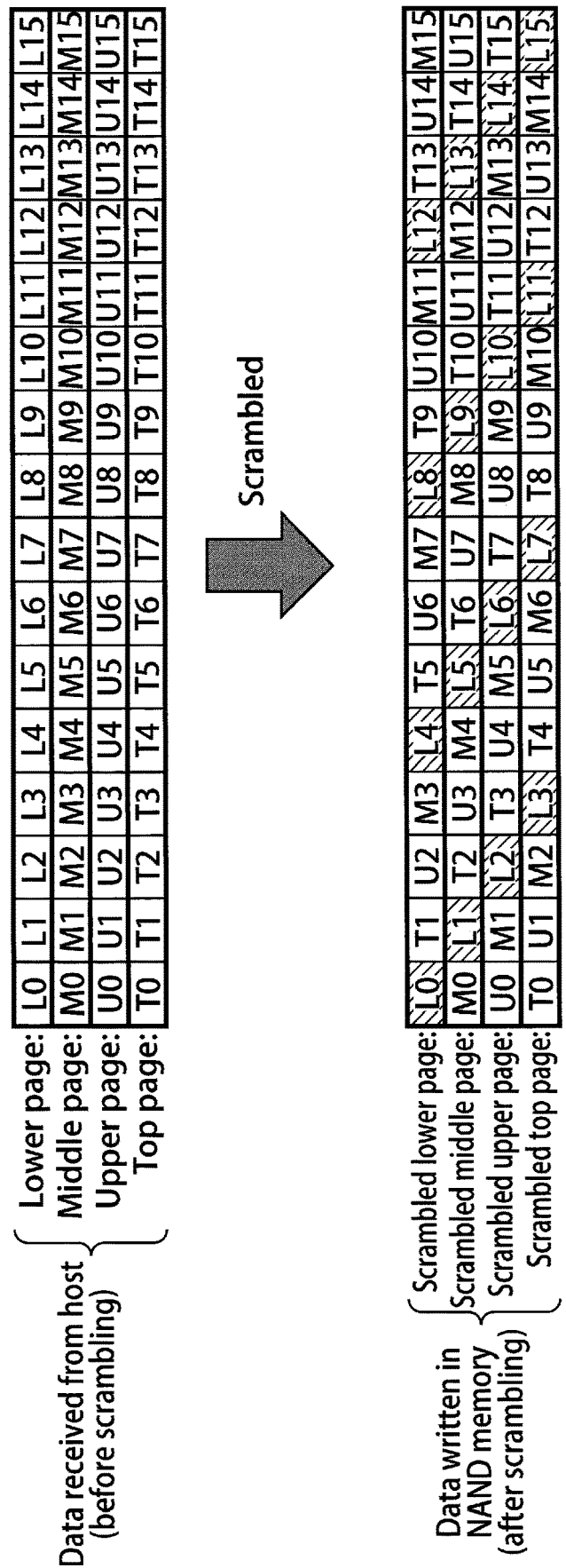
FIG. 36A is a conceptual diagram illustrating a data scramble method according to the eighth embodiment.

The scramble method of the present embodiment is the full page scramble method of the fifth embodiment described above. FIG. 36A corresponds to FIG. 17 used in the explanation of the fifth embodiment. The upper part in FIG. 36A represents data before scrambling (data units DU and parities). The lower part in FIG. 36A represents data after scrambling (data units DU and parities). Also in the lower part in FIG. 36A, for reference, the lower bits before scrambling are represented with diagonal lines.

As shown in the upper part in FIG. 36A, the data before scrambling of this embodiment is the same as that shown in the upper part of FIG. 17 except that the bottom page is omitted.

In the data after scrambling shown in the lower part in FIG. 36A, the lower page corresponds to the data PG0, the middle page corresponds to the data PG1, the upper page corresponds to the data PG2, and the top page corresponds to the data PG3. As shown, the data of the least significant bit (first bit) (T0/U0/M0/L0) remain unchanged. The data of the second bit (T1/U1/M1/L1) is shifted by one bit between pages. Specifically, the lower bit is replaced by the top bit T1, the middle bit is replaced by the lower bit L1, the upper bit is replaced by the middle bit M1, and the top bit is replaced by the upper bit U1. The data of the third bit (T2/U2/M2/L2) is shifted further by one bit between pages. In other words, the lower bit is replaced by the upper bit U2, the middle bit is replaced by the top bit T2, the upper bit is replaced by the lower bit L2, and the top bit is replaced by the middle bit M2. The same applies to the fourth and subsequent bits.

As a result of the scrambling described above, the lower page (data PG0), the middle page (data PG1), the upper page (data PG2), and the top page (data PG3) are generated as follows:
PG0:<L0/T1/U2/M3/L4/T5/U6/M7/L8/T9/U10/M11/L12/T13/U14/M15>
PG1:<M0/L1/T2/U3/M4/L5/T6/U7/M8/L9/T10/U11/M12/L13/T14/U15>
PG2:<U0/M1/L2/T3/U4/M5/L6/T7/U8/M9/L10/T11/U12/M13/L14/T15>
PG3:<T0/U1/M2/L3/T4/U5/M6/L7/T8/U9/M10/L11/T12/U13/M14/L15>

Thus, the data is scrambled by exchanging bits among all pages (in this example, 4 pages) assigned to one word line WL. Furthermore, in the following description, the lower page, the middle page, the upper page, and the top page in the scrambled data may be referred to as the scrambled lower page, the scrambled middle page, the scrambled upper page, and the scrambled top page.

Figure 36B:
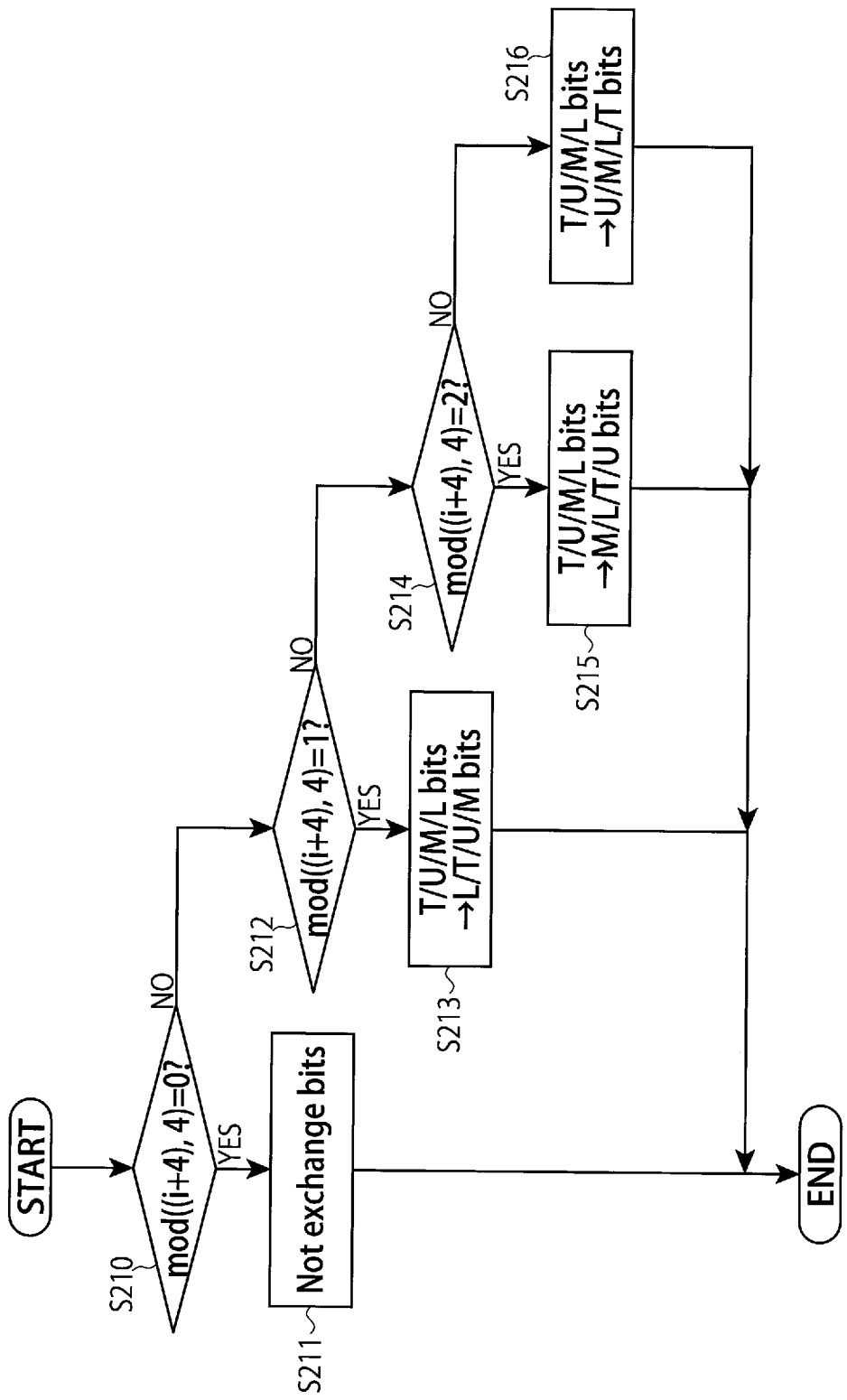
FIG. 36B is a flowchart illustrating the data scramble method according to the eighth embodiment.

FIG. 36B is a flowchart of the scrambling process, and corresponds to FIG. 18 described above for the fifth embodiment. As depicted, for example, the processor 230 determines a bit line BL corresponding to each bit of write data. In the case of a bit line BL of the number corresponding to a multiple of 4, namely, if the remainder of dividing (i+4) by 4 is 0 (YES in step S210), the bits are not exchanged among the pages (step S211). Therefore, the top, upper, middle, and lower bits corresponding to BL0, BL4, BL8, and BL12 are all maintained as the top, upper, middle, and lower bits even after the scrambling.

In the case of mod((i+4),4)=1 (YES in step S212), the top, upper, middle, and lower bits corresponding to BL1, BL5, BL9 and BL13 respectively change to the lower, top, upper, and middle bits in the data after the scrambling (step S213). In other words, the top, upper, middle, and lower bits in the data after the scrambling are respectively replaced by the upper, middle, lower, and top bits in the data before the scrambling.

In the case of mod((i+4),4)=2 (YES in step S214), the top, upper, middle, and lower bits corresponding to BL2, BL6, BL10, and BL14 respectively change to the middle, lower, top, and upper bits in the data after the scrambling (step S215). In other words, the top, upper, middle, and lower bits in the data after the scrambling are respectively replaced by the middle, lower, top, and upper bits in the data before the scrambling.

In the case of mod((i+5),5)=3 (NO in step S214), the top, upper, middle, and lower bits corresponding to BL3, BL7, BL11, and BL15 respectively change to the upper, middle, lower, and top bits in the data after the scrambling (step S216). In other words, the top, upper, middle, and lower bits in the data after the scrambling are respectively replaced by the lower, top, upper, and middle bits in the data before the scrambling.

Thus, the scrambled data is generated by exchanging the respective bits of data of the top, upper, middle, and lower bits among the four pages. In the example described above, the data are exchanged for each bit. However, the data may be exchanged in units of columns, not for each bit as described above for the fifth embodiment. The scramble method is not particularly limited to the rule shown in FIG. 36B, but may be any method as long as bits can be exchanged among a plurality of pages.

Write Command Sequences

Write command sequences of the present embodiments are substantially the same as those of the fifth embodiment described with reference to FIG. 27, except that in the first to fifth sequences SQ1 to SQ5, the lower page, middle page, upper page, and top page of the scrambled data are transmitted. In this example also, since the controller 200 scrambles the data, the command "X1h" may not necessarily be issued.

8.3 Data Reading Operation

The method of reading data in the present embodiment is basically the same as that shown in FIG. 20A relating to the fifth embodiment. The present embodiment differs from the fifth embodiment in the following respects.

Read Command Sequences

The read command sequences issued in step S25 are substantially the same as those of the fifth embodiment described with reference to FIG. 21, except that the data is transmitted in the order of the lower page, the middle page, the upper page, and the top page. Also in the present embodiment, it is the controller 200 that decodes the read scrambled data, whereas the NAND flash memory 100 performs the normal sequential reading. Therefore, the command "Y1h" may be omitted. In the case of using the method of FIG. 20B, the following command sequence shown in FIG. 21 is issued in the step S25-2 to S25-5:

<Y1h><00h><ADD><30h>.

As a result, the page designated by the address ADD is read. Step S25-1 is skipped.

Reading Operation in NAND Flash Memory 100

In the present embodiment also, full sequential reading is performed in step S31. As a result, the lower bit, middle bit, upper bit, and top bit of the scrambled data are respectively held by the latch circuits XDL, ADL, BDL, and CDL of the sense amplifier 140.

Figure 37:
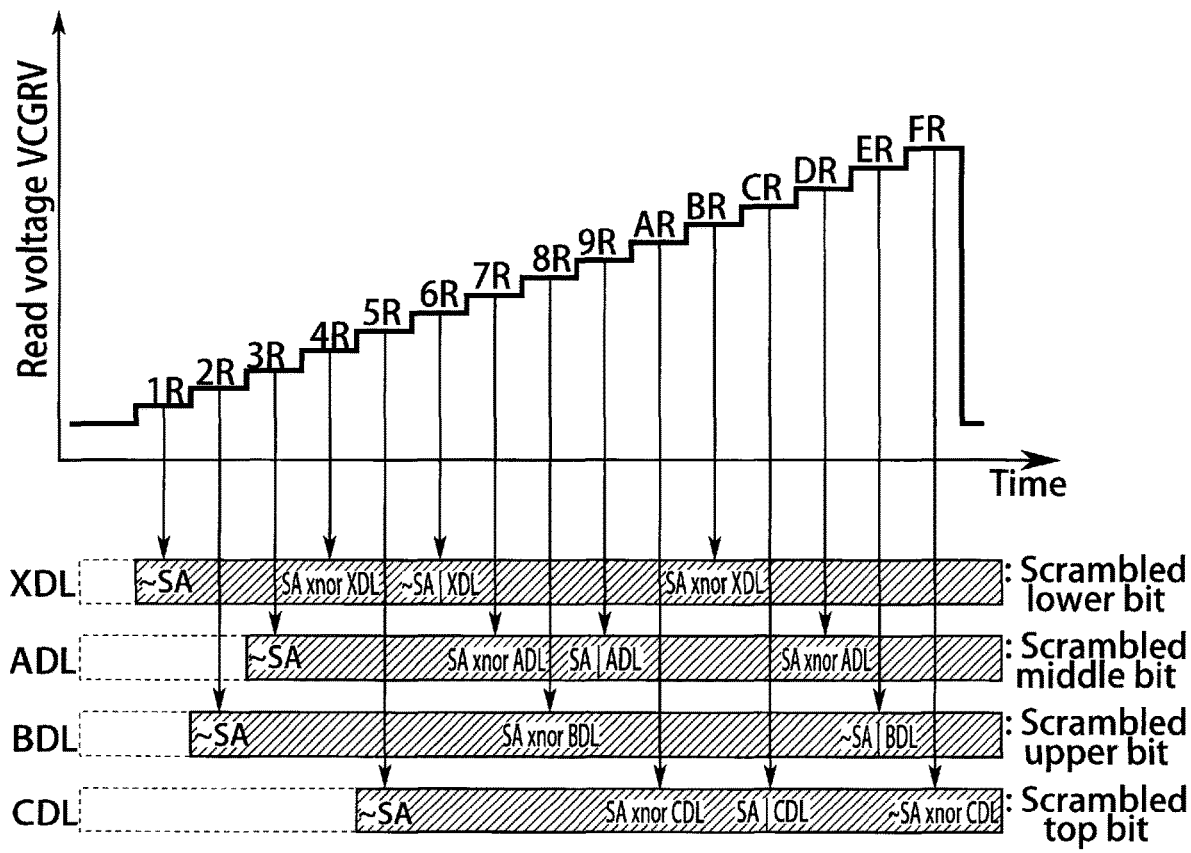
FIG. 37 is a timing chart of various signals during a reading operation according to the eighth embodiment.

FIG. 37 is a timing chart showing a change in potential of the selected word line WL and data held in each of the latch circuits in the sense amplifier 140, when step S31 is performed. FIG. 37 corresponds to FIG. 22A used in the explanation of the fifth embodiment.

As illustrated, the row decoder 120 sequentially applies the voltages V1 to VF to the selected word line WL. As a result, the reading operations 1R to FR are sequentially performed, and the following arithmetic operations are performed.

Reading operation 1R: Read result SA is inverted and held by the latch circuit XDL.

$$XDL = \sim SA$$

Reading operation 2R: Read result SA is inverted and held by the latch circuit BDL.

$$BDL = \sim SA$$

Reading operation 3R: Read result SA is inverted and held by the latch circuit ADL.

$$ADL = \sim SA$$

Reading operation 4R: Read result SA is XNORed with the data held by the latch circuit XDL.

$$XDL = SA \text{ xnor } XDL$$

Reading operation 5R: Read result SA is inverted and held by the latch circuit CDL.

$$CDL = \sim SA$$

Reading operation 6R: Read result SA is inverted and ORed with the data held by the latch circuit XDL.

$$XDL = {\sim} SA \mid XDL$$

Reading operation 7R: Read result SA is XNORed with the data held by the latch circuit ADL.

$$ADL = SA \text{ xnor } ADL$$

Reading operation 8R: Read result SA is XNORed with the data held by the latch circuit BDL.

$$BDL = SA \text{ xnor } BDL$$

Reading operation 9R: Read result SA is XNORed with the data held by the latch circuit ADL.

$$ADL = SA \text{ xnor } ADL$$

Reading operation AR: Read result SA is XNORed with the data held by the latch circuit CDL.

$$CDL = SA \text{ xnor } CDL$$

Reading operation BR: Read result SA is XNORed with the data held by the latch circuit XDL.

$$XDL = SA \text{ xnor } XDL$$

Reading operation CR: Read result SA is ORed with the data held by the latch circuit CDL.

$$CDL = SA \mid CDL$$

Reading operation DR: Read result SA is XNORed with the data held by the latch circuit ADL.

$$ADL = SA \text{ xnor } ADL$$

Reading operation ER: Read result SA is inverted and ORed with the data held by the latch circuit BDL.

$$BDL = {\sim} SA \mid BDL$$

Reading operation FR: Read result SA is inverted and XNORed with the data held by the latch circuit CDL.

$$CDL = {\sim} SA \text{ xnor } CDL$$

In the manner described above, the lower bit (L0/T1/U2/M3/L4 . . . M15) is established at the reading operation BR, and held by the latch circuit XDL. The middle bit (M0/L1/T2/U3/M4 . . . U15) is established at the reading operation DR, and held by the latch circuit ADL. The upper bit (U0/M1/L2/T3/U4 . . . T15) is established at the reading operation ER, and held by the latch circuit BDL. The top bit (T0/U1/M2/L3/T4 . . . L15) is established at the reading operation FR, and held by the latch circuit CDL.

8.4 Advantageous Effects According to Present Embodiment

As described above, the data scramble method of the fifth embodiment is applicable to a case in which the memory cell transistor holds 4-bit data, and produces similar advantageous effects.

Also, the pages (latch circuits) to be read may be designated in the command sequences in the reading time, as in the examples illustrated in FIG. 23A, FIG. 23B, and FIG. 23C concerning the fifth embodiment.

For example, in a case in which the controller 200 requests the scrambled upper page (U0/M1/L2/T3/U4/ . . . T15), the command sequence illustrated in FIG. 23A can be used. In this case, the upper page is designated by issuing the command "03h" in place of the command "04h" in FIG. 23A. As a result, the scrambled upper page (U0/M1/L2/T3/U4 . . . T15) is held by the latch circuit XDL.

When the controller 200 requests the scrambled lower page (L0/T1/U2/M3/L4 . . . M15) and the scrambled upper page (U0/M1/L2/T3/U4 . . . T15), the command sequence of FIG. 23B described above can be used. In this case, the lower page is designated by issuing the command "01h" in place of the command "02h" in FIG. 23B. As a result, the scrambled lower page (L0/T1/U2/M3/L4 . . . M15) is held by the latch circuit XDL, and the scrambled upper page (U0/M1/L2/T3/U4 . . . T15) is held by the latch circuit BDL. After reading the scrambled lower page, the controller 200 is able to read the scrambled upper page by issuing the command "Z1h" twice.

Furthermore, when the controller 200 requests the scrambled top page (T0/U1/M2/L3/T4 . . . L15) and the scrambled upper page (U0/M1/L2/T3/U4 . . . T15), the command sequence of FIG. 23C described above can be used. In this case, the top page is designated by issuing the command "04h" in place of the command "05h" in FIG. 23C. As a result, the scrambled top page (T0/U1/M2/L3/T4 . . . L15) is held by the latch circuit XDL. The scrambled lower page (L0/T1/U2/M3/L4 . . . M15), the scrambled middle page (M0/L1/T2/U3/M4 . . . U15), and the scrambled upper page (U0/M1/L2/T3/U4 . . . T15) are respectively held by the latch circuits ADL, BDL, and CDL. Therefore, after reading the scrambled top page, the controller 200 is able to read the scrambled upper page by issuing the command "Z1h" three times.

As illustrated in FIG. 24 and FIG. 25 for the fifth embodiment, the command sequences at the time of reading may directly designate the page instead of designating data to be read from the sense amplifier 140 for the second and subsequent pages with the number of times of issuance of the command "Z1h".

If the controller 200 reads only one page, for example, the scrambled upper page, the reading is performed in the same manner as described above with reference to FIG. 23A. That is, the command "03h" designating the upper page is issued following the command "Y1h", and as a result, the scrambled upper page is held by the latch circuit XDL.

When the controller 200 requests the scrambled lower page (L0/T1/U2/M3/L4 . . . M15) and the scrambled upper page (U0/M1/L2/T3/U4 . . . T15), the command sequence of FIG. 24 described above can be used. In this case, the command "01h" is issued in place of the command "02h" in FIG. 24, so that the scrambled lower page is held by the latch circuit XDL. Subsequently, the command "03h" is issued in place of the command "04h", and thereafter the command Z1h" is issued, so that the scrambled upper page in the latch circuit BDL is transferred to the latch circuit XDL.

When the controller 200 requests the scrambled top page and the scrambled upper page, the command sequence of FIG. 25 described above can be used. In this case, the command "04h" is issued in place of the command "05h" in FIG. 25, so that the scrambled top page is held by the latch circuit XDL. Subsequently, the command "03h" is issued in place of the command "04h", and thereafter the command Z1h" is issued, so that the scrambled upper page in the latch circuit BDL is transferred to the latch circuit XDL.

9. Ninth Embodiment

Next, a semiconductor memory device according to a ninth embodiment will be described. The present embodiment relates to a data scramble method that differs from the eighth embodiment. In the following description, only the matters different from the eighth embodiment will be described. The mapping of the data in this embodiment is "3-4-4-4" mapping, which is described above with reference to FIG. 35 relating to the eighth embodiment.

9.1 Data Writing Operation

The basic flow of the data writing operation is the same as that in the eighth embodiment. The present embodiment differs from the eighth embodiment in data scrambling method.

Figure 38:
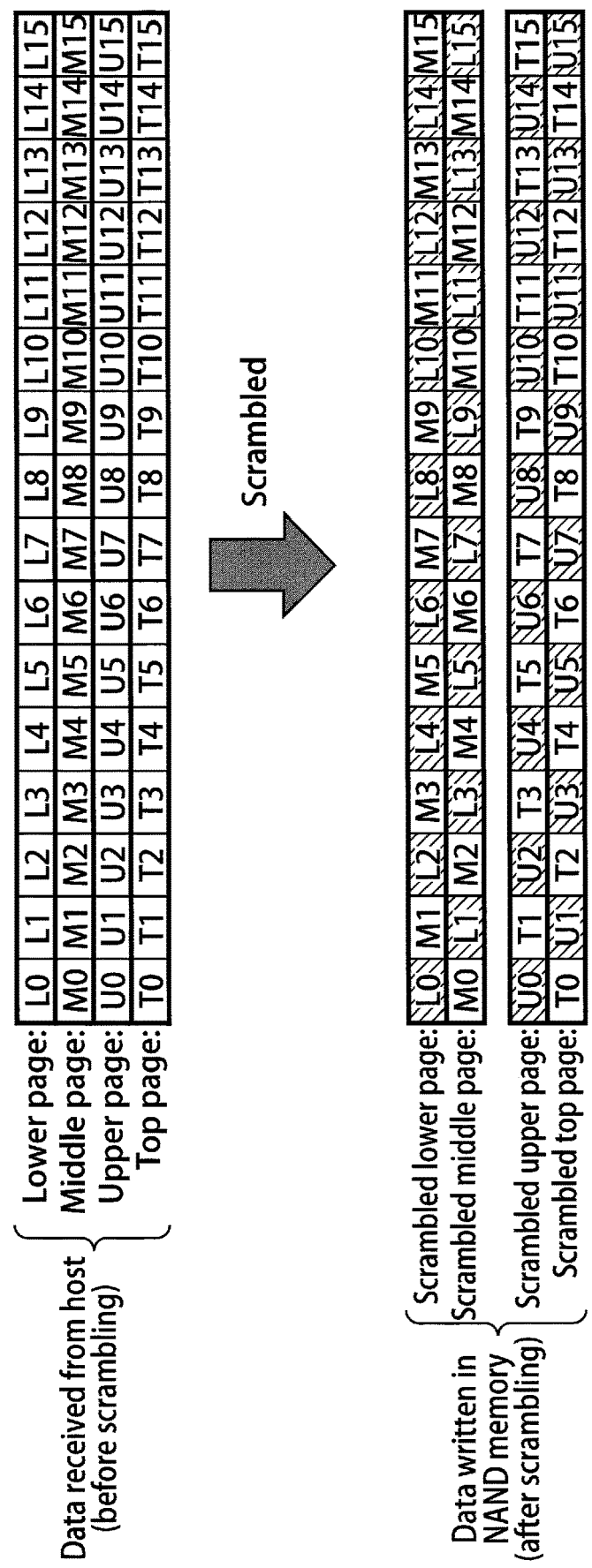
FIG. 38 is a conceptual diagram illustrating a data scramble method according to a ninth embodiment.

The scrambling method of this embodiment is (2+2) scrambling that uses a partial page scramble method. The (2+2) scrambling is a method of randomizing data by exchanging bits between two pages of four pages assigned to one word line, and further exchanging bits between the other two pages. FIG. 38 corresponds to FIG. 36A used in the explanation of the eighth embodiment. The upper part of FIG. 38 represents data before scrambling, and the lower part of FIG. 38 represents data after scrambling. In the data after scrambling in FIG. 38, for reference, the lower and upper bits before scrambling are represented with diagonal lines.

As illustrated in FIG. 31, the scrambling method of the present embodiment is performed as follows:

The lower page and the middle page are scrambled, so that the lower page and middle page of scrambled data are generated. At this time, lower bits are replaced by middle bits at every other bit, and middle bits are replaced by lower bits at every other bit.

The upper page and the top page are scrambled, so that the upper page and the top page of scrambled data are generated. At this time, upper bits are replaced by top bits at every other bit, and top bits are replaced by upper bits at every other bit.

As a result of the scrambling described above, the lower page (data PG0 mentioned in FIG. 16), the middle page (data PG1), the upper page (data PG2), and the top page (data PG3) are generated as follows:
PG0:<L0/M1/L2/M3/L4/M5/L6/M7/L8/M9/L10/M11/L12/ M13/L14/M15>
PG1:<M0/L1/M2/L3/M4/L5/M6/L7/M8/L9/M10/L11/ M12/L13/M14/L15>
PG2:<U0/T1/U2/T3/U4/T5/U6/T7/U8/T9/U10/T11/U12/ T13/U14/T15>
PG3:<T0/U1/T2/U3/T4/U5/T6/U7/T8/U9/T10/U11/T12/ U13/T14/U15>

In the (2+2) scrambling, the pages that are scrambled between 2 pages are not limited to those shown in FIG. 38. For example, the middle page and the upper page may be scrambled, and further the lower page and the top page may be scrambled. Thus, the pages to be scrambled are not particularly limited. Furthermore, the data may be exchanged between pages in units of columns or in any other units, not in units of bits, as described above in connection with the fifth embodiment.

The write command sequences issued in step S24 are the same as those described for the eighth embodiment, except that the command "X2h" is issued as a prefix command. The command "X2h" in this embodiment declares to the NAND flash memory 100 that the (2+2) scrambling that uses a partial page scramble method is performed. Then, the full sequence program using data for the scrambled four pages represented in the lower part of FIG. 38 is executed. In this embodiment, the issuance of the command "X2h" may be omitted.

9.2 Data Reading Operation

Next, a method of reading the scrambled data will be described. Read command sequences issued by step S25 are substantially the same as those of the sixth embodiment described with reference to FIG. 28A and FIG. 28C, while the meaning of the prefix command and data to be read are different from those of the sixth embodiment.

For example, when the scrambled lower page (L0/M1/ L2/ . . . M15) and the scrambled middle page (M0/L1/ M2/ . . . L15) are to be read, the controller 200 issues a command sequence shown in FIG. 28A. However, the prefix command "Y2h" declares to the NAND flash memory 100 that the (2+2) scrambling that uses the partial page scramble method is used and the scrambled lower page (L0/M1/ L2/ . . . M15) and the scrambled middle page (M0/L1/ M2/ . . . L15) are designated. Subsequently, as in the sixth embodiment, the command "00h", the address ADD and the command "30h" are issued. Then, the NAND flash memory 100 is set to the busy state, and in response to the command "Y2h", performs the partial sequential reading to read the scrambled lower page and the scrambled middle page. As a result, the scrambled lower page (L0/M1/L2/ . . . M15) is held by the latch circuit XDL, and the scrambled middle page (M0/L1/M2/ . . . L15) is held by the latch circuit ADL. After reading the scrambled lower page, the controller 200 is able to read the scrambled middle page by issuing the command "Z1h". Also in this embodiment, "Y1h" may be omitted.

On the other hand, when the scrambled upper page (U0/T1/U2/ . . . T15) and the scrambled top page (T0/U1/ T2/ . . . U15) are to be read, the controller 200 issues a command sequence shown in FIG. 28C. However, the command "Y3h" is issued in place of the prefix command "Y4h". The command "Y3h" declares to the NAND flash memory 100 that the (2+2) scrambling that uses the partial page scramble method is used and the scrambled upper page (U0/T1/U2/ . . . T15) and the scrambled top page (T0/U1/T2/ . . . U15) are designated. Subsequently, as in the sixth embodiment, the command "00h", the address ADD and the command "30h" are issued. Then, the NAND flash memory 100 is set to the busy state, and in response to the command "Y3h", performs the partial sequential reading to read the scrambled upper page and the scrambled top page. As a result, the scrambled upper page (U0/T1/U2/ . . . T15) is held by the latch circuit XDL, and the scrambled top page (T0/U1/T2/ . . . U15) is held by the latch circuit ADL. After reading the scrambled upper page, the controller 200 is able to read the scrambled top page by issuing the command "Z1h". Also in this embodiment, "Y3h" may be omitted.

Figure 39A:
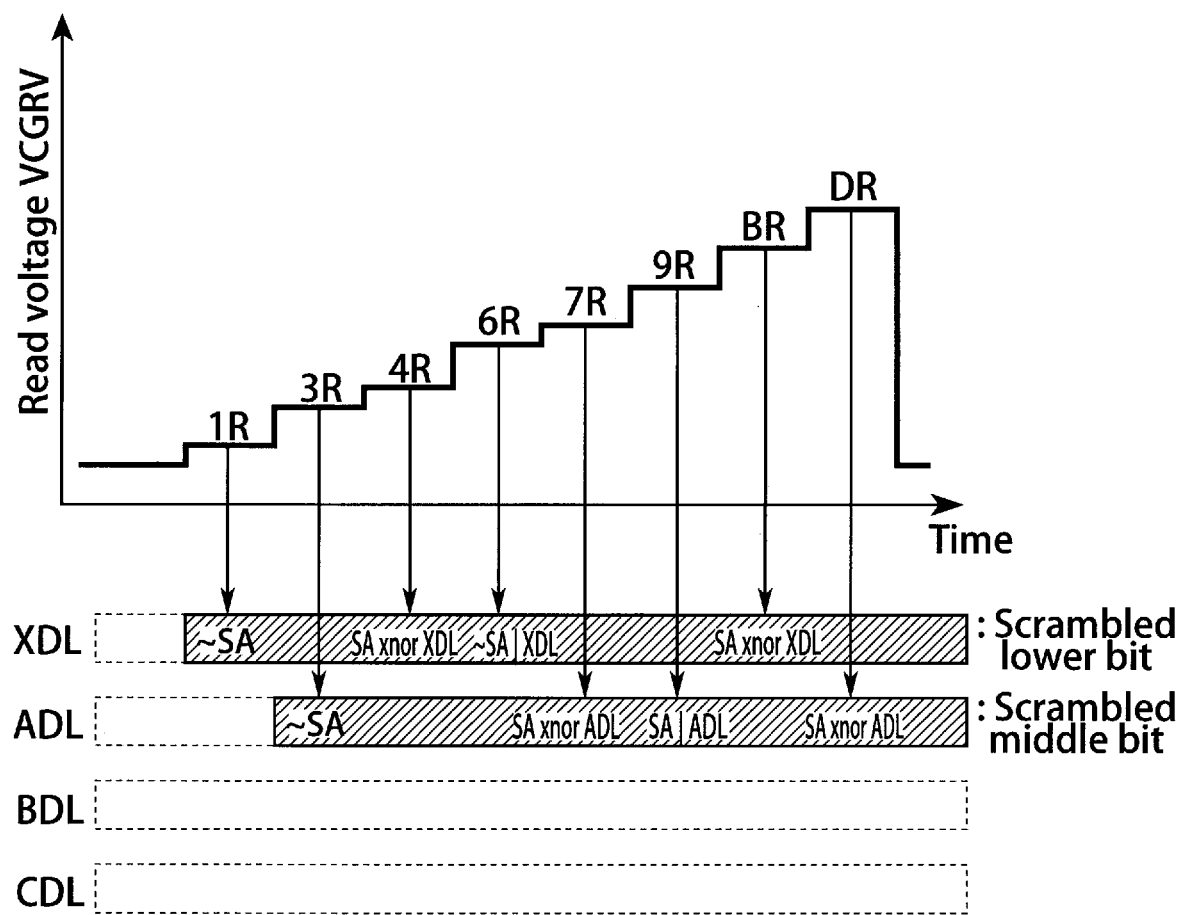
FIG. 39A and FIG. 39B are timing charts of various signals during a reading operation according to the ninth embodiment.

FIG. 39A is a timing chart of the case where the command sequence of FIG. 28A described above is issued, showing a change in potential of the selected word line WL and data held in each of the latch circuits in the sense amplifier 140, when step S31 in FIG. 20A is performed.

As illustrated, the row decoder 120 sequentially applies the voltages V1, V3, V4, V6, V7, V9, VB and VD to the selected word line WL. As a result, the reading operations 1R 3R, 4R, 6R, 7R, 9R, BR, and DR are sequentially performed. In the following, arithmetic operations in the respective reading operations and data held in each of the latch circuits in the sense amplifier 140 will be described.

Reading operation 1R: Read result SA is inverted and held by the latch circuit XDL.

$$XDL = \sim SA$$

Reading operation 3R: Read result SA is inverted and held by the latch circuit ADL.

$$ADL = \sim SA$$

Reading operation 4R: Read result SA is XNORed with the data held by the latch circuit XDL.

$$XDL = SA \; xnor \; XDL$$

Reading operation 6R: Read result SA is inverted and ORed with the data held by the latch circuit XDL.

$$XDL = \sim SA \,|\, XDL$$

Reading operation 7R: Read result SA is XNORed with the data held by the latch circuit ADL.

$$ADL = SA \; xnor \; ADL$$

Reading operation 9R: Read result SA is ORed with the data held by the latch circuit ADL.

$$ADL = \sim SA \,|\, ADL$$

Reading operation BR: Read result SA is XNORed with the data held by the latch circuit XDL.

$$XDL = SA \; xnor \; XDL$$

Reading operation DR: Read result SA is XNORed with the data held by the latch circuit ADL.

$$ADL = SA \; xnor \; ADL$$

As described above, the scrambled lower bit (L0/M1/L2/ . . . M15) is established by the reading operation BR and held by the latch circuit XDL, and the scrambled middle bit (M0/L1/M2/ . . . L15) is established by the reading operation DR and held by the latch circuit ADL.

Figure 39B:
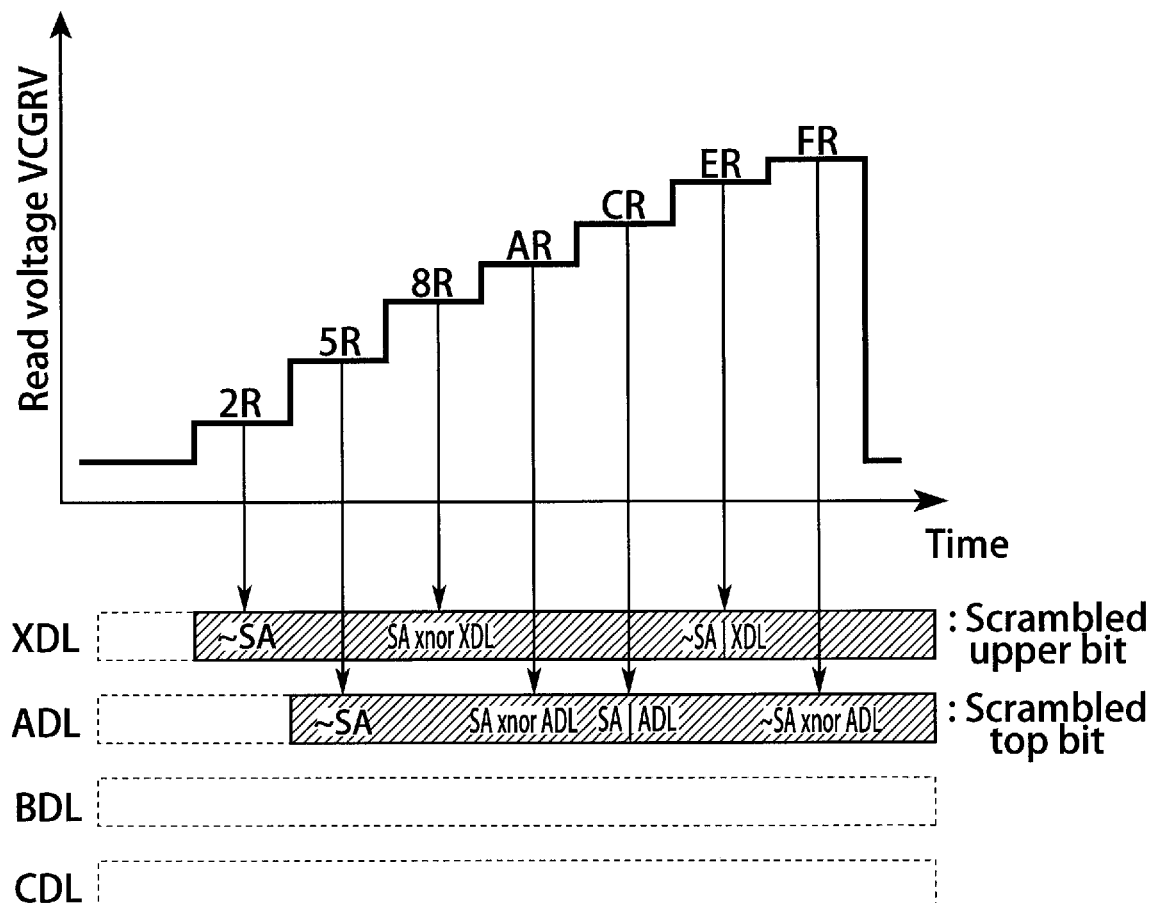

FIG. 39B is a timing chart of the case where the command sequence of FIG. 28B is issued, showing a change in potential of the selected word line WL and data held in each of the latch circuits in the sense amplifier 140, when step S31 in FIG. 20A is performed.

As illustrated, the row decoder 120 sequentially applies the voltages V2, V5, V8, VA, VC, VE, and VF to the selected word line WL. As a result, the reading operations 2R, 5R, 8R, AR, CR, ER, and FR are sequentially performed. In the following, arithmetic operations in the respective reading operations and data held in each of the latch circuits in the sense amplifier 140 will be described.

Reading operation 2R: Read result SA is inverted and held by the latch circuit XDL.

$$XDL = \sim SA$$

Reading operation 5R: Read result SA is inverted and held by the latch circuit ADL.

$$ADL = \sim SA$$

Reading operation 8R: Read result SA is XNORed with the data held by the latch circuit XDL.

$$XDL = SA \; xnor \; XDL$$

Reading operation AR: Read result SA is XNORed with the data held by the latch circuit ADL.

$$ADL = SA \; xnor \; ADL$$

Reading operation CR: Read result SA is ORed with the data held by the latch circuit ADL.

$$ADL = \sim SA \mid ADL$$

Reading operation ER: Read result SA is inverted and ORed with the data held by the latch circuit XDL.

$$XDL = \sim SA \mid XDL$$

Reading operation FR: Read result SA is inverted and XNORed with the data held by the latch circuit ADL.

$$ADL = \sim SA \; xnor \; ADL$$

As described above, the scrambled upper bit (U0/T1/U2/ . . . T15) is established by the reading operation ER and held by the latch circuit XDL, and the scrambled top bit (T0/U1/T2/ . . . U15) is established by the reading operation FR and held by the latch circuit ADL.

9.3 Advantageous Effects of Present Embodiment

As described above, the partial page scramble method of the sixth embodiment is applicable to a case in which the memory cell transistor holds 4-bit data, and produces similar advantageous effects.

Also, the pages (latch circuits) to be read may be designated in the command sequences in the reading time, as in the examples illustrated in FIG. 30A and FIG. 30B concerning the sixth embodiment.

For example, in a case in which the controller 200 requests the scrambled upper page (U0/T1/U2/ . . . T15), the command sequence illustrated in FIG. 30A can be used. In this case, the upper page is designated by issuing the command "03h" in place of the command "04h" in FIG. 30A. As a result, the scrambled upper page (U0/T1/U2/ . . . T15) is held by the latch circuit XDL. The prefix command "Y3h" is issued in place of "Y4h".

When the controller 200 requests the scrambled lower page (L0/M1/L2/ . . . M15) and the scrambled middle page (M0/L1/M2/ . . . L15), the command sequence of FIG. 30B described above can be used. In this case, the lower page is designated by issuing the command "01h" in FIG. 30B. As a result, the scrambled lower page (L0/M1/L2/ . . . M15) is held by the latch circuit ADL, and the scrambled middle page (M0/L1/M2/ . . . L15) is held by the latch circuit XDL. Therefore, after reading the scrambled lower page, the controller 200 is able to read the scrambled middle page by issuing the command "Z1h" once.

10. Tenth Embodiment

Next, a semiconductor memory device according to a tenth embodiment will be described. The present embodiment relates to a data scramble method that differs from the eighth and ninth embodiments. In the following description, only the matters different from the eighth and ninth embodiments will be described. The mapping of the data in this embodiment is "3-4-4-4" mapping, which is described above with reference to FIG. 35 relating to the eighth embodiment.

10.1 Data Writing Operation

The basic flow of the data writing operation is the same as that of the eighth embodiment. The present embodiment differs from the eighth embodiment in data scrambling method.

Figure 40:
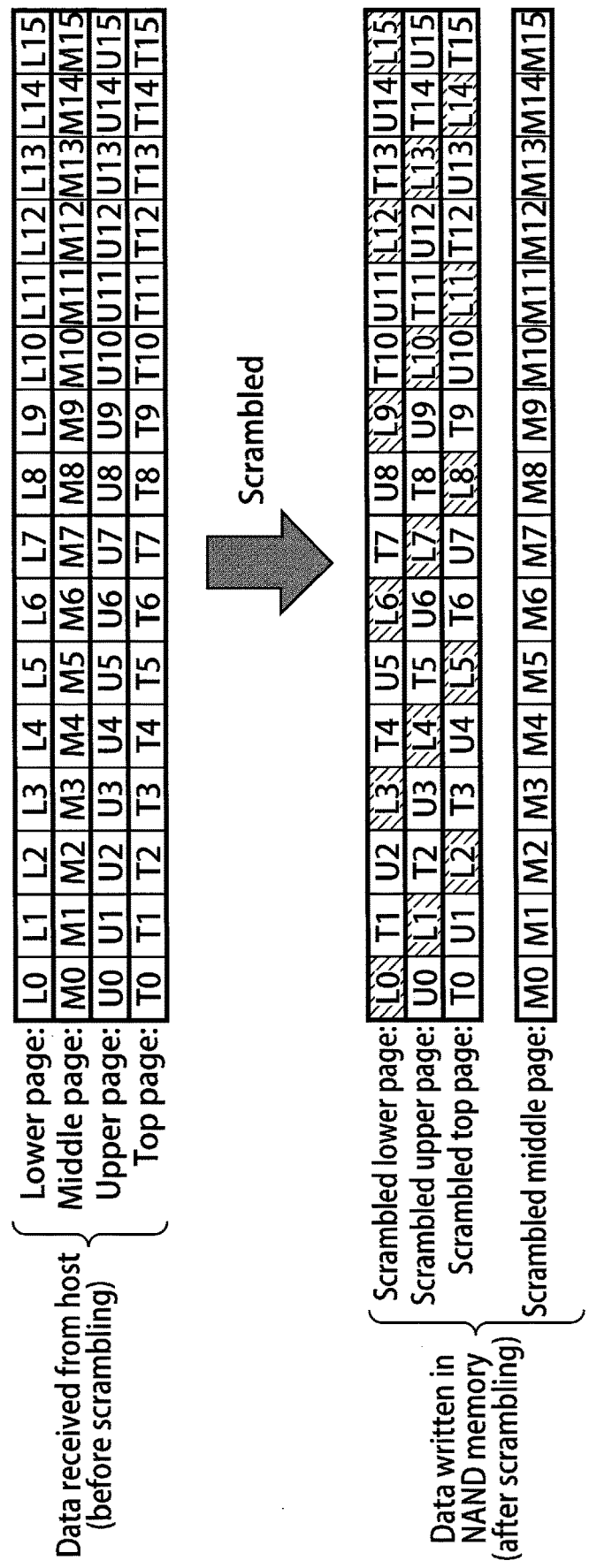
FIG. 40 is a conceptual diagram illustrating a data scramble method according to a tenth embodiment.

The scrambling method of this embodiment is (1+3) scrambling that uses a partial page scramble method. The (1+3) scrambling is a method of randomizing data by exchanging bits among three pages of four pages assigned to one word line WL, and not exchanging bits in the other page. FIG. 40 corresponds to FIG. 36A used in the explanation of the eighth embodiment. The upper part of FIG. 40 represents data before scrambling, and the lower part of FIG. 40 represents data after scrambling. In the data after scrambling in FIG. 40, for reference, the lower bits before scrambling are represented with diagonal lines.

As illustrated in FIG. 40, the scrambling method of the present embodiment is performed as follows:

The lower page, the upper page, and the top page are scrambled, so that the lower page, the upper page, and the top page of scrambled data are generated. At this time, the lower bit, upper bit, and top bit are replaced by the top bit, lower bit, and upper bit, respectively, at the second bit, and further replaced by the upper bit, top bit, and lower bit, respectively, at the third bit. The same applies to the fourth and subsequent bits.

The middle page is not scrambled with another page, and bits in the page are not replaced.

As a result of the scrambling described above, the lower page (data PG0 mentioned in FIG. 16), the middle page (data PG1), the upper page (data PG2), and the top page (data PG3) are generated as follows:

PG0: <L0/T1/U2/L3/T4/U5/L6/T7/U8/L9/T10/U11/L12/T13/U14/L15>

PG1: <M0/M1/M2/M3/M4/M5/M6/M7/M8/M9/M10/M11/M12/M13/M14/M15>

PG2: <U0/L1/T2/U3/L4/T5/U6/L7/T8/U9/L10/T11/U12/L13/T14/U15>

PG3: <T0/U1/L2/T3/U4/L5/T6/U7/L8/T9/U10/L11/T12/U13/L14/T15>

In the (1+3) scrambling, the three pages to be scrambled are not limited to those shown in FIG. 40, and the page not to be scrambled is not limited to the middle page. For example, the middle page, the upper page, and the top page may be scrambled, while the lower page may not be scrambled. Furthermore, the data may be exchanged between pages in units of columns or in any other units, not in units of bits, as described above in connection with the fifth embodiment. Also, in the following description, the lower page, the middle page, the upper page, and the top page in the scrambled data may be referred to as the scrambled lower page, the scrambled middle page, the scrambled upper page, and the scrambled top page.

The write command sequences issued in step S24 are the same as those described for the eighth embodiment, except that the command "X3h" is issued as a prefix command. The command "X3h" is a command to declare to the NAND flash memory 100 that the (1+3) scrambling that uses the partial page scramble method is used. Then, the full sequence program using data for the scrambled four pages represented in the lower part of FIG. 40 is executed. In this embodiment also, the issuance of the command "X3h" may be omitted.

10.2 Data Reading Operation

Next, a method of reading the scrambled data will be described. Read command sequences issued by step S25 are substantially the same as those of the sixth embodiment described with reference to FIG. 28B and FIG. 28C, while the meaning of the prefix command and data to be read are different from those of the sixth embodiment.

For example, when the scrambled middle page (M0/M1/M2/ . . . M15) is to be read, the controller 200 issues a command sequence shown in FIG. 28B. However, the command "Y4h" is issued in place of the prefix command "Y3h". The command "Y4h" declares to the NAND flash memory 100 that the (1+3) scrambling that uses the partial page scramble method is used and one page (in this example, the middle page) is designated. Subsequently, as in the sixth embodiment, the command "00h", the address ADD and the command "30h" are issued. Then, the NAND flash memory 100 is set to the busy state, and in response to the command "Y4h", performs the partial sequential reading to read the scrambled middle page. As a result, the scrambled middle page (M0/M1/M2/ . . . M15) is held by the latch circuit XDL.

On the other hand, when the scrambled lower page (L0/T1/U2/L3/ . . . L15), the scrambled upper page (U0/L1/T2/U3/ . . . U15) and the scrambled top page (T0/U1/L2/T3/ . . . T15) are to be read, the controller 200 issues a command sequence shown in FIG. 28C. However, the command "Y5h" is issued in place of the prefix command "Y4h". The command "Y5h" declares to the NAND flash memory 100 that the (1+3) scrambling that uses the partial page scramble method is used and three pages (in this embodiment, the lower page (L0/T1/U2/L3/ . . . L15), the upper page (U0/L1/T2/U3/ . . . U15), and the top page (T0/U1/L2/T3/ . . . T15)) are designated. Subsequently, as in the sixth embodiment, the command "00h", the address ADD and the command "30h" are issued. Then, the NAND flash memory 100 is set to the busy state, and in response to the command "Y5h", performs the partial sequential reading to read the scrambled lower page, the scrambled upper page, and the scrambled top page. As a result, the scrambled lower page (L0/T1/U2/L3/ . . . L15) is held by the latch circuit XDL, the scrambled upper page (U0/L1/T2/U3/ . . . U15) is held by the latch circuit ADL, and the scrambled top page (T0/U1/L2/T3/ . . . T15) is held by the latch circuit BDL. After reading the scrambled lower page, the controller 200 is able to read the scrambled upper page by issuing the command "Z1h", and to further read the scrambled top page by issuing the command "Z1h". Also in this embodiment, the issuance of the commands "Y4h" and "Y5h" may be omitted.

FIG. 41A is a timing chart of the case where the command sequence of FIG. 28B is issued, showing a change in potential of the selected word line WL and data held in each of the latch circuits in the sense amplifier 140, when step S31 in FIG. 20A is performed.

As illustrated, the row decoder 120 sequentially applies the voltages V3, V7, V9, and VD to the selected word line WL. As a result, the reading operations 3R, 7R, 9R, and DR are sequentially performed. In the following, arithmetic operations in the respective reading operations and data held in each of the latch circuits in the sense amplifier 140 will be described.

Reading operation 3R: Read result SA is inverted and held by the latch circuit XDL.

$$XDL = \sim SA$$

Reading operation 7R: Read result SA is XNORed with the data held by the latch circuit XDL.

$$XDL = SA\ xnor\ XDL$$

Reading operation 9R: Read result SA is ORed with the data held by the latch circuit XDL.

$$XDL = SA\ |\ XDL$$

Reading operation DR: Read result SA is XNORed with the data held by the latch circuit XDL.

$$XDL = SA\ xnor\ XDL$$

Figure 41B:
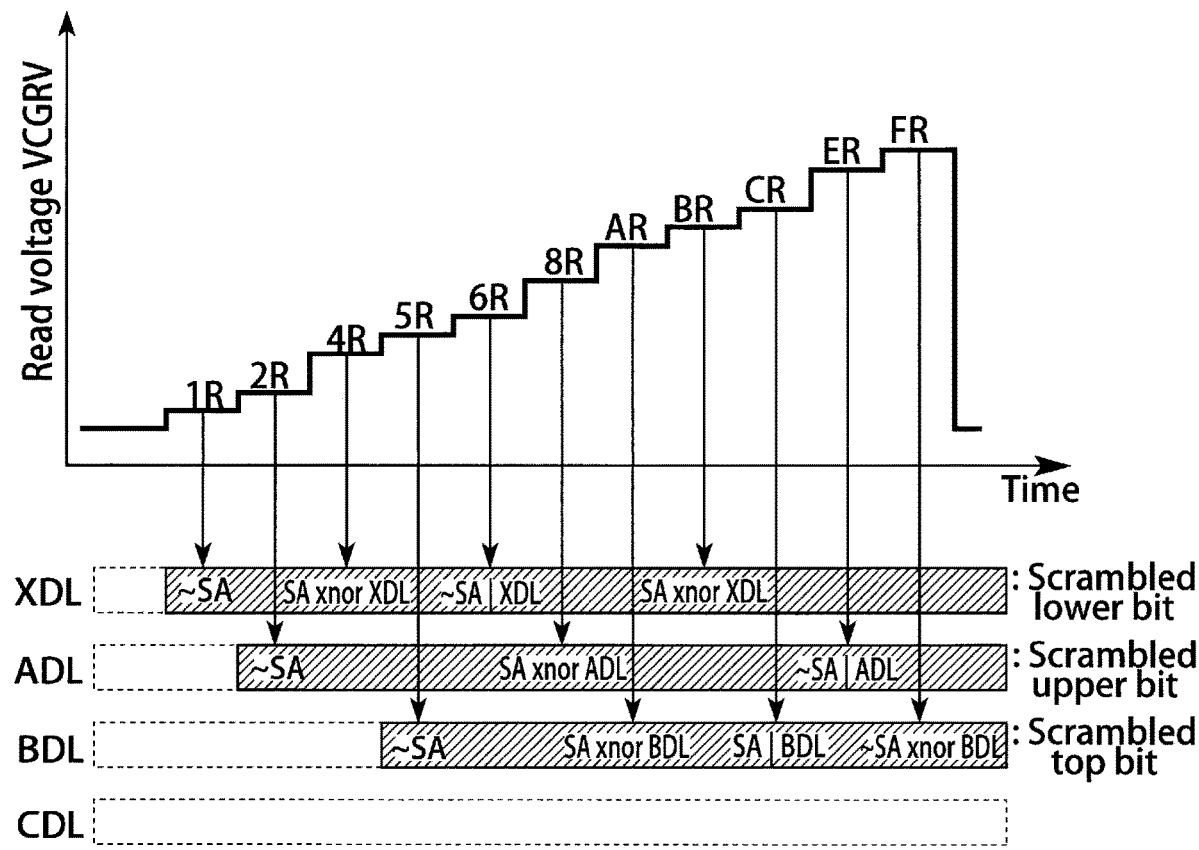

As a result, the scrambled middle bit (M0/M1/M2/ . . . M15) is established and held by the latch circuit XDL, FIG. 41B is a timing chart of the case where the command sequence of FIG. 28C is issued, showing a change in potential of the selected word line WL and data held in each of the latch circuits in the sense amplifier 140, when step S31 in FIG. 20A is performed.

As illustrated, the row decoder 120 sequentially applies the voltages V1, V2, V4, V5, V6, V8, VA, VB, VC, VE, and VF to the selected word line WL. As a result, the reading operations 1R, 2R, 4R, 5R, 6R, 8R, AR, BR, CR, ER, and FR are sequentially performed. In the following, arithmetic operations in the respective reading operations and data held in each of the latch circuits in the sense amplifier 140 will be described.

Reading operation 1R: Read result SA is inverted and held by the latch circuit XDL.

$$XDL = \sim SA$$

Reading operation 2R: Read result SA is inverted and held by the latch circuit ADL.

$$BDL = \sim SA$$

Reading operation 4R: Read result SA is XNORed with the data held by the latch circuit XDL.

$$XDL = SA\ xnor\ XDL$$

Reading operation 5R: Read result SA is inverted and held by the latch circuit BDL.

$$CDL = \sim SA$$

Reading operation 6R: Read result SA is inverted and ORed with the data held by the latch circuit XDL.

$$XDL = \sim SA \mid XDL$$

Reading operation 8R: Read result SA is XNORed with the data held by the latch circuit ADL.

$$ADL = SA \text{ xnor } ADL$$

Reading operation AR: Read result SA is XNORed with the data held by the latch circuit BDL.

$$BDL = SA \text{ xnor } BDL$$

Reading operation BR: Read result SA is XNORed with the data held by the latch circuit XDL.

$$XDL = SA \text{ xnor } XDL$$

Reading operation CR: Read result SA is ORed with the data held by the latch circuit BDL.

$$BDL = \sim SA \mid BDL$$

Reading operation ER: Read result SA is inverted and ORed with the data held by the latch circuit ADL.

$$ADL = \sim SA \mid ADL$$

Reading operation FR: Read result SA is inverted and XNORed with the data held by the latch circuit BDL.

$$BDL = SA \text{ xnor } BDL$$

In the manner described above, the scrambled lower bit (L0/T1/U2/L3/ . . . L15) is established at the reading operation BR, and held by the latch circuit XDL. The scrambled upper bit (U0/L1/T2/U3/ . . . U15) is established at the reading operation ER, and held by the latch circuit ADL. The scrambled top bit (T0/U1/L2/T3/ . . . T15) is established at the reading operation FR, and held by the latch circuit BDL.

10.3 Advantageous Effects According to Present Embodiment

The method of the present embodiment described above, for example, may be used as the data scramble method.

Also, the pages (latch circuits) to be read may be designated in the command sequences in the reading time, as in the examples illustrated in FIG. 30A and FIG. 30B concerning the sixth embodiment.

For example, in a case in which the controller 200 requests the scrambled upper page (U0/L1/T2/U3/ . . . U15), the command sequence illustrated in FIG. 30A can be used. In this case, in FIG. 30A, three pages of the (1+3) pages are selected by issuing the prefix command "Y5h", and the upper page is designated by issuing the command "03h". As a result, the scrambled upper page (U0/L1/T2/U3/ . . . U15) is held by the latch circuit XDL.

When the controller 200 requests the scrambled lower page (L0/T1/U2/L3/ . . . L15) and the scrambled upper page (U0/L1/T2/U3/ . . . U15), the command sequence of FIG. 30B described above can be used. In this case, in FIG. 30B, three pages of the (1+3) pages are selected by issuing the prefix command "Y5h", and the lower page is designated by issuing the command "01h". As a result, the scrambled lower page (L0/T1/U2/L3/ . . . L15) is held by the latch circuit XDL, and the scrambled upper page (U0/L1/T2/U3/ . . . U15) is held by the latch circuit ADL. Therefore, after reading the scrambled lower page, the controller 200 is able to read the scrambled upper page by issuing the command "Z1h" once.

11. Eleventh Embodiment

Next, a semiconductor memory device according to an eleventh embodiment will be described. The present embodiment relates to a method of scrambling data not only between pages but also between memory chips in a memory system including a plurality of memory chips. In the following description, only the matters different from the first to tenth embodiments will be described.

11.1 Configuration of Memory System

FIG. 42 is a block diagram of a memory system 1 according to the present embodiment. As illustrated in FIG. 42, the memory system 1 of the embodiment includes a plurality of NAND flash memories 100 (in the example of FIG. 42, four NAND flash memories 100-0 to 100-3) in place of the NAND flash memory 100 in the configuration of the first embodiment shown in FIG. 1. Those NAND flash memories 100 are formed on different semiconductor chips, and may be referred to as memory chips CP (CP0 to CP3, respectively). A chip enable signal CEn and a ready/busy signal REn are prepared for each of the memory chips CP. On the other hand, a signal I/O is transferred between a controller 200 and the memory chips CP0 to CP3 via a common signal line. The memory chips CP can operate in parallel; for example, a data writing operation and a data reading operation can be performed at the same time.

In the embodiment, as described below, memory cell transistors of the NAND flash memories 100-1 to 100-3 can hold 4-bit data as in the eighth to tenth embodiments.

11.2 Data Writing Operation

The basic flow of the data writing operation is substantially the same as that of the fifth embodiment of FIG. 15 described above. The scramble processing in step S23 of FIG. 15 is the same as that in the eighth to tenth embodiments. The present embodiment differs from the fifth to tenth embodiments in that the data of the four pages generated by scrambling the bits of the pages in step S24 of FIG. 15 are transferred to memory chips CP different from each other. This process is shown in FIG. 43. FIG. 43 is a conceptual diagram roughly illustrating a flow of processing of the controller explained in FIG. 15, and the flow of the first embodiment described with reference to FIG. 16 is applied to the present embodiment.

In this example, one memory cell transistor holds 4-bit data. For simplicity of explanation, FIG. 43 shows a case in which the controller 200 receives data corresponding to 16 pages from the host apparatus 300. As shown in FIG. 43, the controller 200 divides the data received from the host apparatus 300 into data units DU (DU0 to DU16) as well as in the fifth embodiment described with reference to FIG. 16. The ECC circuit 260 generates a parity for each of the data units DU, and applies the parity to the data unit DU. Then, the processor 230 scrambles the data by any of the methods of the eighth to tenth embodiments described above. In FIG. 43, for example, it is assumed that the data units DU0 to DU3 respectively correspond to the lower, middle, upper, and top pages of the word line WL0 of the NAND flash memory 100-0. In this case, the processor 230 scrambles the data among data units DU0 to DU3. Furthermore, it is assumed that data units DU4 to DU7 respectively correspond to the lower, middle, upper, and top pages of the word line WL1 of the NAND flash memory 100-0. In this case, the processor scrambles the data among the data units DU4 to DU7. The same applies to the data units DU8 to DU11, and the data units DU12 to DU15.

As a result, the data units DU0 to DU3 and their parities are scrambled to generate data PG0 to PG3. Furthermore, the data units DU4 to DU7 and their parities are scrambled to generate data PG4 to PG7. The same applies to the data units PG8 to PG11, and the data units PG12 to PG15.

The data PG0, PG4, PG8, and PG12 is transmitted to the memory chip CP0, and respectively written in the lower, middle, upper, and top pages of the word line WL0. The data PG1, PG5, PG9 and PG13 are transmitted to the memory chip CP1, and respectively written in the middle, upper, top, and lower pages of the word line WL0. The data PG2, PG6, PG10, and PG14 are transmitted to the memory chip CP2, and respectively written in the upper, top, lower, and middle pages of the word line WL0. The data PG3, PG7, PG11, and PG15 are transmitted to the memory chip CP3, and respectively written in the top, lower, middle, and upper pages of the word line WL0.

FIG. 44 shows the relationship between each page (top, upper, middle, or lower page) of the word line WL and data PG to be written in the word line WL of each memory chip CP. As shown in FIG. 44, in the word line WLi of the NAND flash memory 100-0 (i is an integer, in this embodiment, i=0), the data PG0, PG4, PG8, and PG12 are respectively written in the lower, middle, upper, and top pages. In the word line WLi of the NAND flash memory 100-1, the data PG13, PG1, PG5, and PG9 are respectively written in the lower, middle, upper, and top pages. In the word line WLi of the NAND flash memory 100-2, the data PG10, PG14, PG2, and PG6 are respectively written in the lower, middle, upper, and top pages. In the word line WLi of the NAND flash memory 100-3, the data PG7, PG11, PG15, and PG3 are respectively written in the lower, middle, upper, and top pages.

In the word line WL(i+1) of the NAND flash memory 100-0, the data PG16, PG20, PG24 and PG28 are respectively written in the lower, middle, upper, and top pages. In the word line WL(i+1) of the NAND flash memory 100-1, the data PG29, PG17, PG21, and PG25 are respectively written in the lower, middle, upper, and top pages. In the word line WL(i+1) of the NAND flash memory 100-2, the data PG26, PG30, PG18, and PG22 are respectively written in the lower, middle, upper, and top pages. In the word line WL(i+1) of the NAND flash memory 100-3, the data PG23, PG27, PG31 and PG19 are respectively written in the lower, middle, upper, and top pages. The same applies to the data PG32 and the subsequent data.

Write command sequences will be described with reference to FIG. 45A, FIG. 45B, FIG. 45C, and FIG. 45D. FIG. 45A, FIG. 45B, FIG. 45C, and FIG. 45D are timing charts representing signals I/O to be transmitted to the memory chips CP0 to CP3, and also representing whether each of the chips is ready or busy. FIG. 45A, FIG. 45B, FIG. 45C, and FIG. 45D are temporally continuous, but divided into the four separate charts due to limitations of space.

As shown in FIG. 45A, the controller 200 transfers write data to the memory chip CP0. The command sequences are the same as those described with reference to FIG. 19. First, the data PG0 is transmitted along with the command "01h" designating the lower page. Next, the data PG4 is transmitted along with the command "02h" designating the middle page. Next, the data PG8 is transmitted along with the command "03h" designating the upper page. Finally, the data PG12 is transmitted along with the command "04h" designating the top page. As a result of issuance of the command "10h", the NAND flash memory 100-0 starts the full sequence program using the data PG0, PG4, PG8, and PG12, and changes from the ready state to the busy state.

Figure 45B:
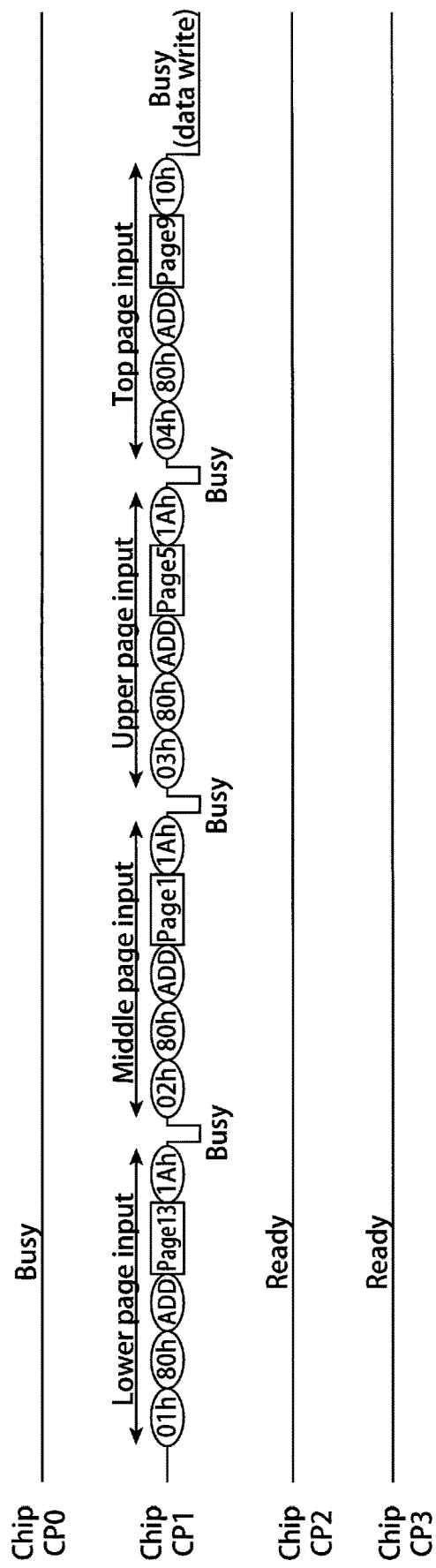

Subsequently, as shown in FIG. 45B, the controller 200 transfers write data to the memory chip CP1. First, the data PG13 is transmitted along with the command "01h". Next, the data PG1 is transmitted along with the command "02h". Next, the data PG5 is transmitted along with the command "03h". Finally, the data PG9 is transmitted along with the command "04h". As a result of issuance of the command "10h", the NAND flash memory 100-1 starts the full sequence program using the data PG13, PG1, PG5, and PG9, and changes from the ready state to the busy state.

Figure 45C:
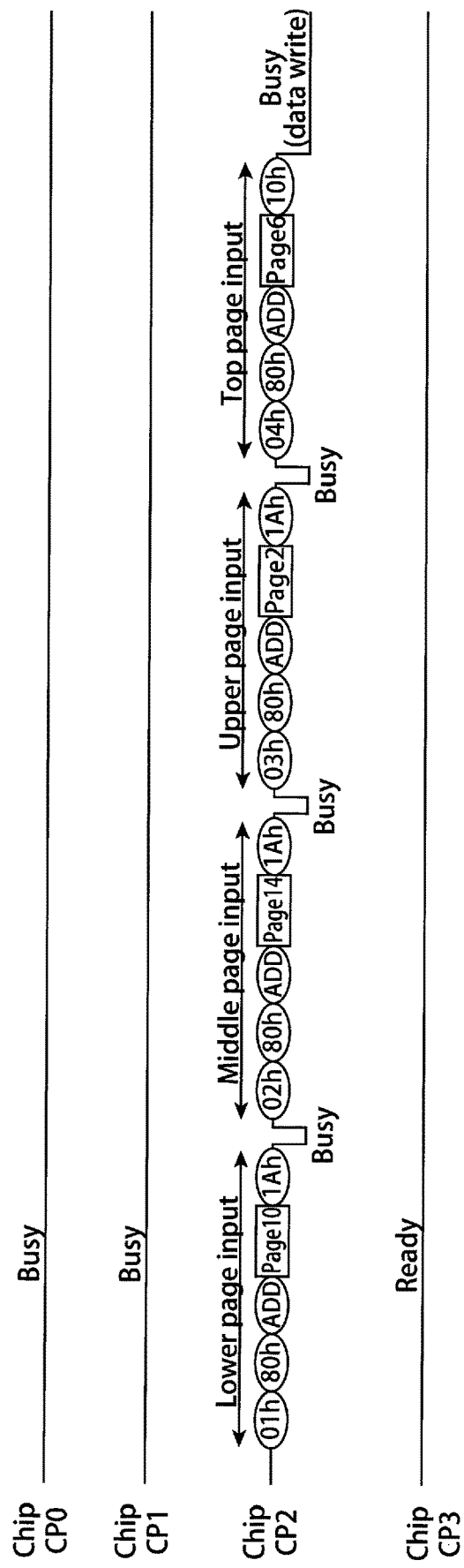

Then, as shown in FIG. 45C, the controller 200 transfers write data to the memory chip CP2. First, the data PG10 is transmitted along with the command "01h". Next, the data PG14 is transmitted along with the command "02h". Next, the data PG2 is transmitted along with the command "03h". Finally, the data PG6 is transmitted along with the command "04h". As a result of issuance of the command "10h", the NAND flash memory 100-2 starts the full sequence program using the page data PG10, PG14, PG2, and PG6, and changes from the ready state to the busy state.

Figure 45D:
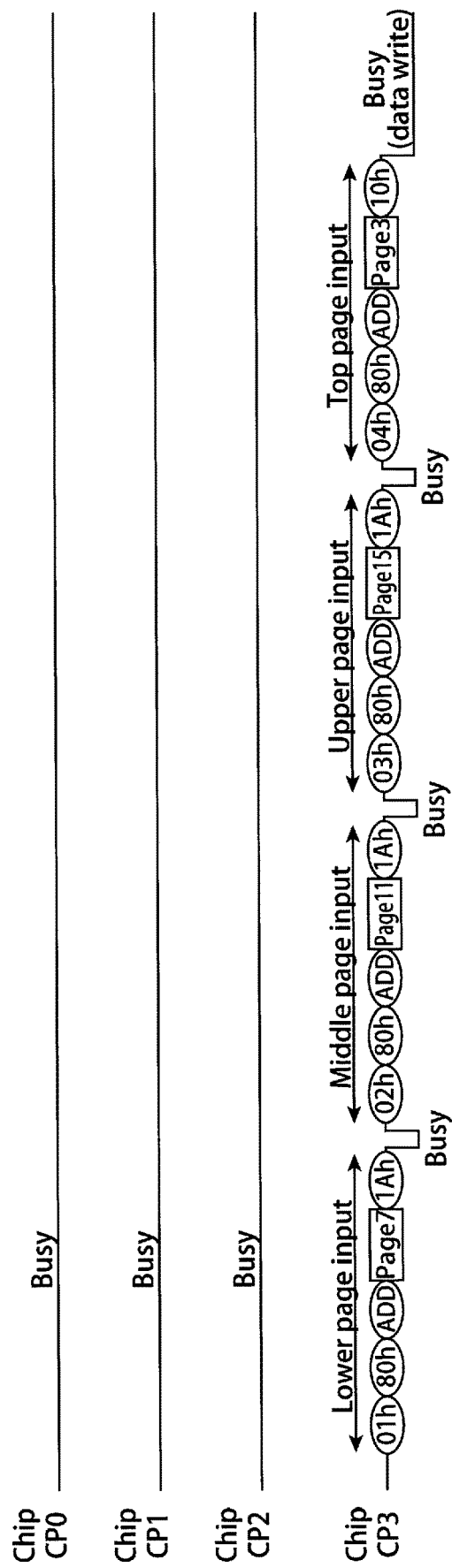

Then, as shown in FIG. 45D, the controller 200 transfers write data to the memory chip CP3. First, the data PG7 is transmitted along with the command "01h". Next, the data PG11 is transmitted along with the command "02h". Next, the data PG15 is transmitted along with the command "03h". Finally, the data PG3 is transmitted along with the command "04h". As a result of issuance of the command "10h", the NAND flash memory 100-3 starts the full sequence program using the page data PG7, PG11, PG15, and PG3, and changes from the ready state to the busy state.

11.3 Data Reading Operation

The basic flow of the data writing operation is substantially the same as that of the fifth embodiment illustrated in FIG. 20A, but is deferent from the fifth embodiment in the following respects. In the present embodiment, the data PG of the four pages constituting the data unit DU to be read are respectively written in the different memory chips CP0 to CP3. Therefore, the controller 200 issues a read command to read necessary data PG for each of the memory chips CP. In response to the read command, each of the NAND flash memories 100 reads necessary data PG through the pageby-page reading. Of course, the full sequential reading may be performed to hold only necessary data by a latch circuit of the sense amplifier 140. However, in the present embodiment, as data of only one page needs to be read by each NAND flash memory 100, the page-by-page reading can be used.

The data PG of the four pages, which have been read as described above, were generated by scrambling the four data units DU and the parities thereof. Therefore, in the controller 200, for example, the processor 230 or the ECC circuit 260 performs reverse bit handling of the scrambling process, thereby decoding the data PG of the four pages. Then, steps S27 and S28 are performed, and an error-corrected data unit is transmitted to the host apparatus 300.

FIG. 46A is a timing chart representing signals I/O to be transmitted to the memory chips CP0 to CP3, and also representing whether each of the chips is ready or busy. The timing chart shows read command sequences when reading the data unit DU0 in the case shown in FIG. 43 and FIG. 44 as an example.

As illustrated, the controller 200 first issues a read command to the memory chip CP0. In this command sequence, first, the lower page is designated by the command "01h". Then, the NAND flash memory 100-0 reads only the lower page. Specifically, as described with reference to FIG. 35, the reading operations 1R, 4R, 6R, and BR are performed. As a result, the data PG0 is read by the latch circuit XDL.

Subsequently, the controller 200 issues a read command to the memory chip CP1. In this command sequence, the middle page is designated by the command "02h". Then, the NAND flash memory 100-1 reads only the middle page. Specifically, the reading operations 3R, 7R, 9R, and DR are performed. As a result, the data PG1 is read by the latch circuit XDL.

Furthermore, the controller 200 issues a read command to the memory chip CP2. In this command sequence, the upper page is designated by the command "03h". Then, the NAND flash memory 100-2 reads only the upper page. Specifically, the reading operations 2R, 8R, and ER are performed. As a result, the data PG2 is read by the latch circuit XDL.

Subsequently, the controller 200 issues a read command to the memory chip CP3. In this command sequence, the top page is designated by the command "04h". Then, the NAND flash memory 100-3 reads only the top page. Specifically, the reading operations 5R, AR, CR, and FR are performed. As a result, the data PG3 is read by the latch circuit XDL.

Subsequently, by toggling the read enable signal REn, the controller 200 reads the data PG0 to PG3 respectively from the NAND flash memories 100-0 to 100-3.

Figure 46B:
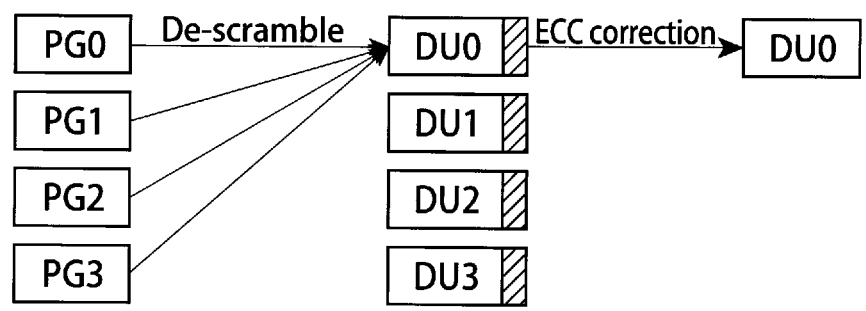
FIG. 46B is a conceptual diagram illustrating processes of a controller in a reading operation according to the eleventh embodiment.

Then, for example, as shown in FIG. 46B, the processor 230 or the ECC circuit 260 of the controller 200 takes a necessary bit (or column) from the data PG0 to PG3, and generates the data unit DU0 and its parity. For example, if the full page scramble method shown in FIG. 36A is employed, The controller 200 takes the bits L0, L4, L8, and L12 from the data PG0, bits L1, L5, L9, and L13 from the data PG1, bits L2, L6, L10, and L14 from the data PG3, and bits L3, L7, L11, and L15 from the data PG4. As a result, the data unit DU0 including the bits L0 to L15 and their parities is generated.

Then, the ECC circuit 260 detects and corrects an error using the parity, and the error-corrected data unit DU0 is transmitted to the host apparatus 300.

11.4 Advantageous Effects According to Present Embodiment

As described above, in the memory system including a plurality of memory chips CP, data may be scrambled among not only pages but also memory chips. As a result, data is randomized among memory chips, and "0" data or "1" data is prevented from being concentrated in a specific memory chip.

12. Twelfth Embodiment

Next, a semiconductor memory device according to a twelfth embodiment will be described. In this embodiment, one memory cell transistor MT holds 5-bit data, unlike in the eleventh embodiment. In the following description, only the matters different from the first to eleventh embodiments will be described.

12.1 Configuration of Memory System

The memory system 1 of the embodiment includes five NAND flash memories 100 (100-0 to 100-4) in place of the NAND flash memories in the configuration of the eleventh embodiment shown in FIG. 42. Those NAND flash memories 100 may be referred to as memory chips CP (CP0 to CP4, respectively). A chip enable signal CEn and a ready/busy signal REn are prepared for each of the memory chips CP. On the other hand, a signal I/O is transferred between a controller 200 and the memory chips CP0 to CP4 via a common signal line. The memory chips CP can operate in parallel; for example, a data writing operation and a data reading operation can be performed at the same time.

In the embodiment, as described below, memory cell transistors of the NAND flash memories 100-0 to 100-4 can hold 5-bit data as in the first to seventh embodiments.

12.2 Data Writing Operation

FIG. 47 is a conceptual diagram roughly illustrating a flow of processing of the controller explained in FIG. 15, and corresponds to FIG. 43 used in the explanation of the sixth embodiment.

As shown in FIG. 47, the controller 200 divides the data received from the host apparatus 300 into data units DU (DU0 to DU24). The ECC circuit 260 generates a parity for each of the data units DU, and applies the parity to the data unit DU. Then, the processor 230 scrambles the data by any of the methods of the fifth to seventh embodiments described above. In FIG. 47, for example, it is assumed that the data units DU0 to DU4 respectively correspond to the bottom, lower, middle, upper, and top pages of the word line WL0 of the NAND flash memory 100-0. In this case, the processor 230 or the ECC circuit 260 scrambles the data among data units DU0 to DU4. As a result, the data units DU0 to DU4 and their parities are scrambled, and data PG0 to PG4 are generated. Furthermore, the data units DU5 to DU9 and their parities are scrambled, and data PG5 to PG9 are generated. Similar operations are performed subsequently.

The data PG0, PG5, PG10, PG15, and PG20 are transmitted to the memory chip CP0, and respectively written in the bottom, lower, middle, upper, and top pages of the word line WL0. The data PG1, PG6, PG11, PG16, and PG21 are transmitted to the memory chip CP1, and respectively written in the lower, middle, upper, top, and bottom pages of the word line WL0. FIG. 48 shows the relationship between each page (top, upper, middle, lower or bottom page) of the word line WL and data PG to be written in the word line WL of each memory chip CP.

In the word line WLi of the NAND flash memory 100-0, the data PG0, PG5, PG10, PG15, and PG20 is written in the bottom, lower, middle, upper, and top pages. In the word line WLi of the NAND flash memory 100-1, the data PG21, PG1, PG6, PG11, and PG16 is written in the bottom, lower, middle, upper, and top pages. In the word line WLi of the NAND flash memory 100-2, the data PG17, PG22, PG2, PG7, and PG17 is written in the bottom, lower, middle, upper, and top pages. In the word line WLi of the NAND flash memory 100-3, the data PG13, PG18, PG23, PG3, and PG8 is written in the bottom, lower, middle, upper, and top pages. In the word line WLi of the NAND flash memory 100-4, the data PG9, PG14, PG19, PG24 and PG4 is written in the bottom, lower, middle, upper, and top pages.

In the word line WL(i+1) of the NAND flash memory 100-0, the data PG25, PG30, PG35, PG40 and PG45 is written in the bottom, lower, middle, upper, and top pages. In the word line WL(i+1) of the NAND flash memory 100-1, the data PG46, PG26, PG31, PG36, and PG41 is written in the bottom, lower, middle, upper, and top pages. In the word line WL(i+1) of the NAND flash memory 100-2, the data PG42, PG47, PG27, PG32, and PG37 is written in the bottom, lower, middle, upper, and top pages. In the word line WL(i+1) of the NAND flash memory 100-3, the data PG38, PG43, PG48, PG28, and PG33 is written in the bottom, lower, middle, upper, and top pages. In the word line WL(i+1) of the NAND flash memory 100-4, the data PG34, PG39, PG44, PG49, and PG29 is written in the bottom, lower, middle, upper, and top pages.

Regarding the write command sequences, it is necessary only that a write command be additionally issued for the memory chip CP4 in FIG. 45A to FIG. 45D used to explain the eleventh embodiment.

12.3 Data Reading Operation

The basic flow of the data reading operation is the same as that of the eleventh embodiment. For example, to read the data unit DU0, the controller 200 first issues a read command to the memory chip CP0. In this command sequence, first, the bottom page is designated by the command "01h". Then, the NAND flash memory 100-0 reads only the bottom page. Specifically, if the data mapping described with reference to FIG. 6 is used, the reading operations 1R, 3R, BR, DR and 14R are performed. As a result, the data PG0 is read by the latch circuit XDL.

Subsequently, the controller 200 issues a read command to the memory chip CP1. In this command sequence, the lower page is designated by the command "02h". Then, the NAND flash memory 100-1 reads only the lower page. Specifically, the reading operations 4R, 6R, 8R, AR, FR, 13R, and 18R are performed. As a result, the data PG1 is read by the latch circuit XDL.

Subsequently, the controller 200 issues a read command to the memory chip CP2. In this command sequence, the middle page is designated by the command "03h". Then, the NAND flash memory 100-2 reads only the middle page. Specifically, the reading operations 2R, CR, 12R, 17R, 1AR, 1CR, and 1ER are performed. As a result, the data PG2 is read by the latch circuit XDL.

Subsequently, the controller 200 issues a read command to the memory chip CP3. In this command sequence, the upper page is designated by the command "04h". Then, the NAND flash memory 100-3 reads only the upper page. Specifically, the reading operations 5R, CR, 12R, 17R, 1AR, 1CR, and 1ER are performed. As a result, the data PG3 is read by the latch circuit XDL.

Subsequently, the controller 200 issues a read command to the memory chip CP4. In this command sequence, the top page is designated by the command "05h". Then, the NAND flash memory 100-4 reads only the top page. Specifically, the reading operations 7R, 11R, 16R, 1BR, and 1FR are performed. As a result, the data PG4 is read by the latch circuit XDL.

Thereafter, as shown in FIG. 46B, the data unit DU0 and its parity are generated based on the data PG0 to PG4. Then, the ECC circuit 260 detects and corrects an error using the parity, and the error-corrected data unit DU0 is transmitted to the host apparatus 300.

12.4 Advantageous Effects According to Present Embodiment

As described above, the eleventh embodiment is applicable to a case in which the memory cell transistor MT holds 5-bit data.

In the embodiment described above as an example, each memory cell transistor MT holds 5-bit data and five memory chips CP are prepared. Therefore, the data of the five pages obtained by scrambling the five data units DU is written in the different memory chips CP. However, if the number of the memory chips CP is less than the number of bits that can be held by the memory cell transistor MT, some of the data for the pages obtained by the scrambling is written in the same memory chip CP. The same applies to the eleventh embodiment in which the memory cell transistor MT holds 4-bit data.

FIG. 49 corresponds to FIG. 47 of the embodiment, and shows a case in which the memory cell transistor MT holds 5-bit data while the memory system 1 includes only four memory chips CP. In the case of FIG. 49, of the data PG0 to PG4 obtained by scrambling the data units DU0 to DU4, the data PG0 and PG4 are written in the same memory chip CP0. The data PG5 and PG9 are also written in the same memory chip CP0. FIG. 50 is a table showing this state, and corresponds to FIG. 48 used in the explanation of the above embodiment.

As shown in FIG. 50, of the data for the five pages obtained by scrambling the five data units DU, the data that cannot be written in the word line WLi is written in the word lines WL(i+1) of the chips CP0 to CP3. Specifically, of the data PG0 to PG4, the data PG0 to PG3 is written in the bottom, lower, middle, and upper pages of the word lines WL0 of the chips CP0 to CP3, and the data PG4 is written in the bottom page of the word line WL(i+1) of the chip CP0. Alternatively, the data PG4 may be written in the top page of the word line WLi of the chip CP0.

Furthermore, of the data PG5 to PG9, the data PG5 to PG8 is written in the lower, middle, upper, and top pages of the word lines WL0 of the chips CP0 to CP3, and the data PG9 is written in the lower page of the word line WL(i+1) of the chip CP0. Furthermore, of the data PG10 to PG14, the data PG10 to PG13 is written in the middle, upper, top, and bottom pages of the word lines WL0 of the chips CP0 to CP3, and the data PG14 is written in the middle page of the word line WL(i+1) of the chip CP0. Subsequently, similar operations are performed.

13. Modifications, Etc

As described above, the semiconductor memory device of the embodiment includes a memory cell configured to hold 5-bit data in accordance with a threshold, a word line connected to the memory cell, and a row decoder configured to apply first to 31st voltages to the word line. the first bit ("bottom" in FIG. 3) of the 5-bit data is established by reading operations (1R, 3R, 5R, ER, 10R, and 15R in FIG. 3) using first to sixth voltages (V1, V3, V5, VE, V10, and V15 in FIG. 3). The second bit ("lower" in FIG. 3), which is different from the first bit, is established by reading operations (2R, AR, DR, 11R, 17R, and 1BR in FIG. 3) using seventh to twelfth voltages (V2, VA, VD, V11, V17, and V1B in FIG. 3). The third bit ("middle" in FIG. 3), which is different from the first and second bits, is established by reading operations (4R, 8R, FR, 18R, 1AR, and 1DR in FIG. 3) using thirteenth to eighteenth voltages (V4, V8, VF, V18, V1A, and V1D in FIG. 3). The fourth bit ("upper" in FIG. 3), which is different from the first to third bits, is established by reading operations (6R, CR, 12R, 14R, 16R, 1CR, and 1ER in FIG. 3) using 19th to 25th voltages (V6, VC, V12, V14, V16, V1C, and V1E in FIG. 3). The fifth bit ("top" in FIG. 3), which is different from the first to fourth bits, is established by reading operations (7R, 9R, BR, 13R, 19R, and 1FR in FIG. 3) using 26th to 31st voltages (V7, V9, VB, V13, V19, and V1F in FIG. 3). The first to 31st voltages are different from one another.

Alternatively, the first bit ("bottom" in FIG. 6) of the 5-bit data is established by reading operations (1R, 3R, BR, DR, and 14R in FIG. 6) using first to fifth voltages (V1, V3, VB, VD, and V14 in FIG. 6). The second bit ("lower" in FIG. 6), which is different from the first bit, is established by reading operations (4R, 6R, 8R, AR, FR, 13R, and 18R in FIG. 6) using sixth to twelfth voltages (V4, V6, V8, VA, VF, V13, and V18 in FIG. 6). The third bit ("middle" in FIG. 6), which is different from the first and second bits, is established by reading operations (2R, 9R, ER, 10R, 15R, 19R, and 1DR in FIG. 6) using thirteenth to nineteenth voltages (V2, V9, VE, V10, V15, V19, and V1D in FIG. 6). The fourth bit ("upper" in FIG. 6), which is different from the first to third bits, is established by reading operations (5R, CR, 12R, 17R, 1AR, 1CR, and 1ER in FIG. 6) using 20th to 26th voltages (V5, VC, V12, V17, V1A, V1C, and V1E in FIG. 6). The fifth bit ("top" in FIG. 6), which is different from the first to fourth bits, is established by reading operations (7R, 11R, 16R, 1BR, and 1FR in FIG. 6) using 27th to 31st voltages (V7, V11, V16, V1B, and V1F in FIG. 6).

Further, the first bit ("bottom" in FIG. 9) of the 5-bit data is established by reading operations (2R, 7R, 9R, BR, DR, and 16R in FIG. 9) using first to sixth voltages (V2, V7, V9, VB, VD, and V16 in FIG. 9). The second bit ("lower" in FIG. 9), which is different from the first bit, is established by reading operations (3R, 8R, 10R, 12R, 14R, 17R, 1AR in FIG. 9) using seventh to thirteenth voltages (V3, V8, V10, V12, V14, V17, and VIA in FIG. 9). The third bit ("middle" in FIG. 9), which is different from the first and second bits, is established by reading operations (4R, 6R, AR, FR, 13R, 19R, and 1DR in FIG. 9) using fourteenth to 20th voltages (V4, V6, VA, VF, V13, V19, and V1D in FIG. 9). The fourth bit ("upper" in FIG. 9), which is different from the first to third bits, is established by reading operations (5R, CR, 11R, 15R, 18R, 1BR, and 1ER in FIG. 9) using 21st to 27th voltages (V5, VC, V11, V15, V18, V1B, and V1E in FIG. 9). The fifth bit ("top" in FIG. 9), which is different from the first to fourth bits, is established by reading operations (1R, ER, 1CR, and 1FR in FIG. 9) using 28th to 31st voltages (V1, VE, V1C, and V1F in FIG. 9).

According to the configuration described above, in the NAND flash memory configured to hold 5-bit data (32-level data), the rate of occurrence of an error during reading to establish each bit can be reduced, and the reliability of reading operations can be improved.

The above-described embodiments have various modifications. For example, as in the case with second and fourth embodiments, the mirror pattern of the mapping described in connection with the fifth to thirteenth embodiments may be used. Furthermore, a concept similar to the concept in the above-described embodiments is applicable to a NAND flash memory that can hold 5-bit data (32-level data) or more. Additionally, the concept is applicable not only to NAND flash memories but also to semiconductor memories in general in which memory cells can hold multi-bit data.

Figure 51:
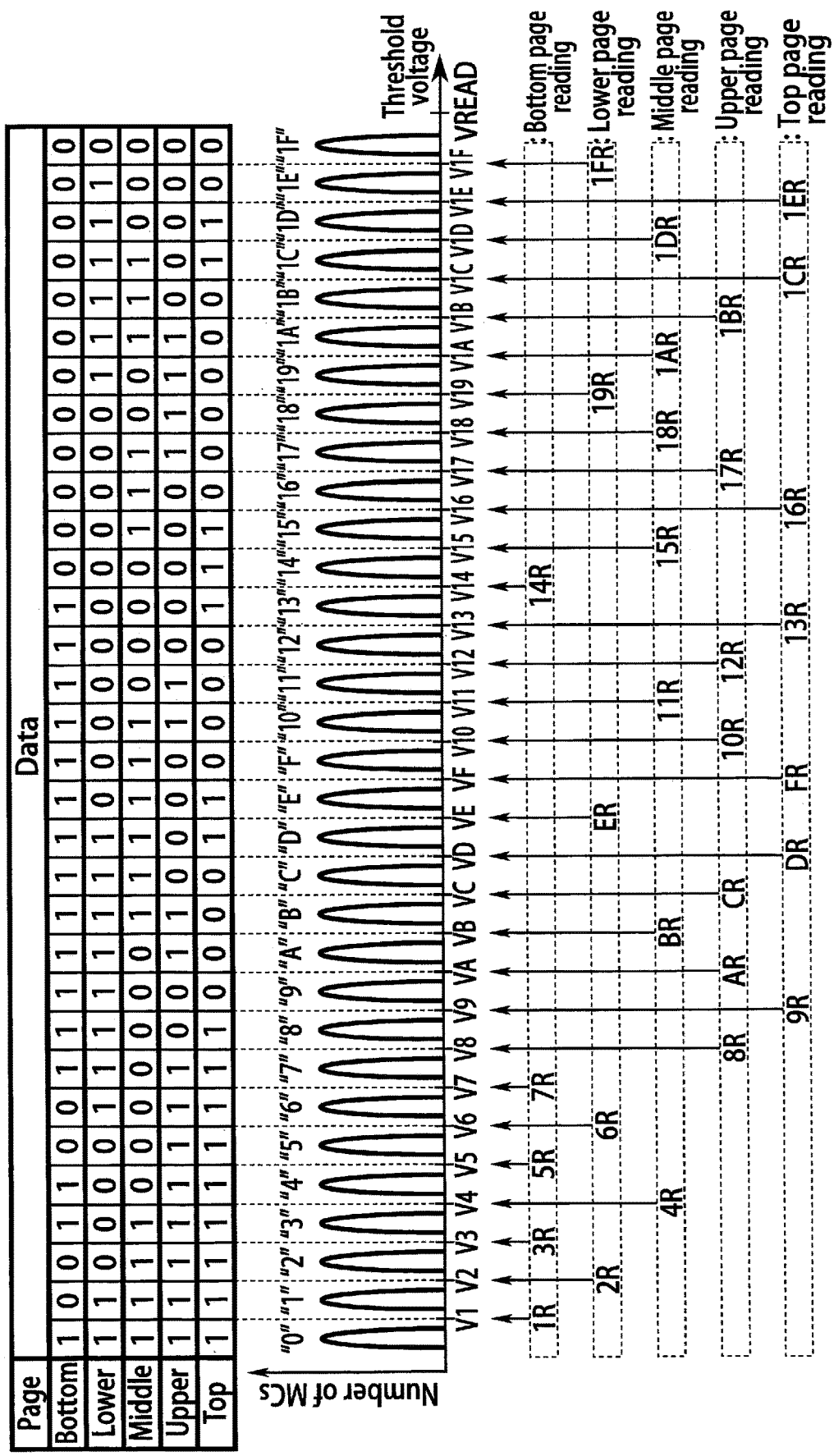
FIG. 51 is a diagram illustrating possible data, a threshold distribution, and read voltages for memory cells according to a modification of the first to fourth embodiments.

In addition, the relationship of the "0" to "1F" data that may be assumed by the memory cell transistors MT with the bottom bit the lower bit, the middle bit, the upper bit, and the top bit is not limited to the relationship in the above-described embodiments. The relations may be the 6-6-6-6-7 mapping, the 5-5-7-7-7 mapping, and the 4-6-7-7-7 mapping, and in this case, the number of bits changing between adjacent threshold levels may be 1 bit. For example, in the 5-5-7-7-7 mapping, the mapping is not limited to the case shown in FIG. 6, but may be the case shown in FIG. 51. In FIG. 51, the relationship of the "0" to "1F" states that may be assumed by the memory cell transistors with the bottom bit, the lower bit, the middle bit, the upper bit, and the top bit are as follows.

"0" state: "11111" (represented in the order of "top/upper/middle/lower/bottom")
"1" state: "11110"
"2" state: "11100"
"3" state: "11101"
"4" state: "11001"
"5" state: "11000"
"6" state: "11010"
"7" state: "11011"
"8" state: "10011"
"9" state: "00011"
"A" state: "01011"
"B" state: "01111"
"C" state: "00111"
"D" state: "10111"
"E" state: "10101"
"F" state: "00101"
"10" state: "01101"
"11" state: "01001"
"12" state: "00001"
"13" state: "10001"
"14" state: "10000"
"15" state: "10100"
"16" state: "00100"
"17" state: "01100"
"18" state: "01000"
"19" state: "01010"
"1A" state: "01110"
"1B" state: "00110"
"1C" state: "10110"
"1D" state: "10010"
"1E" state: "00010"
"1F" state: "00000"

In the mapping of this modification, the bottom page is read by the reading operations 1R, 3R, 5R, 7R, and 14R. The lower page is read by the reading operations 2R, 6R, ER, 19R and 1FR. The middle page is read by the reading operations 4R, BR, 11R, 15R, 18R, 1AR, and 1DR. The upper page is read by the reading operations 8R, AR, CR, 10R, 12R, 17R, and 1BR. The top page is read by the reading operations 9R, DR, FR, 13R, 16R, 1CR and 1ER.

Among the various mappings described above, the mappings the specific examples of which have been described above in the embodiments are desirably used when improvement of the reliability of reading and/or the improvement of latency is noted.

The same applies to the eighth embodiment in which the memory cell transistor MT holds 4-bit data. The mapping in the case of holding 4-bit data by a memory cell transistor is described in U.S. Provisional Patent Application No. 62/190,546 filed Jul. 9, 2015 entitled "SEMICONDUCTOR MEMORY DEVICE" and U.S. Non-provisional patent application Ser. No. 14/963,482 filed Dec. 9, 2015 based on the provisional application. These patent applications are incorporated herein by reference in their entirety.

Figure 52:
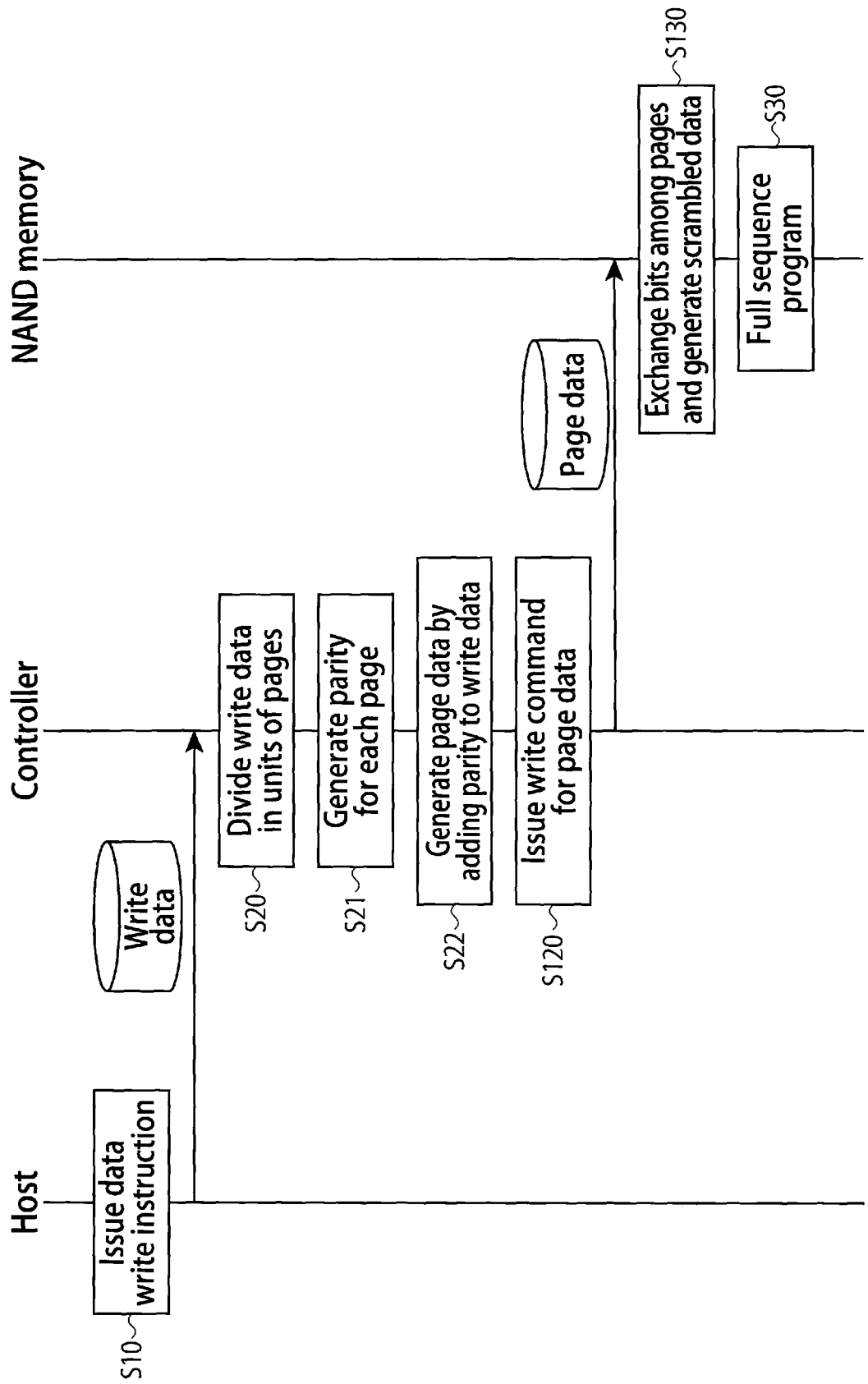
FIG. 52 is a flowchart illustrating a writing operation according to a modification of the fifth to twelfth embodiments.

In the fifth to twelfth embodiments described above, for example, the scrambling process among pages is performed by the controller 200. However, the scrambling process may be performed by the NAND flash memory 100. The operations of the memory system 1 in this case are shown in the flowchart of FIG. 52. As shown in FIG. 52, the controller 200 issues a write command for page data (step S120) without scrambling the data unlike in the fifth embodiment described with reference to FIG. 15. The issued command sequences are, for example, the same as those shown in FIG. 19; the prefix command instructs scrambling of data to the NAND flash memory 100.

In the NAND flash memory 100, for example, the sense amplifier 140 scrambles data among pages (step S130). When the scrambled data for five pages is obtained, the full sequence program is executed (step S30).

Figure 53A:
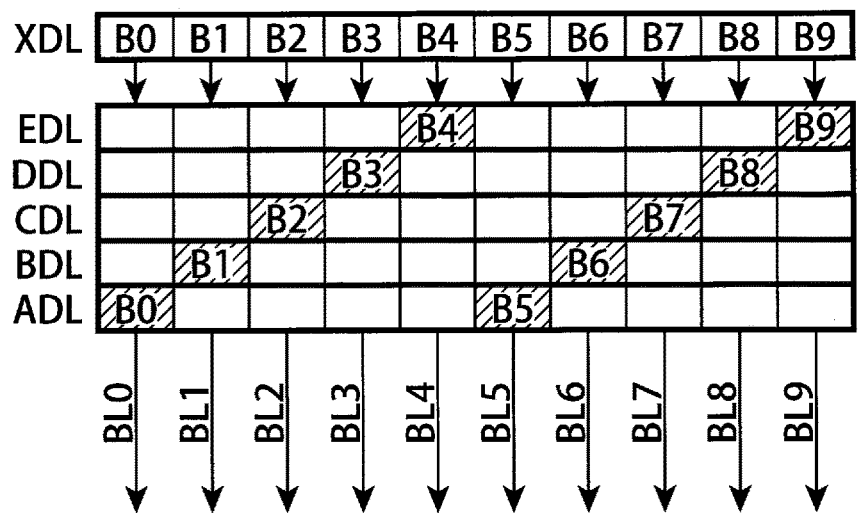
FIG. 53A, FIG. 53B, and FIG. 53C are schematic diagrams illustrating a sense amplifier unit according to a modification of the fifth to twelfth embodiments.
Figure 53B:
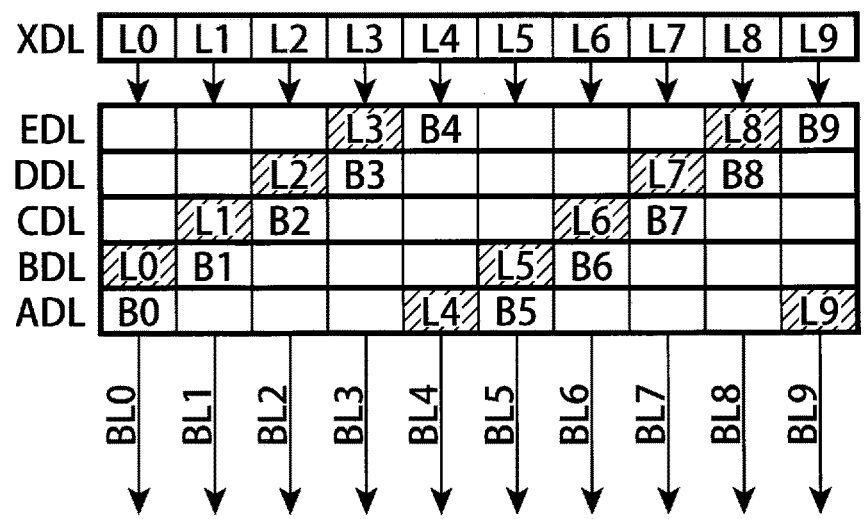
Figure 53C:
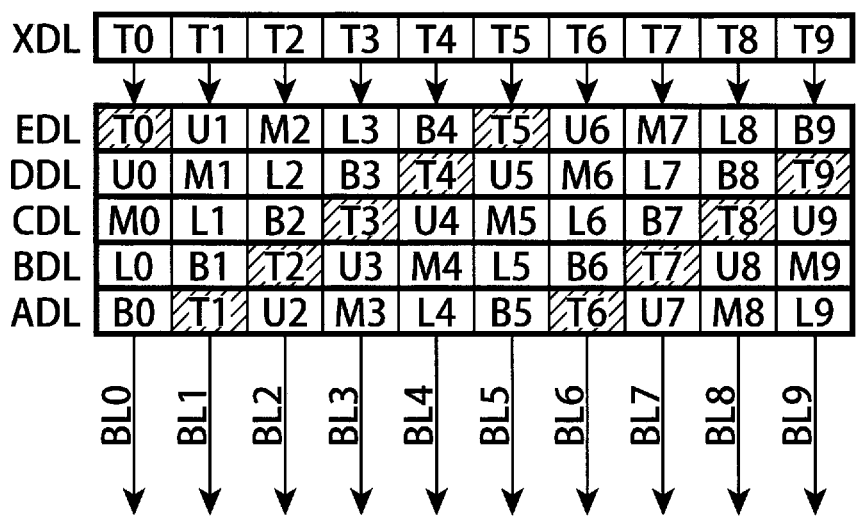

An example of the scrambling method in step S130 will be described with reference to FIG. 53A, FIG. 53B, and FIG. 53C. FIG. 53A, FIG. 53B, and FIG. 53C are schematic diagrams showing data held by the latch circuits of the sense amplifier unit SAU corresponding to each of the bit lines BL0 to BL9.

As illustrated, first, bottom page data is transmitted from the controller 200 by step S120, and the data (B0/B1/B2/ . . . B9) are first held by the latch circuit XDL. If the data are not scrambled, all bits of the bottom page data are transferred to the latch circuit ADL. In the present modification, as shown in FIG. 53A, the bits B1 and B6 are transferred to the latch circuit BDL, the bits B2 and B7 are transferred to the latch circuit CDL, the bits B3 and B8 are transferred to the latch circuit DDL, and the bits B4 and B9 are transferred to the latch circuit EDL.

Subsequently, lower page data is transmitted from the controller 200, and the data (L0/L1/L2/ . . . L9) is first held by the latch circuit XDL. If the data is not scrambled, all bits of the lower page data are transferred to the latch circuit BDL. In the present modification, as shown in FIG. 53B, the bits L1 and L6 are transferred to the latch circuit CDL, the bits L2 and L7 are transferred to the latch circuit DDL, and the bits L3 and L8 are transferred to the latch circuit EDL, and the bits L4 and L9 are transferred to the latch circuit ADL.

The same applies to the middle page data and the upper page data, and finally, the top page data is held by the latch circuit XDL. Then, as shown in FIG. 53C, the bits T1 and T6 are transferred to the latch circuit ADL, the bits T2 and T7 are transferred to the latch circuit BDL, the bits T3 and T8 are transferred to the latch circuit CDL, and the bits T4 and T9 are transferred to the latch circuit DDL.

As a result, the scrambled data in the lower part of FIG. 17 is held by the latch circuits ADL, BDL, CDL, DDL, and EDL. Of course, the bottom page data, the lower page data, the middle page data, the upper page data, and the top page data received from the controller 200 may be temporarily transferred to the latch circuits ADL, BDD, CDL, DDL, and EDL. Thereafter, the data may be exchanged. The scrambling method may be selected appropriately.

In the fifth to twelfth embodiments, decoding of the scrambled data may be performed by the NAND flash memory 100. In this case, the memory system 1 performs operations as shown in the flowchart of FIG. 54. As illustrated, the controller 200 issues an ordinary data read command (step S121), instead of scrambled data unlike in the fifth embodiment described with reference to FIG. 20A. The issued command sequences are, for example, the same as those shown in FIG. 21; the prefix (Y1h) command instructs decoding of scrambled data to the NAND flash memory 100.

The NAND flash memory 100 reads data from the memory cell array 110 into the sense amplifier 140. Then, for example, the sense amplifier 140 exchanges bits among the latch circuits ADL, BDL, CDL, DDL, and EDL, thereby decoding the read scrambled data of, for example, 5 pages (step S131). One example of this method involves reversing the operations of those shown in FIG. 53A, FIG. 53B, and FIG. 53C. For example, as illustrated in FIG. 53C, it is assumed that, of the scrambled data read from the memory cell array 110, the bottom page is held by the latch circuit ADL, the lower page is held by the latch circuit BDL, the middle page is held by the latch circuit CDL, the upper page is held by the latch circuit DDL, and the top page is held by the latch circuit EDL. Also, it is assumed that the controller 200 requests top page data (decoded top page data). In this case, the sense amplifier 140 transfers the bit T0 in the latch circuit EDL to the latch circuit XDL in the sense amplifier unit SAU corresponding to the bit line BL0, transfers the bit T1 in the latch circuit ADL to the latch circuit XDL in the sense amplifier unit SAU corresponding to the bit line BL1, transfers the bit T2 in the latch circuit BDL to the latch circuit XDL in the sense amplifier unit SAU corresponding to the bit line BL2, and transfers the bit T3 in the latch circuit CDL to the latch circuit XDL in the sense amplifier unit SAU corresponding to the bit line BL3. Subsequently, similar operations are performed. As a result, the decoded top page data (T0/T1/T2/T3/T4 . . . ) is held by the latch circuit XDL, as shown in FIG. 53C. The NAND flash memory 100 transmits the decoded page data to the controller 200. Thereafter, the controller 200 performs error correction (step S27).

In FIG. 52, the example in which the fifth embodiment of FIG. 20A is applied; however, as shown in FIG. 20B, the controller 200 may issue a read command for each page. In this case, as described in connection with the fifth embodiment, the NAND flash memory 100 reads data from the memory cell array 110 to the sense amplifier 140 regarding the requested page, and the read bits are exchanged among the latch circuits as described above, thereby decoding the scrambled data.

Furthermore, in the eleventh and twelfth embodiments described above, data is first scrambled among pages, and then scrambled among memory chips. In other words, data is scrambled doubly. However, data may not be scrambled among pages. Specifically, for example, referring to FIG. 43, the data units DU0 to DU15 and their parities may be transmitted to the memory chips CP0 to CP3 as data PG0 to PG15 without scrambling among pages. This also applies to the case of FIG. 47.

Furthermore, in the fifth to twelfth embodiments described above, the memory cell transistors hold 4-bit or 5-bit data; however, the memory cell transistors may hold, for example, 3-bit data. In this case, the full page scramble method or (1+2) scrambling is applicable. The (1+2) scrambling is a method of randomizing data of three pages assigned to one word line WL by exchanging bits between two pages of the three pages, and not exchanging bits relating the remaining page. Furthermore, 6 or more-bit data may be held. In the embodiments described above, two-dimensional or three-dimensional NAND flash memories are described as semiconductor memory devices; however, the embodiments may be widely applied to any memory device including a memory cell that can hold a plurality of bits.

Note that in each embodiment concerning the present invention, (1) When the memory cell holds 2-bit data ("Er", "A", "B", and "C"), the voltage applied to the selected word line in the reading operation of A level may range from, for example, 0 V to 0.55 V. However, the present embodiments are not limited to this, and the voltage may be set within any one of the ranges of 0.1 V to 0.24 V, 0.21 V to 0.31 V, 0.31 V to 0.4 V, 0.4 V to 0.5 V, and 0.5 V to 0.55 V.

The voltage applied to the selected word line in the reading operation of B level may range from, for example, 1.5 V to 2.3 V. However, the voltage is not limited to this and may be set within any one of the ranges of 1.65 V to 1.8 V, 1.8 V to 1.95 V, 1.95 V to 2.1 V, and 2.1 V to 2.3 V.

The voltage applied to the selected word line in the reading operation of C level may range from, for example, 3.0 V to 4.0 V. However, the voltage is not limited to this and may be set within any one of the ranges of 3.0 V to 3.2 V, 3.2 V to 3.4 V, 3.4 V to 3.5 V, 3.5 V to 3.6 V, and 3.6 V to 4.0 V.

A time (tR) of the reading operation may be set within the range of, for example, 25 μs to 38 μs, 38 μs to 70 μs, or 70 μs to 80 μs.

(2) A writing operation may include a program operation and a verify operation. In the writing operation, the voltage first applied to the selected word line in the program operation may range from, for example, 13.7 V to 14.3 V. The voltage is not limited to this and may be set within any one of the ranges of, for example, 13.7 V to 14.0 V and 14.0 V to 14.6 V.

The voltage first applied to the selected word line when write-accessing an odd-numbered word line and the voltage first applied to the selected word line when write-accessing an even-numbered word line may be different.

If the program operation may be ISPP (Incremental Step Pulse Program), the voltage of step-up may be, for example, 0.5 V.

The voltage applied to an unselected word line may be set within the range of, for example, 6.0 V to 7.3 V. However, the voltage is not limited to this and may be set within the range of, for example, 7.3 V to 8.4 or set to 6.0 V or less.

The pass voltage to be applied may be changed depending on whether the unselected word line is an odd-numbered word line or an even-numbered word line.

A time (tProg) of the writing operation may be set within the range of, for example, 1,700 μs to 1,800 μs, 1,800 μs to 1,900 μs, or 1,900 μs to 2000 μs.

(3) In Erasing Operation,

The voltage first applied to the well which may be formed in the upper portion of the semiconductor substrate and above which the memory cell may be arranged may be set within the range of, for example, 12 V to 13.6 V. However, the voltage is not limited to this and may be set within the range of, for example, 13.6 V to 14.8 V, 14.8 V to 19.0 V, 19.0 V to 19.8 V, or 19.8 V to 21 V.

A time (tErase) of the erasing operation may be set within the range of, for example, 3,000 μs to 4,000 μs, 4,000 μs to 5,000 μs, or 4,000 μs to 9,000 μs.

(4) The Structure of the Memory Cell

A charge accumulation layer may be arranged on a 4 to 10 nm thick tunnel insulating film. The charge accumulation layer may have a stacked structure of a 2 to 3 nm thick insulating film of SiN or SiON and 3 to 8 nm thick polysilicon. A metal such as Ru may be added to the polysilicon. An insulating film is provided on the charge accumulation layer. The insulating film may include a 4 to 10 nm thick silicon oxide film sandwiched between a 3 to 10 nm thick lower High-k film and a 3 to 10 nm thick upper High-k film. As the High-k film, HfO or the like may be usable. The silicon oxide film may be thicker than the High-k film. A 30 to 70 nm thick control electrode may be formed on a 3 to 10 nm thick work function adjusting material on the insulating film. Here, the work function adjusting material may be a metal oxide film such as TaO or a metal nitride film such as TaN. As the control electrode, W or the like is usable.

An air gap may be formed between the memory cells.

In the above embodiments, a NAND flash memory has been exemplified as the semiconductor storage device. However, the embodiments may be applicable not only to the NAND flash memory but also to other general semiconductor memories, and also applicable to various kinds of storage devices other than the semiconductor memories. In the flowcharts described in the above embodiments, the order of processes may be changed as long as it is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell configured to hold 5-bit data according to a threshold;
a word line coupled to the memory cell; and
a row decoder configured to apply first to 31st voltages to the word line,
wherein a first bit data of the 5-bit data is determined by reading operations using first to sixth voltages,
a second bit data of the 5-bit data is determined by reading operations using seventh to thirteenth voltages, the second bit being different from the first bit,
a third bit data of the 5-bit data is determined by reading operations using fourteenth to twentieth voltages, the third bit being different from the first and second bits,
a fourth bit data of the 5-bit data is determined by reading operations using 21st to 27th voltages, the fourth bit being different from the first to third bits,
a fifth bit data of the 5-bit data is determined by reading operations using 28th to 31st voltages, the fifth bit being different from the first to fourth bits,
the first to 31st voltages are respectively different voltages,
the 28th voltage is the lowest voltage among the first to 31st voltages, the 31st voltage is the highest voltage among the first to 31st voltages, the first voltage is a second lowest voltage among the first to 31st voltages, the 27th voltage is a second highest voltage among the first to 31st voltages, the twentieth voltage a third highest voltage among the first to 31st voltages, the sixth voltage is highest among the first to sixth voltages, the thirteenth voltage is highest among the seventh to thirteenth voltages, the twentieth voltage is highest among the fourteenth to twentieth voltages, the 27th voltage is highest among the 21st to 27th voltages, the 31st voltage is highest among the 28th to 31st voltages, the sixth voltage is lowest among the sixth voltage, the thirteenth voltage, the twentieth voltage, the 27th voltage, and the 31st voltage, the seventh voltage is lowest among the seventh to thirteenth voltages, the fourteenth voltage is lowest among the fourteenth to twentieth voltages, the 21st voltage is lowest among the 21st to 27th voltages, the 28th voltage is lowest among the 28th to 31st voltages, and the 21st voltage is highest among the first voltage, the seventh voltage, the fourteenth voltage, the 21st voltage, and the 28th voltage.

2. The semiconductor memory device according to claim 1, wherein the row decoder applies the first to 31st voltages to the word line in ascending order of a voltage value, and the sixth voltage is a 22nd-applied voltage of the first to 31st voltages.

3. The semiconductor memory device according to claim 2, further comprising a holding circuit configured to hold the first to fifth bit data read from the memory cell,
wherein the holding circuit is configured to output the first to fifth bit data in an order that the bit data is established.

4. The semiconductor memory device according to claim 3, wherein the thirteenth voltage is lowest among the thirteenth voltage, the twentieth voltage, the 27th voltage, and the 31st voltage.

5. The semiconductor memory device according to claim 4, wherein the twentieth voltage is lowest among the twentieth voltage, the 27th voltage, and the 31st voltage.

6. The semiconductor memory device according to claim 5, wherein the 31st voltage is higher than the 27th voltage.

7. The semiconductor memory device according to claim 6, wherein the thirteenth voltage is a 26th-applied voltage of the first to 31st voltages.

8. The semiconductor memory device according to claim 7, wherein the twentieth voltage is a 29th-applied voltage of the first to 31st voltages.

9. The semiconductor memory device according to claim 8, wherein the 27th voltage is a 30th-applied voltage of the first to 31st voltages.

10. A semiconductor memory device comprising:
a memory cell configured to hold 5-hit data according to a threshold;
a word line coupled to the memory cell; and
a row decoder configured to apply first to 31st voltages to the word line, wherein a first bit data of the 5-bit data is determined by reading operations using first to fourth voltages, a second bit data of the 5-bit data is determined by reading operations using fifth to eleventh voltages, the second bit being different from the first bit, a third bit data of the 5-bit data is determined by reading operations using twelfth to eighteenth voltages, the third bit being different from the first and second bits, a fourth bit data of the 5-bit data is determined by reading operations using nineteenth to 25th voltages, the fourth bit being different from the first to third bits, a fifth bit data of the 5-bit data is determined by reading operations using 26th to 31st voltages, the fifth bit being different from the first to fourth bits, the first to 31st voltages are respectively different voltages, the first voltage is the lowest voltage among the first to 31st voltages, the 31st voltage is the highest voltage among the first to 31st voltages, the fifth voltage is a second lowest voltage among the first to 31st voltages, the 25th voltage is a second highest voltage among the first to 31st voltages, the eighteenth voltage a third highest voltage among the first to 31st voltages, the fourth voltage is highest among the first to fourth voltages, the eleventh voltage is highest among the fifth to eleventh voltages, the eighteenth voltage is highest among the twelfth to eighteenth voltages, the 25th voltage is highest among the nineteenth to 25th voltages, the 31st voltage is highest among the 26th to 31st voltages, the fourth voltage is lowest among the fourth voltage, the eleventh voltage, the eighteenth voltage, the 25th voltage, and the 31st voltage, the fifth voltage is lowest among the fifth to eleventh voltages, the twelfth voltage is lowest among the twelfth to eighteenth voltages, the nineteenth voltage is lowest among the nineteenth to 25th voltages, the 26th voltage is lowest among the 26th to 31st voltages, and the 26th voltage is highest among the first voltage, the fifth voltage, the twelfth voltage, the nineteenth voltage, and the 26th voltage.

11. The semiconductor memory device according to claim 10, wherein the row decoder applies the first to 31st voltages to the word line in ascending order of a voltage value, and the fourth voltage is a nineteenth-applied voltage of the first to 31st voltages.

12. The semiconductor memory device according to claim 11, further comprising a holding circuit configured to hold the first to fifth bit data read from the memory cell,
wherein the holding circuit is configured to output the first to fifth bit data in an order that the bit data is established.

13. The semiconductor memory device according to claim 12, wherein the eleventh voltage is lowest among the eleventh voltage the eighteenth voltage, the 25th voltage, and the 31st voltage.

14. The semiconductor memory device according to claim 13, wherein the eighteenth voltage is lowest among the eighteenth voltage, the 25th voltage, and the 31st voltage.

15. The semiconductor memory device according to claim 14, wherein the 31st voltage is higher than the 25th voltage.

16. The semiconductor memory device according to claim 15, wherein the eleventh voltage is a 24th-applied voltage of the first to 31st voltages.

17. The semiconductor memory device according to claim 16, wherein the eighteenth voltage is a 29th-applied voltage of the first to 31st voltages.

18. The semiconductor memory device according to claim 17, wherein the 25th voltage is a 30th-applied voltage of the first to 31st voltages.

\* \* \* \* \*